(12) United States Patent
Ullakko

(10) Patent No.: US 6,515,382 B1
(45) Date of Patent: Feb. 4, 2003

(54) ACTUATORS AND APPARATUS

(76) Inventor: Kari M Ullakko, Pihlajati 3 C, Espoo (FI), FIN-02150

( * ) Notice: Subject to any disclaimer, the term of this patent is extended or adjusted under 35 U.S.C. 154(b) by 0 days.

(21) Appl. No.: 09/434,357
(22) PCT Filed: Mar. 3, 1999
(86) PCT No.: PCT/FI99/00163
§ 371 (c)(1),
(2), (4) Date: Dec. 13, 1999
(87) PCT Pub. No.: WO99/45631
PCT Pub. Date: Sep. 10, 1999

(30) Foreign Application Priority Data

| Mar. 3, 1998 | (FI) | 980500 |
| Mar. 27, 1998 | (FI) | 980696 |
| Jun. 30, 1998 | (FI) | 981501 |
| Jul. 15, 1998 | (FI) | 981611 |
| Nov. 6, 1998 | (FI) | 982507 |

(51) Int. Cl.$^7$ ............ H01L 41/20; H01L 41/26
(52) U.S. Cl. ............................ 310/26; 310/26
(58) Field of Search .................. 310/26; 333/148, 333/201; 335/3, 215; 336/20; 367/156, 168; 361/206; 318/118

(56) References Cited

U.S. PATENT DOCUMENTS

| 4,929,289 A | 5/1990 | Moriya et al. |
| 4,933,027 A | 6/1990 | Moriya et al. |
| 5,173,131 A | 12/1992 | Mantel |
| 5,750,272 A * | 5/1998 | Jardine ............... 428/686 |
| 5,958,154 A * | 9/1999 | O'Handley et al. ......... 148/312 |

FOREIGN PATENT DOCUMENTS

| EP | 0 480 033 A1 | 4/1992 |
| EP | 0 489 160 A1 | 6/1992 |
| JP | 2-228451 | 9/1990 |
| JP | 2-301514 | 2/1991 |
| WO | PCT/FI96/00408 | 1/1997 |
| WO | PCT/FI96/00410 | 1/1997 |
| WO | PCT/US97/14531 | 2/1998 |

OTHER PUBLICATIONS

Somerday et al.: "A Systematic Analysis of Transformation Stress Anistropy in Shape Memory Alloys"; Philisophical Magazine A (from internet); 1–16, Sep. 1996.*
K. Ullakko, "Journal of Material Engineering and Performance," vol.5, No.3, pp.405–409, Jun. 1996.*
K. Ullakko, "Journal of Materials Engineering and Performance," vol. 5, No. 3, pp. 405–409, Jun. 1996.

* cited by examiner

Primary Examiner—Burton S. Mullins
(74) Attorney, Agent, or Firm—Skinner & Associates

(57) ABSTRACT

The present invention relates to actuators, linear motors and rotational motors based on magnetic-field-induced strains taking place in the actuator material. These strains are caused by the reorientation of the twin structure of the actuator materials by the applied magnetic field.

82 Claims, 37 Drawing Sheets

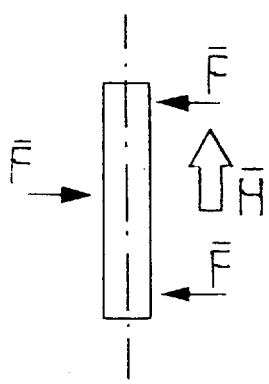
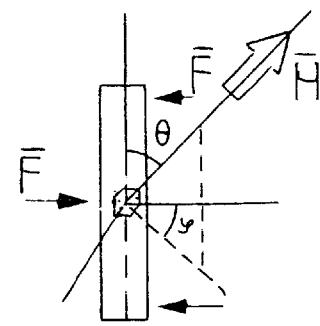
Fig 20a        Fig 20b
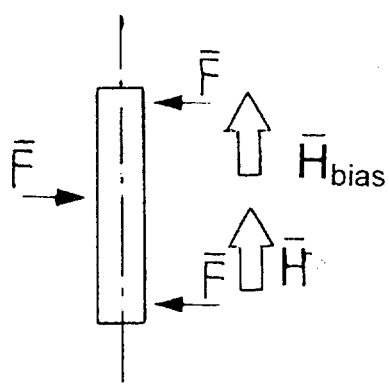
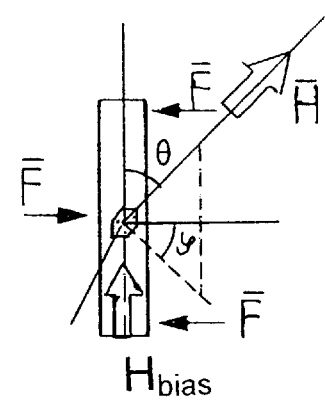
Fig 20c        Fig 20d
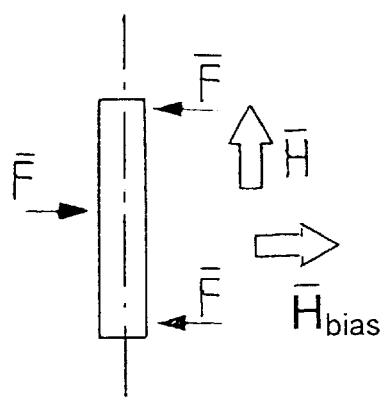
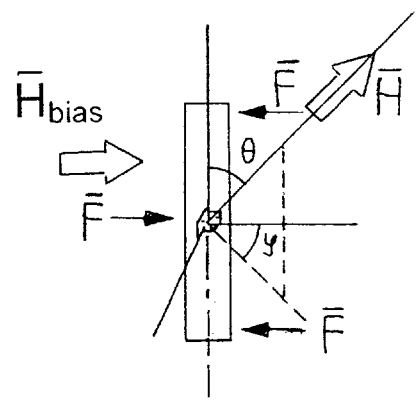
Fig 20e        Fig 20f

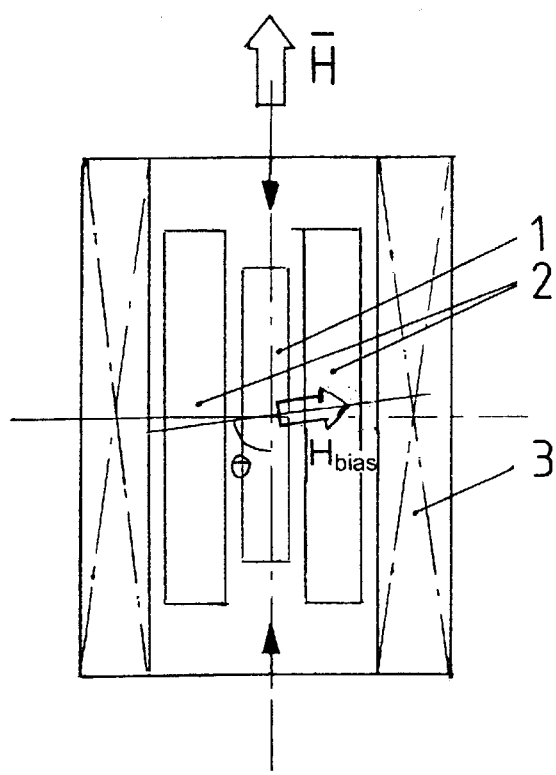
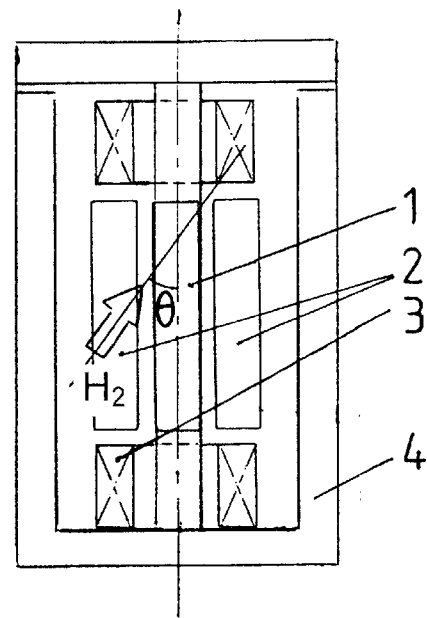
Fig 21a          Fig 21b
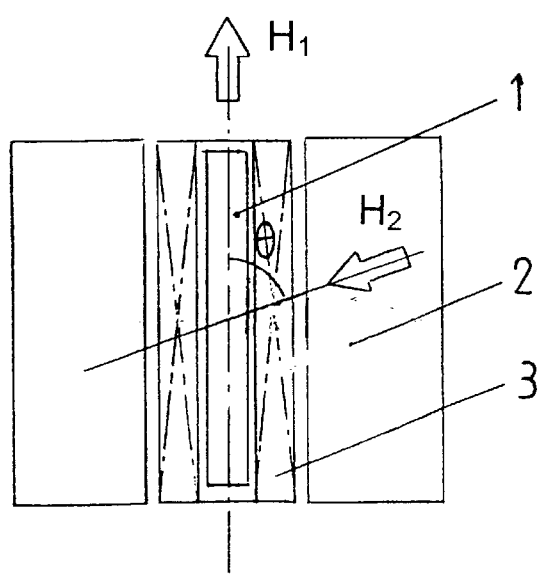
Fig 21c

ACTUATORS AND APPARATUS

FIELD OF THE INVENTION

The present invention relates actuators and apparatus the operation of which are based on a method for controlling the twin orientation of the actuator material by the magnetic field. The aim is to produce shape changes, motion and force using those actuators.

BACKGROUND OF THE INVENTION

Control of motion (and force) is one of the basic elements in mechanical engineering. Development of new materials has made it possible to produce motion and force using special functional materials called actuator materials. The most important groups of actuator materials available are piezoelectric ceramics, magnetostrictive intermetallics, and shape memory alloys. Piezoelectric ceramics develop strains when subjected to an electric field. Frequency response of these materials is fast, but the strain amplitudes are very small, which limits their applicability. Magnetostrictive materials are strained when a magnetic field is imposed on them. Certain high-magnetostrictive intermetallics (e.g., Terfenol-D, Etrema Products, Inc., Ames, Iowa, USA) offer strains up to 0.17%, which is an order of magnitude higher than those of the current piezolectrics. The frequency response of the magnetostrictive intermetallics is lower than that of the piezoelectrics.

Shape memory metals are materials which, when plastically deformed at one temperature, can recover their original undeformed state upon raising their temperature above an alloy-specific transformation temperature. In these materials, crystal structure undergoes a phase transformation into, and out of, a martensite phase when subjected to mechanical loads or temperature. The process when a mechanically deformed shape memory material returns to its original form after heating is called a one-way shape memory effect. Cooling the material subsequently will not reserve the shape change. The one-way shape memory effect is utilized in fastening, tightening and pre-stressing devices. Strains of several percent can be completely recovered, and recovery stresses of over 900 MPa have been attained. In the case of the two-way effect, no deformation is required, and the material "remembers" two configurations that are obtained by heating and cooling to alloy-specific temperatures. The temperature difference between the two configurations can be as small as 1 to 2 K. Materials that exhibit a two-way shape memory effect are used to develop forces and displacements in actuators. Those actuators are applied in machinery, robotics and biomedical engineering. The most extensively used shape memory materials are Ni-Ti and Cu-based alloys. A drawback of the shape memory actuators is their slow response due to the thermal control (especially in cooling) and low efficiency (energy conversion), which in many alloys is only about one percent.

In order the shape memory effect to occur, the material must exhibit a twinned substructure. The shape change of the shape memory material is based on the reorientation of the twin structure in the external stress field. A two-dimensional illustration of the twin reorientation is presented in FIG. 1. FIG. 1(a) shows two twin variants, denoted by 1 and 2, with equal proportions in the absence of the external stress. When the stress is applied (FIG. 1(b)), the twin boundaries move and variant 2 grows at the expense of variant 1, producing the shape which better accommodates the applied stress. The result of moving a twin boundary is thus to convert one twin variant into another. That variant will be grown which is most favorably oriented to the applied stress. Ultimately, a single variant of martensite can be produced by straining a sufficient amount, as illustrated in FIG. 1(c). In the martensite phase, the variants are usually oriented in several crystallographic directions. Therefore, complex shape changes of the material can be produced by the reorientation of the twin structure, and a full shape recovery will be obtained. Crystallographic analysis has shown that the boundaries between the martensite plates also behave as twin boundaries, i.e., the individual plates of martensite themselves are twins with respect to adjoining plates. Thus the term twin boundaries, generally refers to the boundaries between martensite plates as well as the boundaries between the boundaries within the plates (this definition also concerns the magnetically controlled twin boundaries discussed below). In some materials, applied stress induces formation of the martensite phase whose twinned substructure is preferentially oriented according to the applied stress. It was recently calculated that magnetic field that is oriented parallel with twin boundary direction produces targestmagnetic-field induced strains in a material.

Reorientation of the twin structure is responsible for the recoverable strains of several percent in appropriate materials (e.g., close to 10 percent in Ni-Ti shape memory alloys). In some alloys the stress required to reorient the twin structure is very low. FIG. 2 shows the stress-strain curves for the selected shape memory materials. It is seen that strains of 4 percent are attained by stresses of 20 to 50 MPa in most of those alloys. Stresses as low as 1 to 30 MPa result in the strains of one percent.

Strain energy densities needed to produce the strain of 1 percent by the reorientation of the twin variants are the areas restricted by the stress-strain curves, strain axis and the vertical dashed line in FIG. 2. The strain energy densities for the alloys In-Tl, Ni—Mn—Ga (ferromagnetic $Ni_2MnGa$), Cu—Zn—Ga and Cu—Zn are $10^4$, $8.5 \times 10^4$, $1.1 \times 10^5$ and $2.3 \times 10^5$ $J/m^3$, respectively.

In the following, magnetic anisotropy energy is introduced, because it plays an important role in the present invention. In ferromagnetic crystais magnetocrystalline anisotropy energy is an energy which directs the magnetization along certain definite crystallographic axes called directions of easy magnetization. FIG. 3a shows the magnetization curves of single crystalline cobalt which has a hexagonal crystal structure. Its easy direction of magnetization is the parallel axis of the unit cell. The saturation is reached at a low magnetic field value in this direction, as shown in FIG. 3a. Saturating the basal plane direction is called a hard direction of magnetization. Magnetic anisotropy energy density corresponding to the magnetization processes in different directions is the area between the magnetization curves for those directions. In cobalt the energy density needed to saturate the sample in the hard direction is about $5 \times 10^5$ $J/m^3$ (the area between the saturation curves in FIG. 3a). Anisotropy energy densities of magnetically hard Fe- and Co-based alloys range from $10^5$ up to $10^7$ $J/m^3$. The highest anisotropy energy densities (K1 values), close to $10^8$ $j/m^3$, are in $4f$ metals at low temperatures. In intermetallic compounds such as $Co_5Nd$, $Fe_{14}Nd_2B$ and $Sm_2Co_{17}$ the anisotropy energy densities at room temperature are as high as $1.5 \times 10^7$, $5 \times 10^7$ and $3.2 \times 10^6$ $J/m^3$, respectively.

Reorientation of the twin structure by the applied magnetic field. In crystalline ferromagnetic materials, magnetization vectors lie along directions of easy magnetization in the absence of the external magnetic field. This situation is shown in FIG. 4(a) for two twin variants. The easy direction of magnetization is parallel with the side of the unit cells of each variant. It is emphasized that the easy direction does not necessarily be parallel with the side of the unit cell but it can also be any other crystallographic direction characteristic of the material.

When an external magnetic field is applied on a crystalline ferromagnetic material, the magnetization vectors tend to turn from the easy direction of the unit cell to the direction of the external magnetic field. If the magnetocrystalline anisotropy energy, denoted by $U_k$ in this presentation, is high, the magnetic field strengths required to turn the magnetization off from the easy directions are also high, as was illustrated for hexagonal cobalt in FIG. 3. If the energy of turning the twin variants, (i.e., the energy of the motion of the twin boundaries) is low enough compared to the magnetocrystalline anisotropy energy $U_k$, the twin variants are turned by the external magnetic field, and the magnetization remains in the original easy direction of the unit cells. FIG. 4b shows how the unit cells of one variant are turned into another by the external magnetic field (magnetization is assumed to turn parallel with the external field direction in this presentation for illustration). As a result, twins in favourable orientation to the magnetic field grow at the expense of the other twins, as shown in FIG. 5. FIG. 5(a) represents the starting situation in the absence of the field when the twin variants with equal proportions are present. FIG. 5(b) shows how the unit cells whose easy direction of magnetization is off from the direction of the external magnetic field are turned along with the field direction. This results in the growth of the favourably oriented twin variant and the decrease of the other variant. Ultimately, only one twin variant may remain, as shown in FIG. 5(c).

The magnetic-field-control of the reorientation of the twin variants is expected to produce recoverable strains of several percent in appropriate materials (in way analogous to stress-induced recoverable strains in the shape memory alloys). To reach a certain magnetically induced strain, it is necessary that the magnetocrystalline anisotropy energy $U_k$ of the material is larger than the energy needed to reorient the twin variants to achieve this strain. The latter energy, defined as the energy of the reorientation of the twin structure, and denoted by $E_{tw}$, includes also strain and dissipation energy terms related to the shape change of the material. The velocity of the twin boundaries is very fast in many materials, even a fraction of the speed of sound. This means that the magnetic-field-induced strokes are very fast in such materials. The magnetic-field induced strains were demonstrated in nonstoichiometric $Ni_2MnGa$ alloys.

SUMMARY OF THE INVENTION

This invention concerns certain magnetically driven actuators and apparatus that produce motion and force and also such apparatus that monitor shape changes of an active element. The operation of the actuator is based on the magnetic-field-controlled reorientation of the twin structure of the material of the actuating element of the actuator that generates the motion. This kind of actuators can produce strains of several percent (as large as the shape memory materials). Because of the magnetic control of the these actuators, the response times are much faster, control more precise, and efficiency better than those of the shape memory materials. The new magnetically driven actuators will exhibit a great potential in mechanical engineering. They will replace hydraulic, pneumatic and electromagnetic drives in many applications. Employment of these actuators leads to simpler, lighter, and more reliable constructions than use of conventional technology. Because the twin reorientation occurs in three dimensions, complex shape changes can be produced under the magnetic control. Applicability of this invention is expanded by the possibility for controlling and supplying the power of the actuators at a distance. The whole machine developing a controlled motion or desired shape changes (e.g., bending, shear, twisting, clipping, fastening, pumping) may be a small appropriately shaped and preoriented piece of material. Due to the small twin size in many materials, this invention is expected to have great potential also in micro- and nano-technology. Linear and rotary motors, pumps, valves, couplers, vibrators and many other equipment are also concerned by this invention. In an inverse effect, magnetic field is changed when the active element made from the material according to the present invention is deformed. This can be used to monitor the state of the shape of the active element, e.g, in positioning devices, joysticks, keyboards, stress sensors and electric power generators.

BRIEF DESCRIPTION OF THE DRAWINGS

FIG. 1 shows a schematic (two dimensional) presentation of the shape change in martensite material, namely;

FIG. 4 shows the principle of the turning of the twin variants by the external magnetic field;

FIG. 4(b) shows the turning of the twin variant by the applied magnetic field H. The magnetic field tends to align the magnetization of the unit cell. In the case of high magnetocrystalline anisotropy energy and low enough energy of the twin boundary motion, the twin variant turns due to the magnetic field, and the magnetization remains in the easy direction of magnetization of the unit cell. Two alternative magnetic field orientations, namely, parallel with the easy direction of one twin variant or parallel with the twin boundary direction, are shown in this Figure.

FIG. 5 shows the principle of the magnetic-field-induced shape change of the twinned material which results in the shape change of the material and the motion and force of the actuator;

FIG. 6(c) shows the starting situation in which two twin variants are present;

FIG. 8 shows actuating elements that develop torsional deformation and torque, e.g., against a load, by the application of a magnetic field;

FIGS. 21(a, b and c) show examples of actuator configurations: (1) actuating element, (2) bias magnet that produces a magnetic field that forms an angle θ to the direction of the longest dimension of the sample, (3) electromagnet that produces a magnetic field in the direction of the longest dimension of the sample, and (4) magnetic flux path.

DETAILED DESCRIPTION OF THE INVENTION

This invention concerns certain actuators and apparatus that produce motion and force based on the reorientation of the twin structure under the application of the magnetic field, and apparatus operating in an opposite way, i.e., they produce magnetic field change when the twin structure of the material is changed by deformation of the material.

Figures 1A, 1B, 1C:
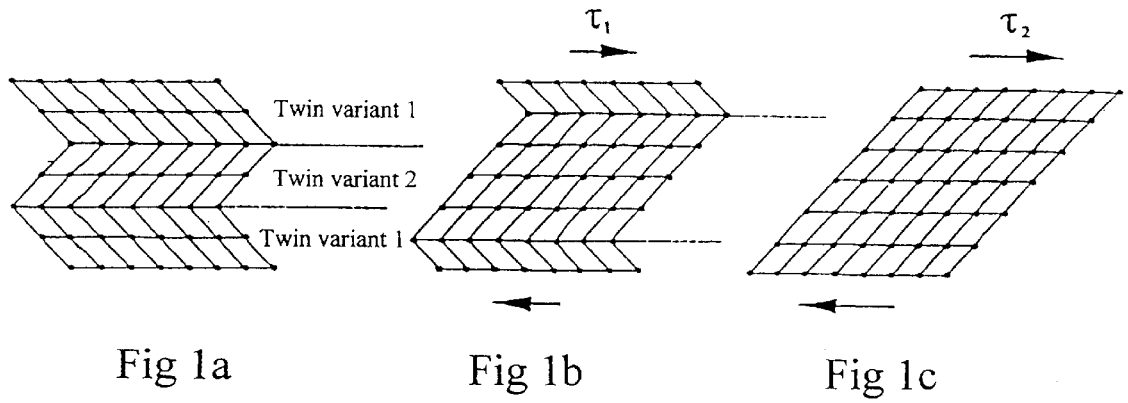
FIG. 1(a) shows the normal starting situation. Stress-free material consists of equal proportions of twin variants 1 and 2. The dashed line (mirror plane) between the two variants is called a twin boundary.
FIG. 1(b) shows the step where an external stress field ($\tau_1$) acts on the material. Twin variant 2 which is favorably oriented to the applied stress grows and variant 1 shrinks resulting in a macroscopic strain and a shape change of the material.
FIG. 1(c) presents the ultimate situation after straining a sufficient amount, namely the condensation of both of the variants into a single variant 2.
Figure 2:
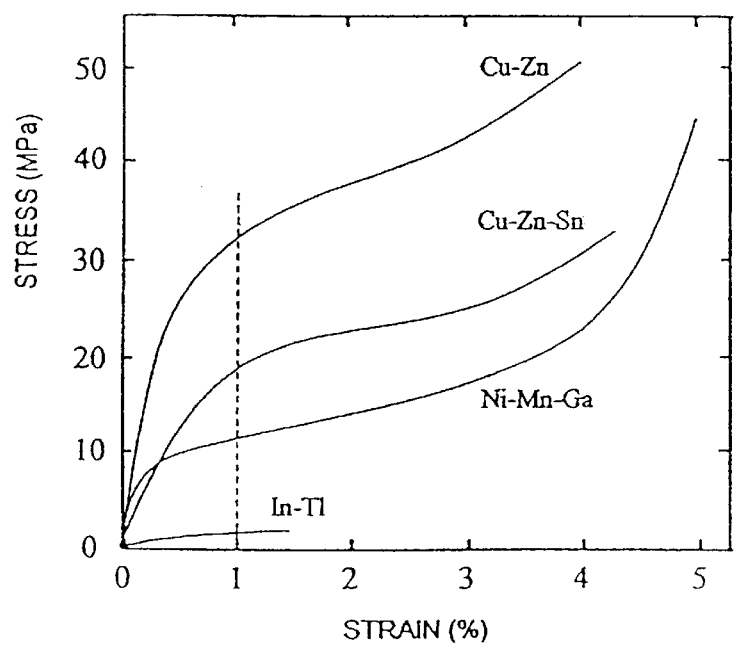
FIG. 2 shows stress-strain (tensile) curves for single crystalline alloys In—Tl, Cu—Zn—Sn a nd a Ni—Mn—Ga Heusler-alloy ($Ni_2MnGa$), and for a polycrystalline Cu—Zn shape memory alloy during the reorientation of the twin structure.
Figure 3A:
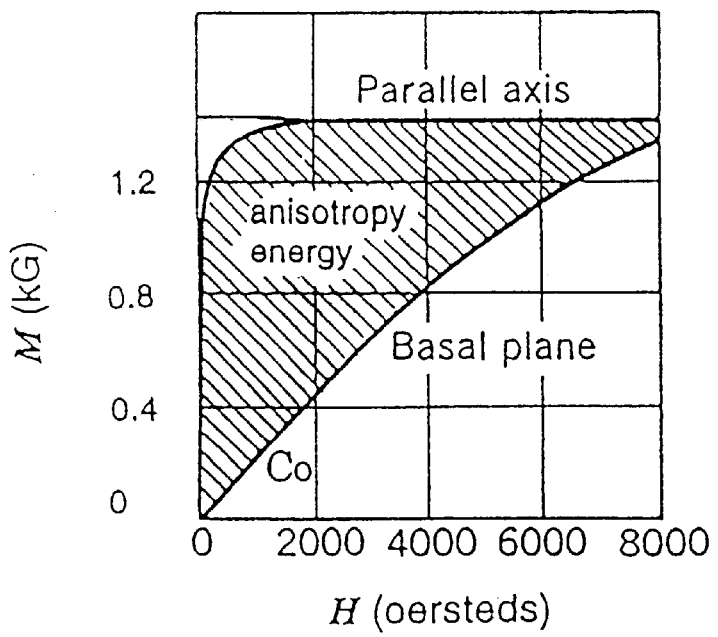
FIG. 3(a) presents magnetization curves of single crystalline cobalt. The lattice structure of cobolt is shown in FIG. 3(b).
Figure 3B:
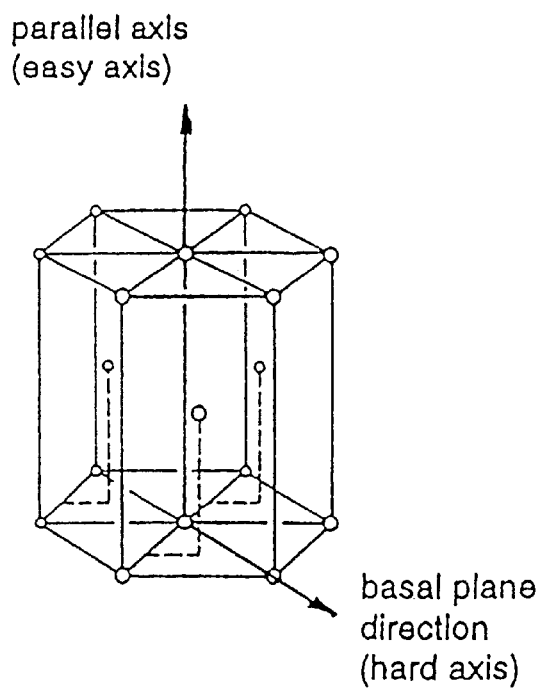
Figures 4A, 4B:
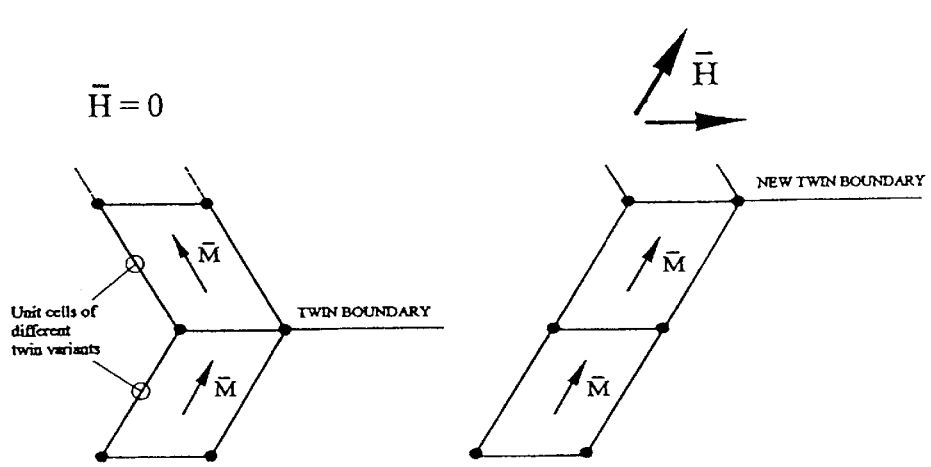
FIGS. 4(a) and 4(b) show the principle of the present invention, namely turning of the twin variants by the external magnetic field; Magnetization M is aligned in the easy direction of magnetization in the unit cells belonging to two different twin variants. In this presentation, easy direction of magnetization is assumed to be parallel with one side of the unit cell.
Figures 5A, 5B, 5C:
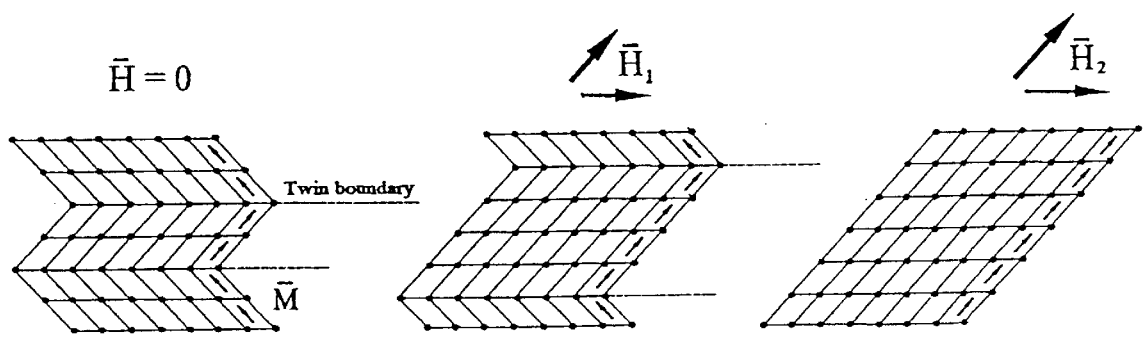
FIG. 5(a) presents the starting situation in the absence of the external magnetic field. The material consists of equal proportions of two twin variants, Magnetization is aligned parallel with one side of the unit cell in each variant (only a part of the magnetization vectors are denoted)
FIG. 5(b) shows the step where the external magnetic field $H_1$ acts on the material. The twin variant favorably oriented to the field direction grows and the other variant shrinks, resulting in a macroscopic strain and a shape change of the material.
FIG. 5(c) presents the ultimate situation after the complete reorientation of the twin structure by the magnetic field. The other twin variant has vanished and only variant is present.
Figure 6A:
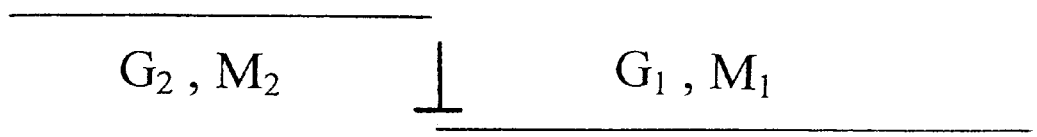
FIG. 6(a) represents a dislocation in a twinning plane.
Figure 6B:
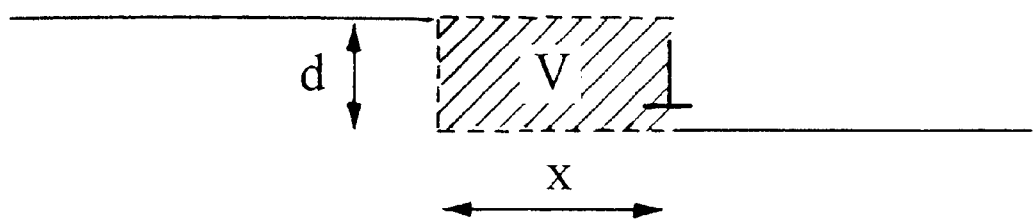
FIG. 6(b) represents the situation when the dislocation has moved distance x, and volume V is transformed from orientation $G_1$ to orientation $G_2$; thereby, the magnetization has changed from $M_1$ to $M_2$.

Twins in favourable orientation to the magnetic field grow and others shrink producing the shape change of the actuator material from which the actuating element of the actuator is made. Rearrangement of twin variants by the magnetic field is an explanation for the magnetic-field-induced motion of twinning dislocations. The force imposed on a twinning dislocation by a magnetic field is derived in the following:

Consider a coherent twin boundary with a ledge which is formed by a single twinning dislocation on this boundary (FIG. 6a). The grains on either side are labelled G1 and G2. The corresponding magnetization vectors are $M_2$ and $M_2$, respectively. The external magnetic field is H. We let the dislocation move the distance x from position A to position B (FIG. 6b). The work done by the system is the force F on the dislocation per unit line length times the area A swept by the dislocation:

$$\Delta W = FA = F \times L \qquad (1)$$

where L is the line length of the twinning dislocation. The work has to be larger than the associated energy difference $\Delta E$ of the system. Due to the motion of the twinning dislocation, the volume V transforms from G1 orientation into G2 orientation and, therefore, $\Delta E$ equals the difference of the magnetic energy densities of G1 and G2 times V:

$$\Delta E = (V/2)\, \mu_0 (M_2 - M_1) H = (d \times L/2)\, \mu_0 (\Delta M) H \qquad (2)$$

where d is the spacing of twinning planes, $\mu_0$ is the permeability of a vacuum, and $\Delta M = M_2 - M_1$. We obtain the force excerpted on the dislocation by equalling Equations (1) and (2):

$$F = (d/2) \mu_0 (\Delta M)\, H. \qquad (3)$$

In application, the actuator material has to work against a mechanical (internal and/or external) load which results in a shear stress $\tau$. The magnetic field controls the deformation when F is larger than the Peach-Kochler force $F_{PK} = \tau b$ where b is the Burgers vector of the twinning dislocation. Thus, the maximum of mechanical shear stress $\tau_{max}$ which can be held by a magnetic field is $$\tau_{max}=(d/2b)\mu_0(\Delta M)H=(\mu_0/2s)(\Delta M)\ H_1 \quad (4)$$

where $s=b/d$ is the twinning shear.

For example, in the case of the tetragonal lattice with the easy magnetization along the c-axis and twinning plane (101) and direction (10-1), the maximum stress is $$\tau_{max}^{tctr}=(\mu_0\theta^2M\ nH)/((\theta^2-1)\ (\theta^2+1)^{1/2})=(\mu_0M\ nH)/((2.2^{1/2}(\theta-1)), \quad (5)$$

where $\theta$ is the tetragonality and n is a unit vector with twinning direction. The approximation is valid for case $|\theta-1|\ll 1$.

Figure 6C:
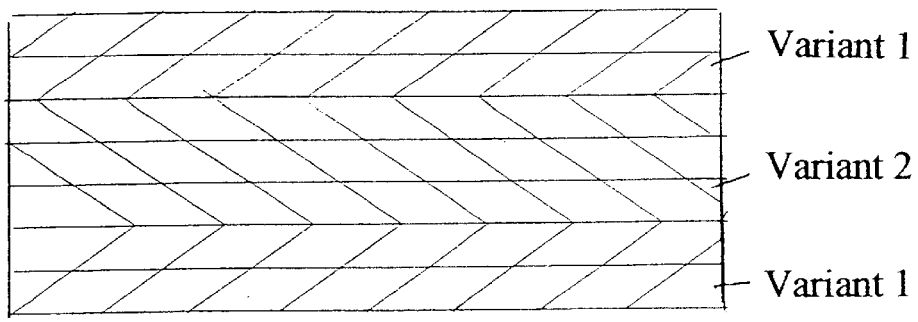
FIGS. 6(c), (d) and (e) show schematically as a two dimensional illustration a magnetic-field-induced shear strain driven by the magnetic-field-induced motion of twinning dislocations in a part of the material of the actuating element.
Figure 6D:
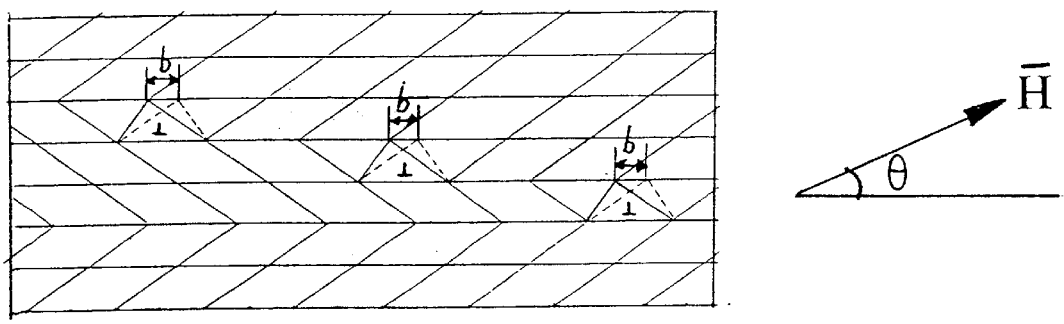
FIG. 6(d) shows the step where the magnetic field applied in an appropriate direction drives three twinning dislocations from left to right. The burgers vector of the twinning dislocation is denoted by b.
Figure 6E:
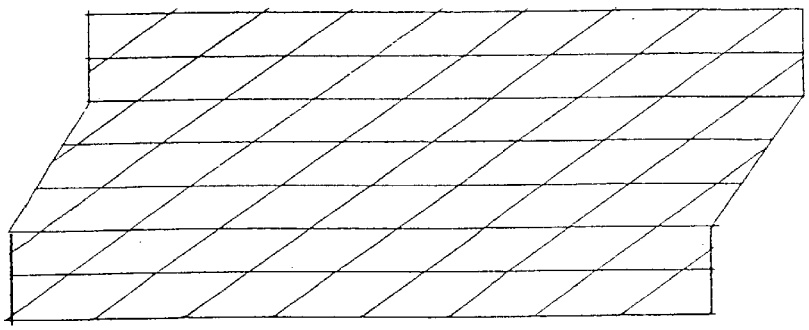
FIG. 6(e) shows the ultimate situation after the dislocations have moved out from the part of the material shown in the Figure. The magnetic-field-induced motion of dislocations have developed a shear strain in the material.

Magnetic field induces a shear stress that causes a shear strain in a twin variant. Changes in the proportions of different twin variants are caused by the magnetically driven motion of twinning dislocations, which results in shape changes of an actuating element. FIGS. 6c–e show schematically a magnetic-field-induced shape change in a part of a hypothetic actuating element consisted of two twin variants. When the magnetic field is applied on the part of the actuating element presented in FIG. 6c, twinning dislocations move from left to right in FIG. 6d increasing the proportion of one twin variant and decreasing the other. Ultimately, only one twin variant may be present after this process, as shown in FIG. 6e, The magnetic-field-induced motion of the twinning dislocations have sheared the lattice as shown in FIG. 6e, Hence, the magnetic field induces a shear strain in the actuating element, a part of which is presented in FIGS. 6c–e, The magnetic field may be oriented parallel with the twin boundary direction or in the direction of the easy axis of a twin variant or other direction that induces a desired shear strain in the material. Shear strain is a basic magnetic-field-induced shape change that is present locally in all magnetic-field-induced shape changes according to the present invention.

Changing of the proportions of the twin variants, called also turning or reorientation of the twin variants, works against internal load caused by deformation of other possible phases of the material or other twin variants with unsuitable orientations, or against external load of the actuating element. Material of the actuating elements according to the invention consists of a suitable number of twin variants with directions such that the desired shape change can be accommodated when the magnetic field is imposed on the material of the actuating element. The shape of the material can be recovered completely or partially by removing the magnetic field or by changing its intensity or/and direction. It is emphasized that the magnetic-field-induced strains according to the present invention, called also magnetic shape memory (MSM) effect can occur in one phase, for instance, in martensite. Unlike in "conventional" shape memory effect, a phase transformation between austenite and martensite is not necessary in the present invention. Materials in which the MSM effect occurs are called MSM materials. The element made from an MSM material whose shape is changed in the magnetic field based on the changes of the proportions of different twin and martensite variants is called an actuating element. MSM actuators are such apparatus that produce motion and force based on magnetic-field-induced shape changes of the actuating element. Active element is a general name that means here the actuating element and also such an element made from an MSM material that are used to induce magnetic field changes when the element is deformed based on an inverse MSM effect.

For the actuators to be possible to operate, magnetocrystalline anisotropy energy $U_k$ of the material of the actuating element (called also actuator material below) must be greater than the sum of the energy of the reorientation of the twin structure $E_{tv}$, in the actuator material and the work of the actuator including work against the load of the actuator. The work term may be positive or negative. If the work is negative, the external stress may assist the reorientation of the twin structure and decrease the magnetic field energy required. It is necessary that the magnetic field energy that controls the actuator must be larger than the sum of $E_{tv}$, and the work of the actuator. The higher the $U_k$ is, the larger magnetic field energies can be converted to mechanical work of the actuators and, hence, the higher forces are attained.

Magnetic-field-induced strains in the martensitic materials of the actuating elements can also be generated by changing the proportions of different twin variants in the magnetic field based on orienting the growing of the martensite plates that are in favourable orientation in relation to the magnetic field and the shrinking of other variants. Martensite plates in certain crystal-dependent orientations are called martensite variants. The martensite plates are composed of twins of one or more variants. It is necessary that the magnetocrystalline anisotropy energy of the material is high. High anisotropy makes it possible for the martensite plates to grow by the magnetic field in certain orientations. When the magnetic field is removed or its direction is changed, the proportions of different martensite variants change resulting in the shape change of the actuating element. Magnetic-field-induced strains in actuating elements are based on the changes in the proportions of different martensite variants and also the proportions of the twin variants in the martensite plates. For this reason, in the following discussions of twin variants and twin structure in relation to shape changes of the actuating elements often mean also martensite variants and martensite structure.

The magnetic-field-induced strains were measured at different temperatures, also at room temperature, e.g., in non-stoichiometric $Ni_2MnGa$ alloys. X-ray diffraction measurements made below the martensite start temperatures at room temperature and also below room temperature revealed magnetic-field-induced changes in the intensities of certain diffraction peaks, which confirms that the proportions of different twin variants change in the magnetic field causing the shape changes of the MSM material from which the actuating elements are made.

Figure 7A:
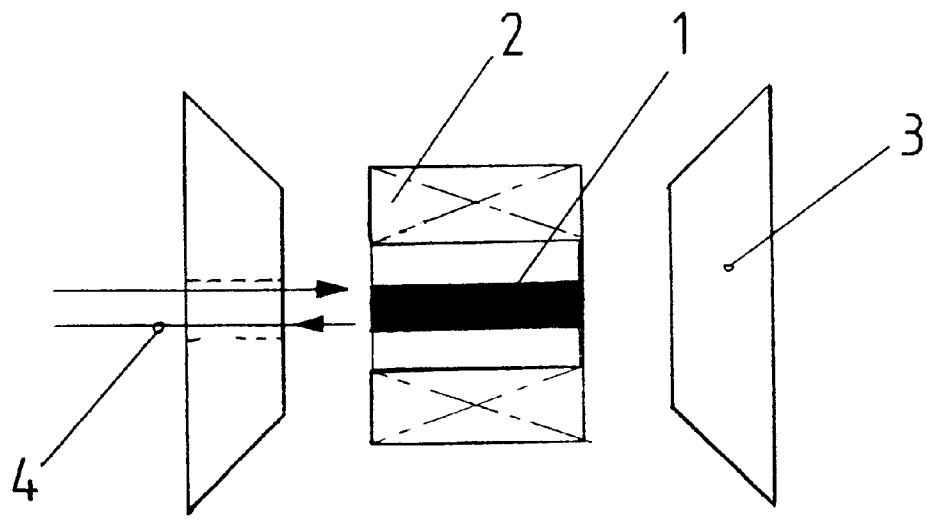
FIG. 7(a) shows equipment that was used in frequency response measurements: (1) sample, (2) ac coil, (3) dc magnet, (4) laser beam.
Figure 7B:
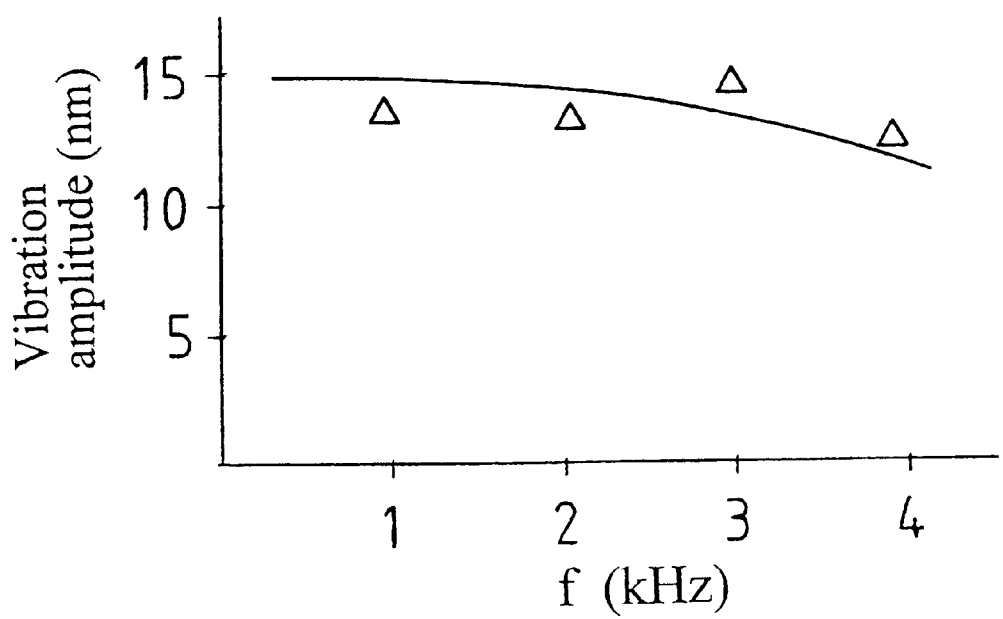
FIG. 7(b) shows vibration amplitude as a function of frequency.

Frequency response of the magnetic-field induced shape changes based on the reorientation of the twin structure is high because of the fast motion of twin boundaries (speed of sound). The frequency response is, therefore, limited by other factors than the mechanisms itself, for instance by eddy current losses. The frequency response of a non-stoichiometric $Ni_2MnGa$ sample, the composition of which was Ni-28.5Mn-25.5Ga, was measured. The sample of 12 mm in length was installed in a sample holder shown in FIG. 7a. The austenitic sample was textured, and direction (400) was parallel with the longest dimension of the sample. Frequency measurement was performed on martensitic sample at -20° C. The linear strain of the sample was excited by an ac-coil that induced a magnetic field of 7.5 Oe parallel with the longest dimension of the sample. The system was installed in the magnetic field of an electromagnet that produced static bias field in the measurement. Strain amplitude generated by the ac-coil at different frequencies was measured as a function of the bias field. The curve obtained was a derivative of the strain measured as a function of the bias field that was separately measured in the absence of the bias field. FIG. 7b shows the vibration amplitude as a function of frequency. Amplitude is seen to be quite constant up to the filtering frequency 5 kHz of the laser vibrometer. It appeared that the frequency response was higher than 5 kHz, but amplitudes above 5 kHz were small due to the filtering of the laser vibrometer and eddy current losses of the sample.

The new actuators according to the present invention represent a new way of producing motion, force and shape changes using electric energy. No other method for producing motion and force based on the material properties can develop such a combination of high strains, forces, speed and precision as these new actuators. Potential applications are fuel injectors, high-pressure pumps, actuators of active vibration control, active springs, valve lifters and controllers, robots, precision tooling and linear motors. Actuators can also be integrated with sensing and control capabilities. Such structures, called adaptive or smart structures, are applied in aerospace, automotive, marine and civil engineering, precision machining and production engineering. The most widely used actuators are pneumatic and hydraulic systems, electromagnetic drives and actuator materials such as piezoelectrics, magnetostrictive intermetallics and shape memory alloys. The new actuators according the invention exhibit a great technological and commercial potential. They may become as widely used as motors and other devices based on electromagnetic forces are presently. In several fields of engineering the new actuators are expected to replace conventional electric devices due to their more simple structure, better performance, reliability and lower costs.

Although the magnetic-field-induced shape changes of the material of the actuating element are based on shear strains in the twin variants, the macroscopic shape change of the actuating element in the applied magnetic field may be, e.g., elongation or contraction, bending, shear or torsion, or any combination of these. This significantly expands the applicability of the actuators and apparatus based on the actuators according to the present invention in many fields of engineering and machinery. The actuator/machine developing a controlled motion or certain shape changes by the magnetic field may be a appropriately shaped and pre-oriented piece of material. Designing the shape and the initial twin structure properly, the actuator can repeat complex shape changes when the intensity of the magnetic field is cycled. The trace of the motion of the actuator can be changed by changing the direction of the field.

The method of the present invention makes it possible to control the operation of the actuators at a distance. Remote control is suitable, for example, in process control and biomedical applications.

The actuator according to the invention is composed of the actuating element that generates the motion and force of the actuator based on the reorientation of the twin structure in applied magnetic field and a magnet (usually electromagnet or several electromagnets in different orientations) that produce(s) the controlling (driving) magnetic field(s), and optionally also the bias magnet with magnetic flux paths connecting it to the actuating element and the mechanical loading system for mechanical biasing.

In special applications, the reorientation of the twin structure causing the shape change of the actuating element can also be induced by internal magnetic field due to ordering of the magnetic structure by cooling the material below its Curie temperature or by applying mechanical stress or by passing electric current through the material.

The actuating element produces linear strain, i.e., extension or contraction, freely or against an external load or a pre-stress of the actuator, based on shape changes caused by the magnetic-field-induced reorientation of the twin structure and the martensite variants of the material of the actuating element. The direction of the magnetic field applied on the actuating element can be parallel with the direction of the linear strain or such a direction that the desired strain, e.g., largest strain, induced by the field is obtained. The direction of the applied magnetic field can also rotate around an axis perpendicular to the direction of the linear strain, or it can flip instantly or turn gradually between the direction of the linear strain and the direction perpendicular to the linear strain using two or more different magnetic field sources, for instance electromagnets or a combination of electromagnet(s) and permanent magnet(s). The actuating element can be biased by a static magnetic field in suitable direction and absolute value to obtain desired magnetic-field-induced strain, e.g., maximal strain, in the applied driving magnetic field.

The magnetic-field-induced shape change of the actuating element can be bending. It can bend freely or against an external load or a pre-stress of the actuator, based on shape changes caused by the magnetic-field-induced reorientation of the twin structure or martensite variants of the material of the actuating element. The direction of the applied magnetic field can be parallel with the tangent in the midpoint of the actuating element or such a direction that the desired bending strain, e.g., largest strain, is obtained. The direction of the applied magnetic field can make an angle of 0 to 90 degrees with the tangent in the midpoint of the actuating element or in such a direction that the desired shape change is obtained. The magnetic field strength and direction can vary as a function of time, and there can be several static bias magnets and electromagnets operating simultaneously. It is emphasized that the angle between the legs of the bent actuating element can also be small, so that the magnetic field induced shape change resembles the opening of twissors.

The macroscopic magnetic-field-induced shape change of the actuating element can be a shear strain. The shear strain can be a free strain or against an external load or a pre-stress of the actuator. The shape change is based on magnetic-field-induced reorientation of the twin structure and the martensite variants of the material of the actuating element. The direction of the magnetic field applied on the actuating element can be parallel with the direction of the shear strain or such an other direction that the desired strain, e.g., largest shear strain, induced by the field is obtained. The direction of the applied magnetic field can also rotate around an axis perpendicular to the shear plane or around such another axis that the desired cyclic shear strain in obtained. The magnetic field can also flip instantly or turn gradually between two directions using two or more magnetic field sources, for instance, electromagnets or a combination of electromagnet(s) and permanent magnet(s). The actuating element can be biased by a static magnetic field in suitable direction and absolute value to obtain desired magnetic-field-induced strain, e.g., maximal strain, in the applied driving magnetic field.

The shape change of the actuating element to operate can be torsion, called also twisting, freely or against an external load or a pre-stress of the actuator. The actuating element can be, e.g., a solid bar or a tube with a circular cross section. The tube-shaped element is convenient for torsion, because the shape change is a shear in the walls of the tube. The magnetic field can circulate around the tube using a suitable magnetic field source. This field direction is parallel with the shear plane of the material of the actuating element. This case is described in more detail below. The direction of the applied magnetic field can also be parallel with the torsional axis of the actuating element or directed radially through the wall of the tube-shaped actuating element or directed in such a direction, that a desired torsional strain is obtained. The magnetic field may rotate around such an axis that a desired cyclic torsional shape change of the actuating element is obtained or flip instantly or turn gradually between two such directions that a desired shape change is attained. The actuating element can be biased by a static magnetic field or pre-stressed, e.g., torsionally to obtain maximal torsional strain in the applied driving magnetic field.

Figure 8A:
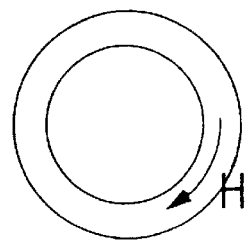
FIG. 8(a) shows a cross section of a tube in which the circulating magnetic field H develops a shear strain in the wall of the tube that causes a torsional shape change of the tube.
Figure 8B:
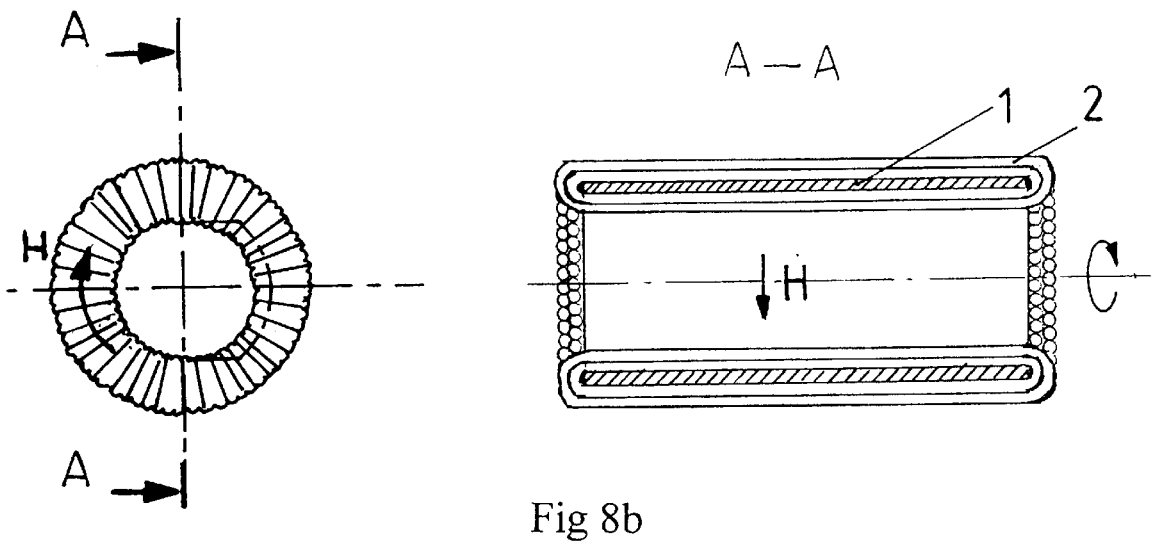
FIG. 8(b) shows a principle of an actuating element that produces torsional (shear) strain in the magnetic field induced by a coil wound toroidically in the tube.
Figure 8C:
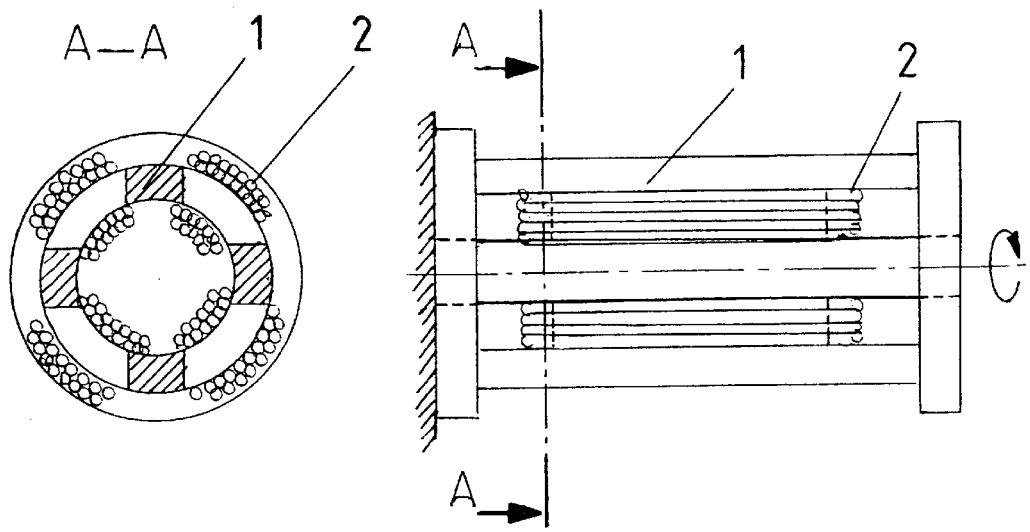
FIG. 8(c) shows an example of the actuating element whose right end turns an angle around the symmetry axis of the actuating element when the magnetic field is induced by the coils. When the field is switched off, the shape change of the actuating element can be recovered fully of partially.

Torsion can be produced in a hollow bar or a circular tube in which the magnetic field circulates around the tube (FIG. 8a), e.g., by winding the coil toroidally in the tube, as shown in FIG. 8b. In such an MSM material that develops shear strain in the applied magnetic field, the tube will deform by torsion when the magnetic field is induced by the coil. In some cases, the twin structure in the material is oriented in such a way that a dominant twin boundary direction is aligned parallel with the magnetic field induced by the coil. Those twin variants that are substantially oriented in this direction, most effectively contribute to torsional deformation of the tube. This kind of actuating element that produces torsional shape changes can be used in many applications, e.g., in electric motors that will be described later. Different kinds of arrangements can be made to install the element to other machine parts. One such arrangement is to fix the element from the ends of the tube as shown in FIG. 8c.

The shape change of the actuating element under the application of the magnetic field can be a combination of different shape changes e.g., extension (or contraction), bending, shear and torsion, or in one part of the element it may be any of those and in other parts the shape changes can be other combinations of those shape changes. The MSM actuating elements and also MSM sensing elements can also be very small. Therefore, they are suitable for Microsystems applications.

The actuating element whose magnetic-field-induced shape change is any of those presented above can also be a closed loop, such as a ring, ellipse or it may be composed of straight parts or it can be more complex in shape, that forms a closed flux path for the driving magnetic field. The driving magnetic field can be generated by a magnetic field source, such as a coil wound around the loop or around a part of the loop toroidally or by an electromagnet or several magnets placed in such a way that the direction of the magnetic field produces desired shape changes of the actuating element. Direction and intensity of the field can vary in time. The actuating element may be loaded or pre-stressed, e.g., by changing the shape of the actuating element loop. The loop can also consist of a part made from an actuating (MSM) material and another part made from a ferromagnetic material that passes the magnetic flux through the loop. In an open actuating element loop magnetic field can be led to the loop from one end of the loop. This arrangement is suitable for applications in which the space around the actuating element is limited or it is difficult to place electromagnets or static bias magnets in the vicinity of the element. This is important in cases of the MSM material composites discussed in the following.

The actuating element or several elements together operating in any of the ways described in this presentation, can be placed in a matrix made from another material, e.g., metallic, ceramic or polymeric materials (for example elastomers), thus forming a composite structure. These composites are called MSM composites below. The actuating elements are placed in the matrix in such a way that the desired shape changes of the composites are obtained. The composite can also include sensors whose signals are used for controlling the actuation of the actuating elements. One example of an MSM composite is a polymeric bar, in which MSM wires are installed. If the wires are placed near one side of the bar along the long dimension of the bar, the bar bends when magnetic field is applied to the wires if the MSM shape change is contraction in the wires. If the wires are in the neutral axis of the bar, the bar does not bend, but its rigidity changes when the magnetic field is applied to the wires. If the wires are installed helically in the bar, shape change of the bar is twisting in the magnetic field. Complicated shape changes of many shapes of polymeric or other composites can be produced by installing MSM actuating elements of several shapes and several modes of shape changes in the magnetic field. Magnetic field can be applied to the MSM elements from outside the composite, or the magnetic field can be conducted to the elements from the ends of the element, or coils and/or permanent magnets can be installed in the composite in an appropriate position in relation to the MSM elements. Composites described can be used as actuators in many kinds of applications, e.g., in robot arms, manipulators, active vibration control devices, positioning devices, vibrators, couplers and pumps. Needle-shaped textured Ni-28.5Mn-24.5Ga MSM actuating element were immersed in epoxy resin along the long direction off from the symmetry axis of the bar shaped mold. After curing the composite was placed in applied magnetic field parallel with needle direction, which induced a bending shape change of the bar.

MSM elements can be combined together in different mutual orientations, each element developing a desired shape change in the magnetic field. Shape change of this combined system in the applied magnetic field may be tailored for different applications. For example, textured foils of Ni-28.5Mn-24.5Ga MSM actuating elements of about 0.2 mm in thickness were glued together in such a way that the columnar austenite grains of (400) direction were perpendicular to each other in the planes. When the magnetic-field induced shape change was measured in the martensitic state, the composite bent, because one foil contracts and the other elongates in the applied magnetic field. MSM material foil of the same composition was also glued on a silicon wafer to demonstrate that MSM coatings made by adhesive bonding produces shape changes in devices made on silicon substrate. MSM coatings can also be made on silicon and on other suitable materials using different thin film processing technologies, for instance epitaxial thin film growing, evaporation, laser ablation or chemical methods. The shaping of the actuating elements can be performed by etching, laser or micromachining. MSM actuating elements and sensing elements made by from/in thin films are expected to become of special importance in microsystems technology. The actuating or sensing elements or parts of them may be free from substrate or they can be fixed on the substrate.

The MSM active elements act also as sensors that detect strains and stresses by measuring the induced magnetic field caused by the shape changes of the material of the active element caused by mechanical deformation of them. The elements may be bare or they can be fixed in a matrix or on a substrate. When an active element is deformed, the proportions of different twin variants are changed. Because the magnetization in the variants is fixed in certain (easy) directions of the unit cell due to high magnetocrystalline anisotropy energy of the material of the active element, the magnetic field around the active element changes when the proportions of the twin variants change. This is called an inverse MSM effect. The magnetic field configuration around the element is dependent on the twin structure of the element. Therefore, measuring the magnetic field configuration around the element the state of deformation or the shape of the active element can be determined. The inverse MSM effect has a great diversity of applications ranging from joysticks, positioning devices and keyboards to stress sensors and power generators.

The apparatus that utilizes the inverse MSM effect is consisted on an active element (or elements) that is (are) deformed and devices that sense the magnetic field induced by the active element. The apparatus may also contain bias magnet(s) and/or flux paths that lead the magnetic flux from the active element to other devices, e.g., to the magnetic field sensors, or from the bias magnet(s) to the active element. The apparatus may also contain devices that pre-stress the active element(s). The active element and/or other components of the apparatus may be in placed in a composite, or the they can also be micromechanical devices made in thin films that are free or made on a substrate. The components of the apparatus may be combined in the apparatus or they can also be at a distance. Using several magnetic field sensors that detect the strength and/or direction of the magnetic field placed in different locations around the active element, complicated shape changes of the active element, e.g., elongation, contraction, bending, shear, torsion or any combination of them can be detected and determined. For instance, if the twin variants are randomly oriented initially, magnetic field detected outside the element is very small. If the active element is then deformed in such a way that one twin variant will be dominating, the magnetic field outside the element will be high and its orientation is determined by the unit cell of the dominant twin variant. Because of the high anisotropy energy of the active element, the magnetic field tends to be aligned in the direction determined by the twin orientation even if the field is tried to turn by external magnetic field. The active element behaves like a stress-controlled permanent magnet. Deforming the active element in other ways the magnetic field configuration around the element changes.

One example of the applications of the inverse MSM effect is a joystick-like device. Different shape changes of the joystick (active element) are determined and this information is transferred, e.g., to the computer. The active element and apparatus described here can also be used in devices that monitor positions. For instance, information of pressing a certain place of the device (keyboard) can be monitored. Also positions of machine parts that move in relation to each other can be determined. The apparatus can also be used to monitor force, for instance, in weights and load cells. Examples of dynamic applications are acceleration sensors. The changes of the magnetic flux due to the deformation of the active element induce a voltage in a coil placed in an appropriate way outside the element. Periodical loading of the element generates an electric current if an electric circuit of the coil is closed. Due to the high anisotropy energy of the MSM material of the active element, the apparatus may be used in power generation in specific applications. If the electric current is led through a resistive device, vibration energy of the periodically or instantly loaded active element is dissipated in the resistor. Dissipation can be controlled by changing the electrical resistance. This principle can be utilized, e.g., in vibration control of machines. The operational of the apparatus that utilizes the inverse MSM effect was demonstrated by measuring by a lock-in amplifier the voltage induced in a coil placed around an active element made from an alloy Ni-28.5Mn24.5Ga that was periodically loaded at different frequencies.

The active elements used in actuator and sensing applications are made from materials that transforms from a polycrystalline or single crystalline austenite phase to a ferromagnetic martensite phase that exhibits a twinned substructure through a displacive transformation by cooling below a specific transformation temperature ($M_s$) or by inducing the martensite phase by strain or assisting the transformation by stress or by the magnetic field. The actuating element can alternatively be made from a ferromagnetic metallic or ceramic material that exhibits a substructure composed of growth twins or deformation twins, if the system of twin variants can accommodate the shape changes of the material in the external magnetic field to develop the MSM effect, or if the proportions of the twin variants change (resulting in the change of the magnetic field outside the element) when loading the active element made from these materials to develop the inverse MSM effect.

Orienting the twin variants and martensite variants in the material of the active elements in an appropriate way is very important to be able to obtain large magnetic field-induced strains in the actuating element as well as to obtain desired magnetic fields when loading the active element in the applications of the inverse MSM effect. The orienting of the variants can be performed in different ways. One method is cooling the element from a high temperature in the austenitic region through martensitic transformation to a low temperature below $M_s$ temperature under load. The direction and stress level of the load depends of the deformation that is desired under the magnetic field. For instance, if the desired magnetic-field-induced strain of the actuating element is a linear strain, the load can be compression. If the actuating element is required to develop shear strain in the magnetic field, it is natural to cool the actuating element through the martensitic transformation temperature under a load that induces a shear strain in the element. This procedure orients the twin and martensite variants in such a way that the twinning planes of the variants are as close to the shear plane as it is crystallographically possible. If also the initial austenite is oriented so that the shear plane is parallel with one of the twinning planes of the martensite transformed, largest magnetic-field-induced shear strains can be obtained. Orienting of the martensite and twin variants under load during cooling below $M_s$ temperature can be performed in different direction of the stress of the load than the desired magnetic-field-induced strain of the active element is. Also cooling below $M_s$ temperature under a magnetic field in different directions can be used for orienting the martensite and twin variants.

Orienting the twin and martensite variants by cooling the active element under load or/and magnetic field in suitable directions can also be used to significantly increase the magnetic-field-induced strains of the active element that is formed by a polycrystalline structure in the austenite state. The polycrystals may be textured or even randomly oriented. During the martensitic transformation on cooling the active element under the load or/and the magnetic field such martensite and twin variants in different austenite grains are preferred to be formed whose orientations are close to the preferential orientations caused by the stress of the load and/or the magnetic field. This is possible because in each austenite grain there are several possible directions of the variants that can be selected. Hence, it is not necessary to orient the direction of the initial austenite to obtain preferentially oriented twin structure in the active element, but rather good performance can also obtained in actuating elements that are initially polycrystalline austenite. However, the largest magnetic-field-induced strains are obtained if the material of the active element is initially single crystalline austenite that is optimally oriented.

The actuating elements developing any of the magnetic-field-induced shape changes described above can work also above $M_s$ temperatures (martensite start temperature) if the external load or pre-stress transforms superelastic martensite from austenite. Also the inverse MSM effect operates above $M_s$. temperatures if the deformation of the active element transforms superelastic martensite. The actuating elements can be deformed at appropriate temperatures and magnetic fields and this treatment can be cycled to improve the performance of the active elements, and to produce desired shape changes of the actuating elements.

In the following sections several examples are presented. Those examples often show only a principle or illustrates the operation or are representatives of a group and should not be understood as limiting.

EXAMPLE 1

Figure 9A:
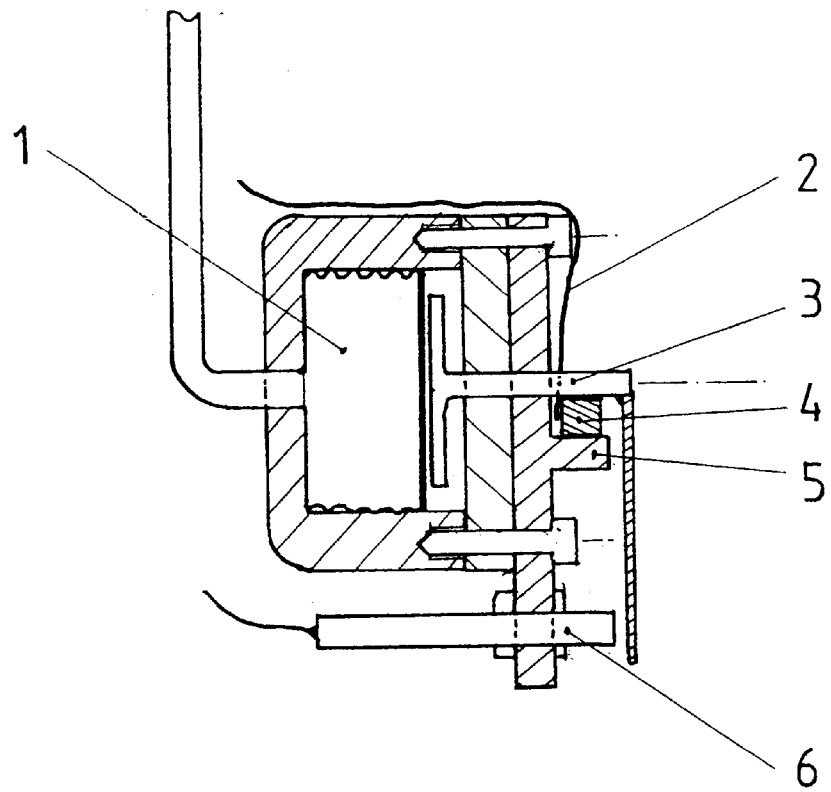
FIG. 9(a) shows a device used to measure magnetic-field-induced shear strains in a material.

A single crystalline austenitic non-stoichiometric Ni$_2$MnGa-sample (size 5.0×5.0×2.2 mm$^3$) was used for measuring magnetic-field-induced shear strain. A constant shear pre-stress was applied to the sample by a pneumatic shear stressing device. The device and the sample are illustrated schematically in FIG. 9a. In order to minimize measurement errors, the device was entirely made of non-ferromagnetic materials. The setup of FIG. 9a consists of a pneumatic bellow 1, a linearly moving axis 3, sample 4, fixture 5 and a position sensor 6. The sample 4 was fixed between moving axis 3 and fixture 5 of the device from the thin sides of the sample (size 2.2×5.0 mm). The entire cross-section of the sample could be exposed to shear stress.

Figure 9B:
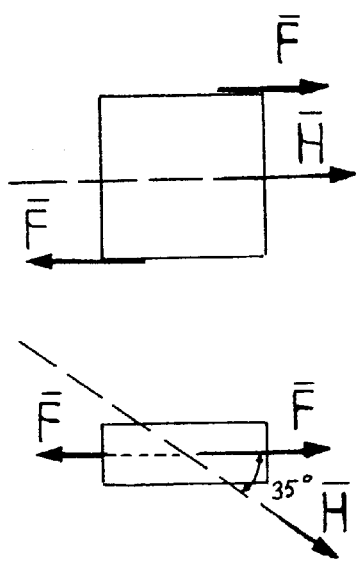
FIG. 9(b) shows the directions of the pre-stress F and the direction of the applied magnetic field applied H on the sample.

The whole device and the sample was then immersed in a container with a temperature-ontrolled alcohol circulation. Temperature of the sample was measured by a thermocouple 2 and the position of the axis 3 was measured by a position sensor 6. The container and the device were installed into an electromagnet so that a controllable DC magnetic field could be applied to the sample. The direction of the magnetic field H and the applied forces F affected the sample are shown in FIG. 9b.

Figure 9C:
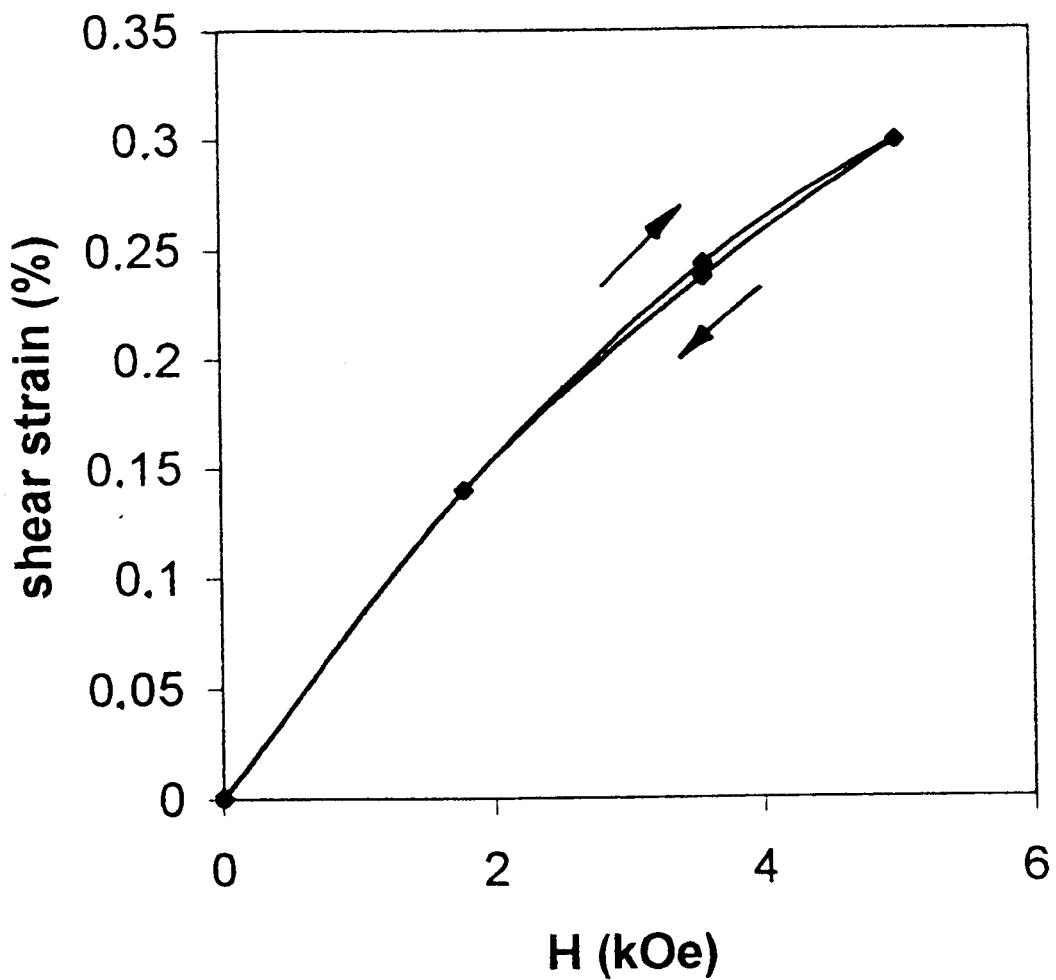
FIG. 9(c) shows the shear strain as a function of the applied magnetic field H.

A shear pre-stress τ was first applied at room temperature to the sample by applying a constant pressure P to the bellow 1 of the device. As the sample and the device were cooled, an increase of the displacement was observed starting at a temperature of T=−3° C. and leveling off at T=−8° C. This temperature induced shear strain (4%) can be explained to be a result of the martensitic transformation in the sample. The shear strain oriented the twin and martensite variants during the transformation. Cooling was continued down to T=−11° C., and then a magnetic field was applied to the sample. The measured magnetic field induced strain γ is presented in FIG. 9c. At the maximum magnetic field H=5 kOe, calculated magnetic shear strain ymx is 0.30%. In order to verify the test result, magnetic field cycle was repeated four times, ymax being 0.3% on every cycle.

EXAMPLE 2

Figure 10:
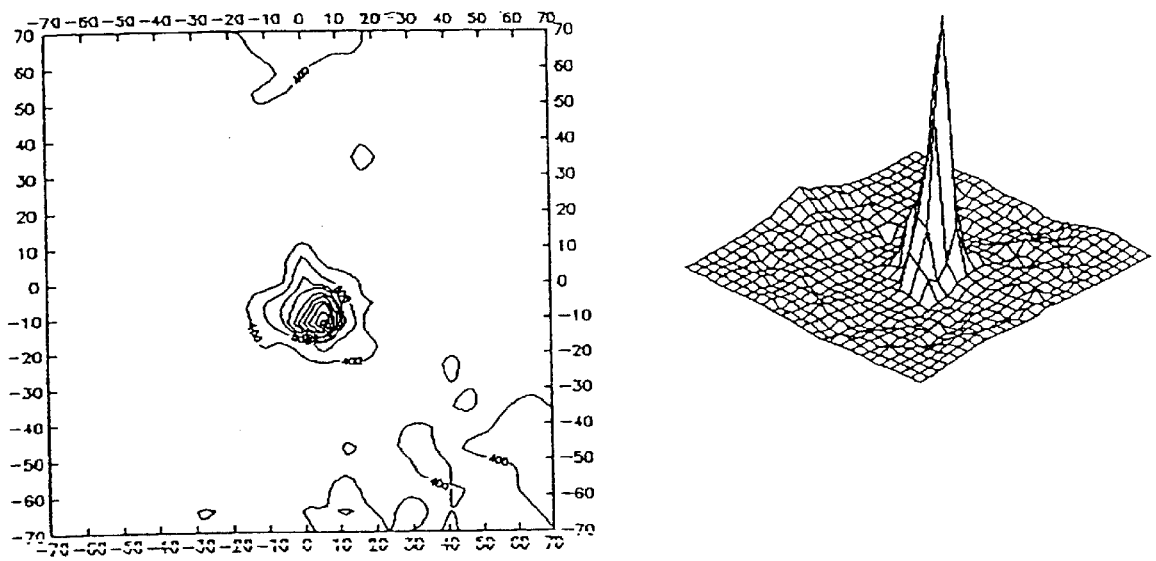
FIG. 10 represents pole diagram of (400) austenite relection measured with Cu-radiation in x-ray diffraction in the plane perpendicular to the austenite columnar grains.
Figure 11A:
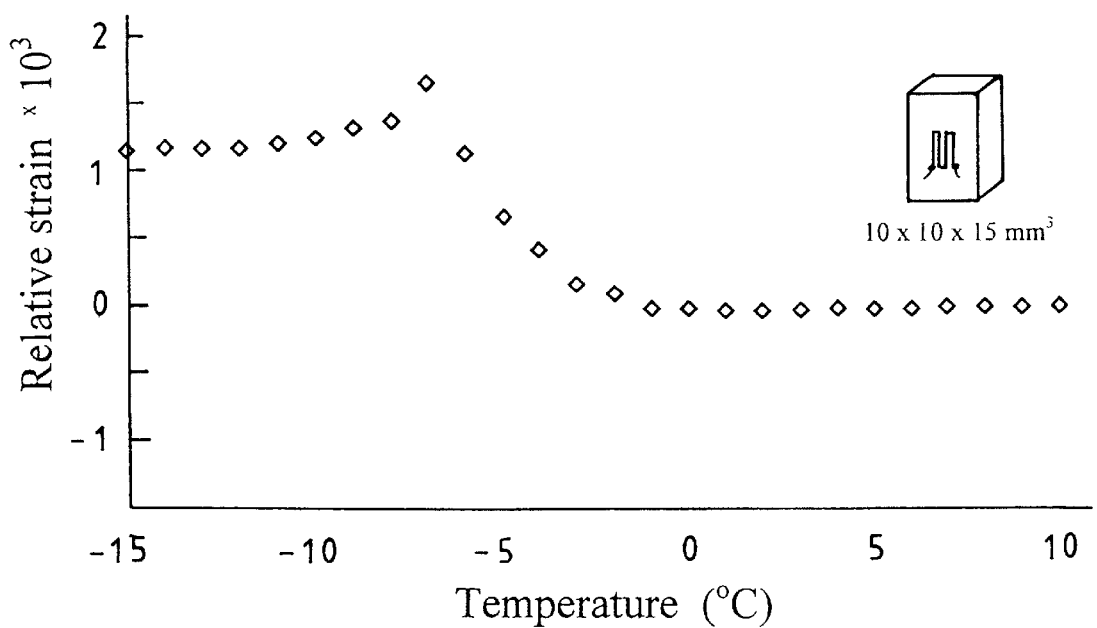
FIG. 11 shows relative strains of a Ni—Ga—Mn sample during cooling without magnetic field (FIG. 11a) and in the magnetic field (FIG. 11b).

Effect of the magnetic field on strain in a non-stoichiometric polycrystalline Ni$_2$MnGa sample was measured as a function of temperature during cooling. Chemical composition of the sample was Ni-28.5Mn24.5Ga and dimensions were 10×10×15 mm$^3$. Austenite grains were columns of about 0.5 mm in diameter. The columns were aligned in direction (400). Pole diagram of austenite (400) reflection measured with x-ray diffraction of Cu radiation proves that the structure of the sample was textured. In the x-ray diffraction measurement, direction (400) was perpendicular to the plane (10×10 mm$^2$) of the sample. The pole diagram is shown in FIG. 10. Sharp (400) peak reveals a clearly textured structure. The strain measurement was performed with strain gauges in direction (400) which was the longest dimension (15 mm) of the sample. FIG. 11a shows the strain of the sample during cooling as a function of temperature. Increase of the strain in the temperature range of 2 to 7° C. reveals that austenite phase transforms into martensite. Formation of martensite was also confirmed by other methods, e.g., by metallography. Some retained austenite was observed even at −15° C. The expansion (1.7× 10$^{-3}$) of the sample during cooling is due to greater unit cell volume of the martensite than that of austenite. X-ray diffraction measurements made on a (single crystalline) piece of about 0.1 mm in diameter cut from one columnar grain of the present material at temperatures below $M_s$ temperature revealed that intensities of twin variants of the martensite phase changed under external magnetic field. This reveals that the origin of the magnetic field induced strains in this material are mainly caused by the reorientation of the twin structure.

Figure 11B:
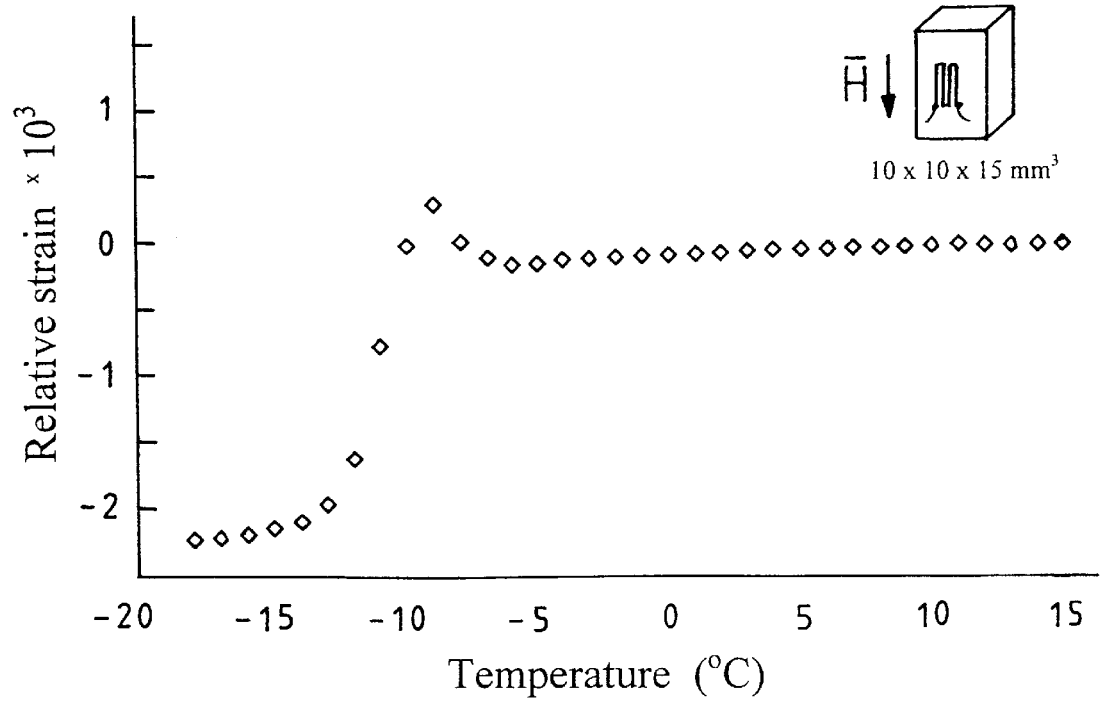

FIG. 11b shows the strain of the same sample during cooling in an external magnetic field of about 6 kOe. The magnetic field was parallel with the direction of the strain gauge (longest dimension of the sample). The sample is seen to contract about 2.5×10$^{-3}$. FIGS. 11a and 11b reveal that the sample is 0.34% shorter at −15° C. when cooling occurred in the magnetic field as compared to when cooling occurred in the absence of the magnetic field. This reveals that the magnetic field affects the orientation of the martensite that is transformed. Martensite variants and twin variants in favorable orientation to the magnetic field are preferred resulting in the contraction of the sample. Tetragonality c/a of the lattice in the present alloy is about 0.95. Because c-axis is the direction of easy magnetization, martensite unit cells tend to align so that the (short) c-axis is parallel with the magnetic field, which leads to contraction of the sample during the martensitic transformation in the magnetic field. It was confirmed by intensity changes of certain x-ray diffraction peaks of the martensite phase in measurements performed during cooling in the magnetic field and in the absence of magnetic field that the proportions of twin variants were changed in the magnetic field. Diffraction measurements made on martensite in the magnetic field and in the absence of the magnetic field at a constant temperature also revealed that intensities of the martensite peaks were dependent on the magnetic field, which indicates that the origin of the magnetic-field-induced strains observed are caused by the changes in the proportions of the twin variants.

EXAMPLE 3

Figure 12A:
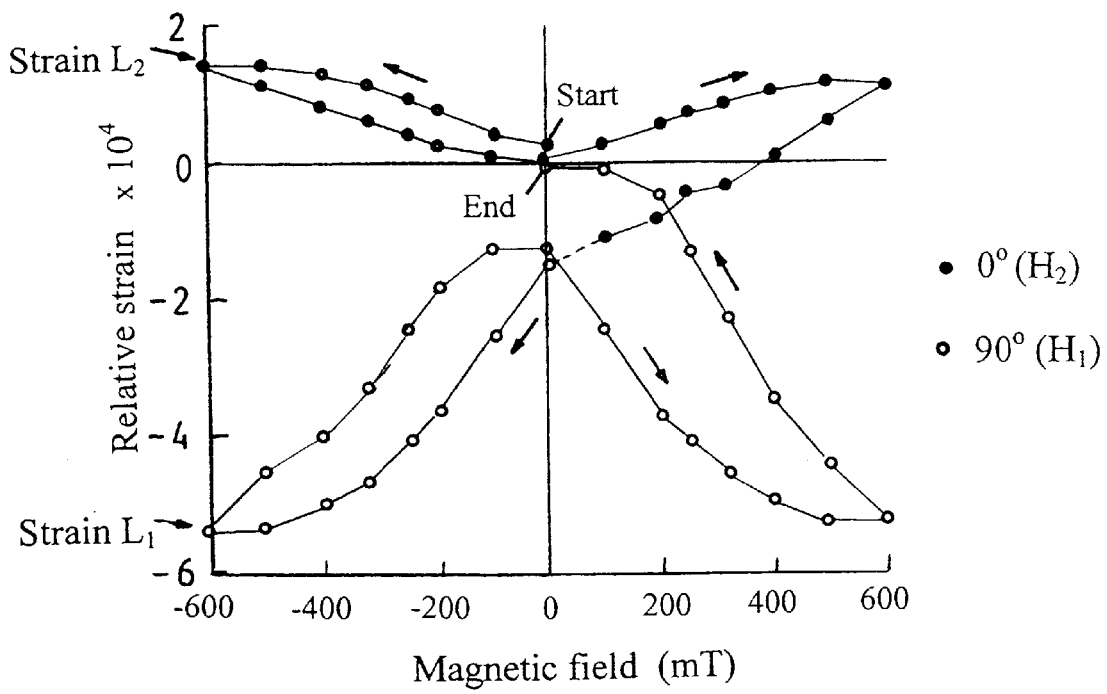
FIG. 12(a) shows a magnetic-field induced strain as a function of magnetic field in a non-stoichiometric $Ni_2MnGa$ material. The direction of the magnetic field was turned during the measurement from the direction ($H_1$) in which the strain was measured to a direction perpendicular to it ($H_2$)
Figure 12B:
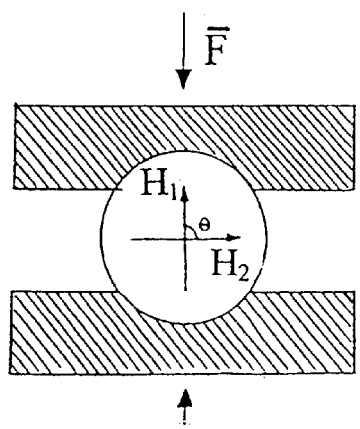
FIG. 12(b) shows the sample holder schematically.

We shall next study strains of the sample caused by the magnetic-field-induced reorientation of the twin structure in martensite transformed thermally in the absence of the magnetic field. The material was the same as in Example 2. The sample was a disc of 10 mm in diameter and 4 mm in thickness. The sample was placed in the holder made from non-magnetic stainless steel in which the sample could be compressed as shown in FIG. 12b. Strain was measured with a strain gauge in the direction of the compressive load.

Columnar grains of lattice direction (400) were also in this direction. Pole diagram (FIG. 10) measured by x-ray diffraction confirms that the sample is textured. Sample holder could be rotated around the cylinder axis of the sample. FIG. 12a shows strain as a function of the magnetic field without external load at −10° C. Sample is seen to contract when the magnetic field (marked $H_1$ in FIG. 12) changes from 0 to 600 mT and after that to −600 mT and back to 0. The sample expands when the magnetic field (marked $H_2$ in FIG. 12) was turned perpendicular to the direction of the strain gauge. This experiment reveals that the largest strain is obtained when the magnetic field is turned 90 degrees and keeping the field strength at its maximum value. Turning the magnetic field direction from one direction to the other or rotating of the magnetic field direction around a defined axis is one mode of operation of the MSM actuators.

Figure 13:
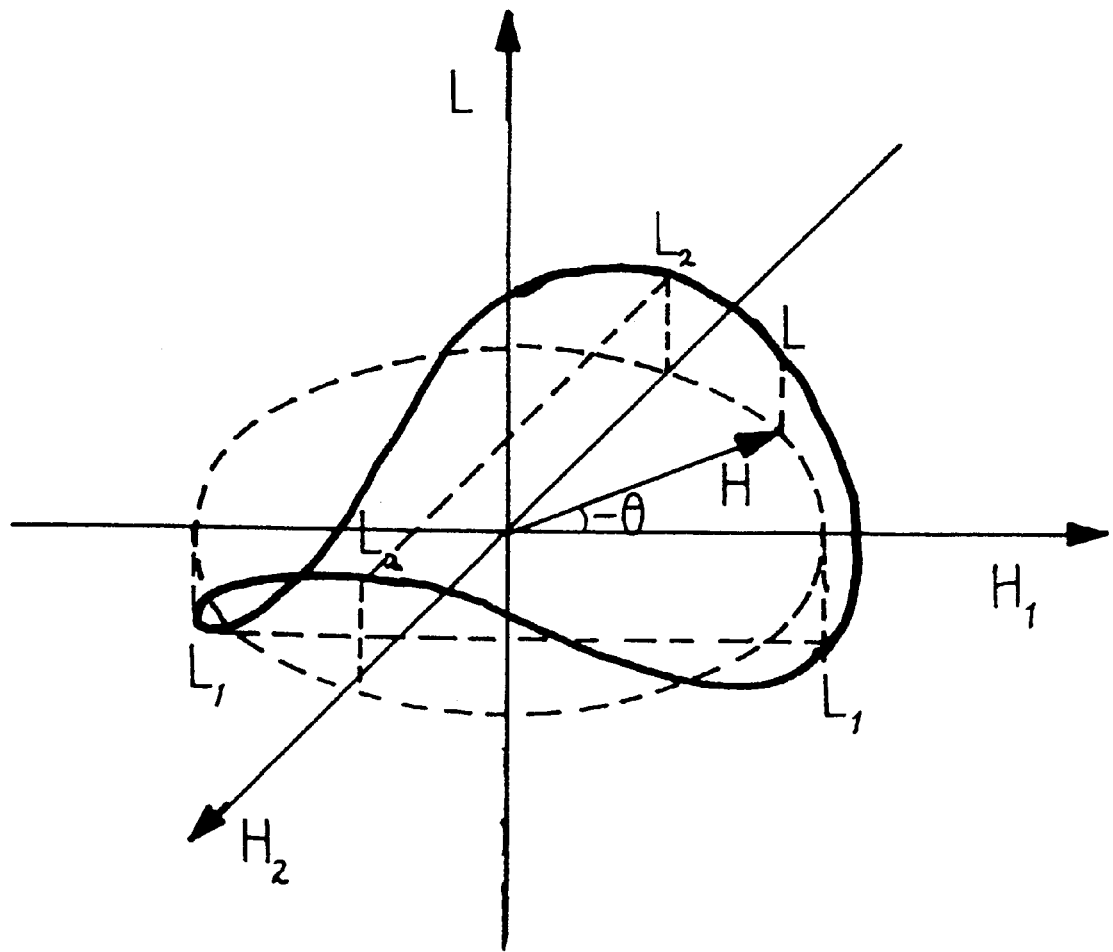
FIG. 13 shows magnetic-field induced strain in a rotating magnetic field as a function of rotation angle θ.
Figure 14A:
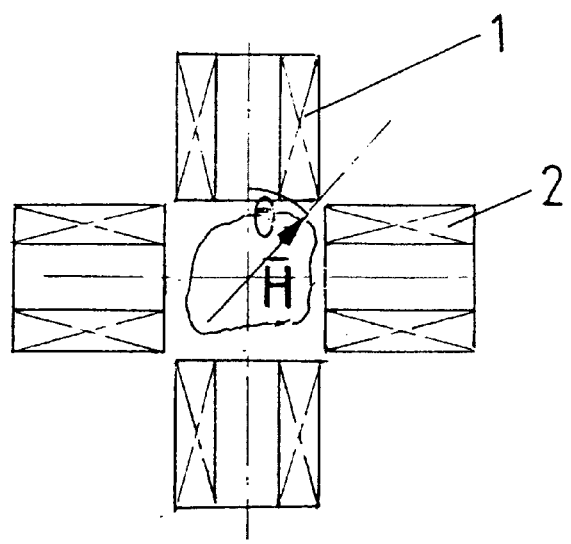
FIGS. 14 (a) and (b) show two sets of magnetic field sources (e.g., coils) that can induce rotating magnetic fields with a constant or varying strength to the actuating element.
Figure 14B:
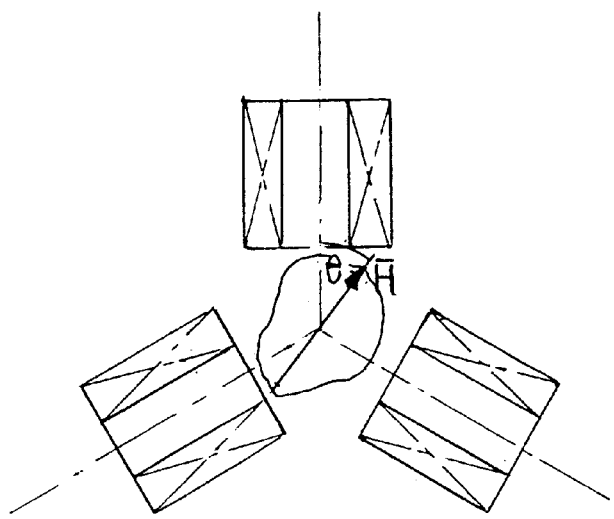
Figure 15A:
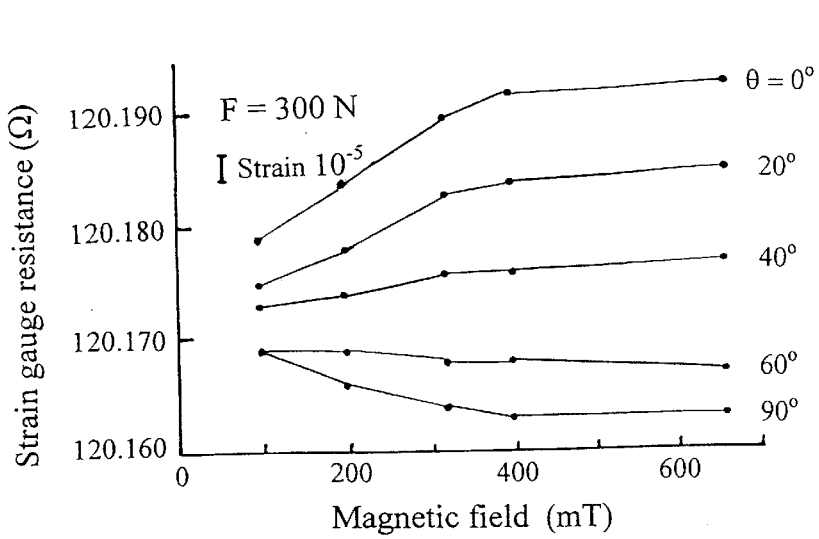
FIG. 15 shows magnetic-field-induced strain as a function of magnetic field in Fe-29,5Pd at room temperature in different directions of the magnetic field (Relative strain is equal to relative strain gauge resistance $\Delta\Omega/\Omega$ divided by 2). The loads were: 300 N (in FIG. 15a), 500 N (in FIG. 15b) and 800 N (in FIG. 15C). The bars of a relative strain of $10^{-5}$ are shown as insets.
Figure 15A:
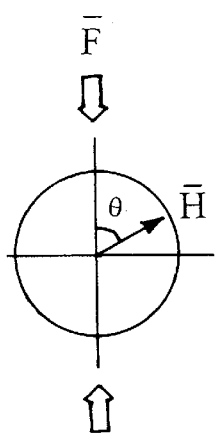
Figure 15B:
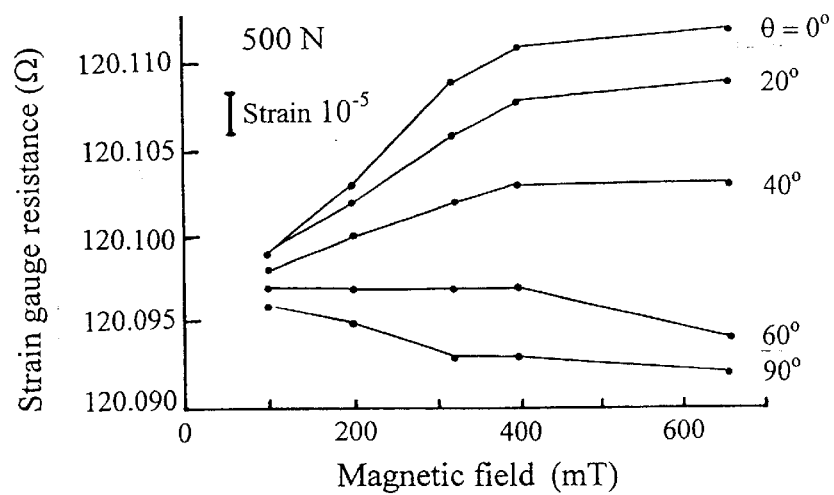
Figure 15C:
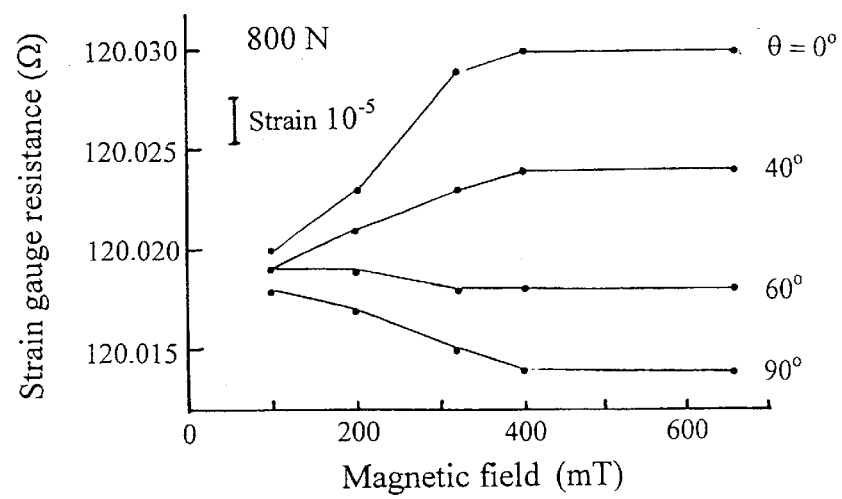

FIG. 13 shows schematically the strain of this sample when the magnetic field rotates (varying angle θ). When angle θ changes the dimension L of the sample changes according to FIG. 13. Minimum values $L_1$ are obtained in the field directions +−$H_1$ and maximum values $L_2$ in the field directions +−$H_2$. Rotation of the magnetic field in actuators can be arranged by turning the actuator mechanically in an external magnetic field, or with two or more magnetic field sources, e.g., electromagnets or coils whose magnetic fields are perpendicular to each other and they are driven by sinusoidal currents whose phase difference is 90 degrees. Each electromagnet may be split in two pairs of separate electromagnets placed axially as shown in FIG. 14a. It is possible to use three electromagnets whose magnetic fields cross each other and whose phases are shifted 120 degrees in relation to each other (FIG. 14b). The phase shifts of the driving currents of the neighbouring electromagnets are also 120 degrees. The absolute value of the rotating magnetic field can also be varied as a function of time. One of the electromagnets is replaced by a permanent magnet. The examples presented here are not to be understood as limiting.

EXAMPLE 4

Strain of polycrystalline Fe-Pd sample as a function of the magnetic field was studied under compressive load at room temperature. Pd content was measured about 29.5 mass %. Alloy was induction melted and cast in copper mold. The ingot was solution treated in evacuated quartz capsule at 1100° C. for 48 hours and then annealed at 900° C. for 1 hour and water quenched. A part of the ingot was cold rolled about 100% and again annealed at 900° C. for 1 hour and water quenched. A disc of 10 mm in diameter and 2 mm in thickness was spark machined from it. The strain gauge was fixed by glue on this disc. The strain gauge measured strains in the loading direction. The disc sample was installed in the same holder that was used in Example 3. The sample was loaded by external force in compression. The strain decreased quite linearly as a function of increasing load. The maximum contraction of the sample was about 0.12% at 1000 N that corresponds stress of about 100 MPa. When the force is released, the strain was recovered. This recoverable strain is an indication of superelastic behaviour: preferentially oriented martensite plates were formed under load.

FIGS. 15 a, b and c show the strain of the sample as a function of the magnetic field under three different load values. The sample was loaded in compression at 0 N, 300 N (FIG. 15a), 500 N (FIG. 15b) and 800 N (FIG. 15c). The sample holder was turned around the cylinder axis of the sample in different positions. Angle Θ was fixed 0, 20, 40, 60 and 90 degrees at each value of the load (except the angle of 20 degrees is lacking in FIG. 15b).

Strain was measured as a function of the magnetic field for different values of Θ and for the different compressive loads at room temperature, as shown in FIG. 15. The maximum magnetic-field-induced MSM strain in this alloy was about $1.5\times10^{-4}$ corresponding to rotation of the sample from θ=0 to 90 degrees. This value is higher than magnetostriction of this alloy. Because the unit cell of the martensitic phase is tetragonal and c/a greater than 1, the sample tends to expand in the magnetic field direction. Easy axis of magnetization is c direction. FIG. 15 shows that the sample expands in the loading direction when angle θ is 0, 20 and 40 degrees, and contracts when θ is 60 or 90 degrees. The maximal strain under the load of 800 N is $0.67\times10^{-4}$ corresponding rotation of the sample from θ=0 to 90 degrees. This strain is about half of the strain measured under the load of 300 N. This reveals that very high magnetic-field-induced stresses can develop in this material. The force 800 N corresponds stress value of about 80 MPa in the present sample. Assuming that the magnetization is varied between 0 and 90 degrees or rotated around the cylinder axis of the sample at a frequency of 1 kHz, the power output density calculated from the strain and stress outputs is about 700 W/kg. For this calculation, the actuating element is assumed to be laminated in the same way as transformer cores to reduce eddy current losses. If the frequency were 5 kHz, power output density would be 3.5 kW/kg. This value is an order of magnitude larger than power output densities of regular electric motors. It will be shown below that MSM effect occurs at frequencies over 5 kHz. Further, over an order of magnitude higher power output densities would be obtained in Fe-Pd alloys whose austenitic structure would be textured or single crystalline, because is such samples MSM strains are significantly higher.

EXAMPLE 5

In this example magnetic-field-induced strains in an actuating element made from non-stoichiometric $Ni_2MnGa$ alloy (the same alloy as in Example 2) will be studied under compressive load at room temperature in different directions of the external magnetic field. This material is austenite at room temperature, but martensite is transformed under load at room temperature. Actuating element was 13 mm in diameter and 30 mm in length. It was compressed from 0 to 90 Mpa that resulted in partially recoverable superelastic strain of 0.6% revealing that stress-assisted martensite was transformed under load. In this element austenite columnar grains of (400) direction were oriented in the plane perpendicular to the cylinder axis.

Figure 16A:
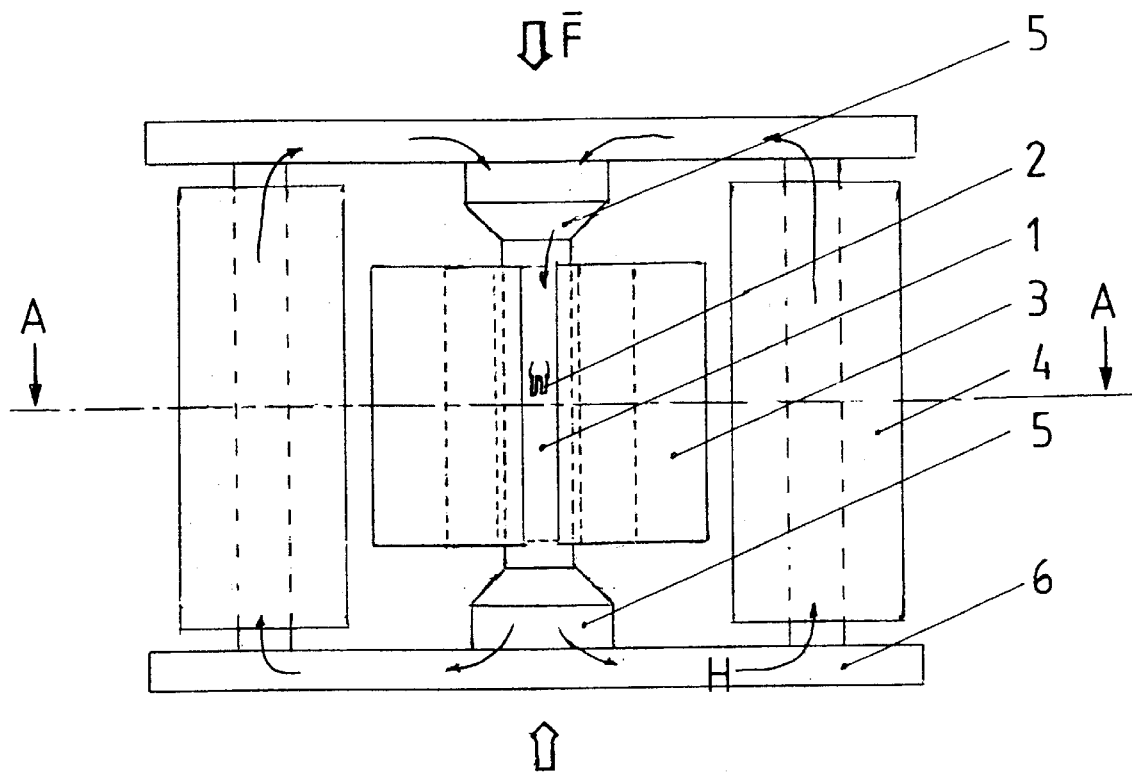
FIGS. 16(a, b) shows an actuator configuration in which the direction and absolute value can be changed: (1) cylinder-shaped actuating element, (2) strain gauge that measures strains in the direction of the axis of the sample, (3) core, (4) coil of the electromagnet (5) Fe-Nd-B permanent magnet that produces a magnetic field in the direction of the sample axis, (6) magnetic flux path. Force F produces a load on the actuating element in the direction of the axis of the element.
Figure 16B:
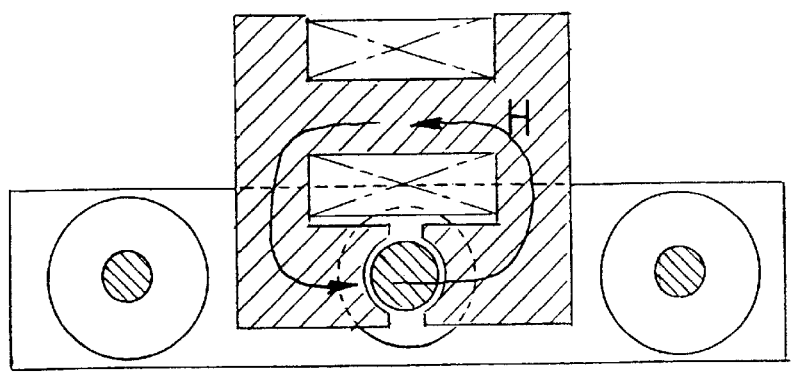

FIG. 16 shows an actuator in which the strain of the actuating element can be controlled by magnetic fields whose intenstiy and direction can be varied. The loading direction was along the cylinder axis of the sample. The sample (1) was installed in the slit machined perpendicular to the laminated flux path of the apparatus that was made from a transformer. This actuator is called "transformer actuator" below. The magnetic flux passed the sample perpendicular to its cylinder axis. Magnetic field in air (without sample) was measured 0.25 T. Magnetic-field-induced strains of the sample were measured with this setup in alternating and static magnetic fields by supplying ac and dc currents to the coil of the apparatus, respectively. FIG. 16 also shows another magnetic circuit that produces a magnetic field in the direction of the cylinder axis of the sample. Permanent Fe-B-Nd magnets (5) produce a magnetic field of 0.6 T in an air gap of 10 mm, but the field was smaller when this magnetic circuit was installed in the setup shown in FIG.

16, because main part of the flux passes through the transformer plates (3). In this combined setup shown in FIG. 16, the magnetic field is along the cylinder axis of the sample (longitudinal field) when no current is supplied to the coil of the "transformer actuator". When the transverse magnetic field is increased by the "transformer actuator", the magnetic field direction in the actuating element starts turning from the cylinder axis direction towards the direction of the transverse field. The intensity of the resultant field is increasing at the same time. If alternating current is supplied to the "transformer actuator", magnetic field is alternating between two directions as well as between two intensity values.

The magnetic field generated by the coils 4 measured in the bore of the coils is about 0.3 T. The magnetic flux generated by the coils are, however, hampered by the permanent magnets 5 before it reaches the sample. When the permanent magnets are installed, coils 4 were mainly used for frequency response measurements in different directions and intensities of the static magnetic field caused by the permanent magnet (longitudinal) and the "transformer actuator" (transverse). When permanent magnets are not installed, magnetic field in the sample produced by coils 4 is much higher. Coils 4 and the "transformer actuator" can be supplied by alternating currents with different intensities, frequencies and phases to produce magnetic fields in the sample that may rotate or flip between two directions in the plane that is determined by the cylinder axis of the actuating element and the transverse field direction of the "transformer actuator". Also field intensity can be varied in time in a controlled way. Finally, the alternating magnetic field causes magnetic-field-induced MSM strains in the actuating element. Directions and amplitudes of the strains depend on the composition of the MSM alloy, orientation of the lattice structure and the stress on the sample that can be tensile, compressive, bending, shear or torsion etc.

Figure 17A:
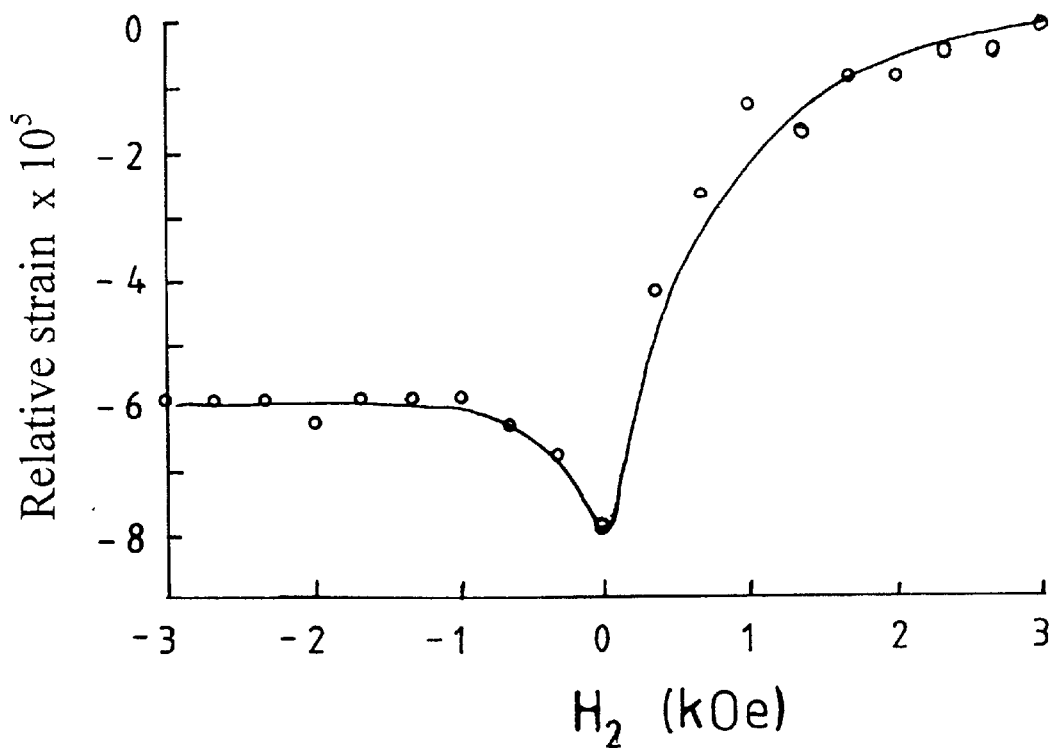
FIG. 17(a) shows a magnetic-field-induced strain as a function of the magnetic field $H_2$ perpendicular to the loading static bias field $H_1$. $H_1$ is in the direction in which the strain is measured (FIG. 17b). Superelastic compressive strain is 0.46%.
Figure 17B:
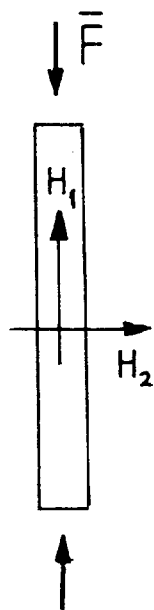
Figure 18A:
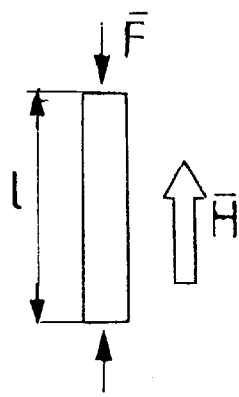
FIGS. 18(a–g) show selected orientations of the magnetic field that induces magnetic-field-induced strains, and orientations of bias fields in relation to the load direction for linear strain (elongation or contraction) of the actuating element. Force F may be positive or negative.
Figure 18B:
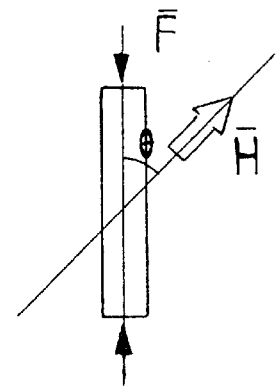
Figure 18C:
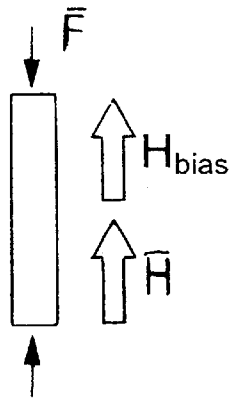
Figure 18D:
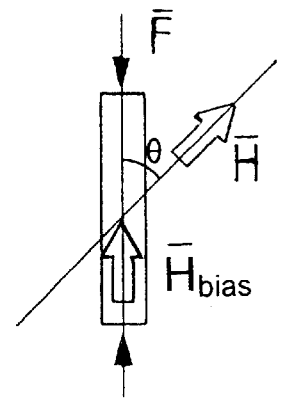
Figure 18E:
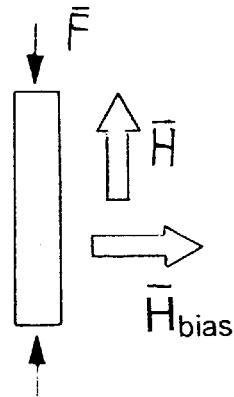
Figure 18F:
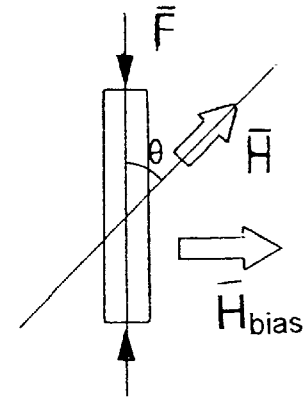
Figure 18G:
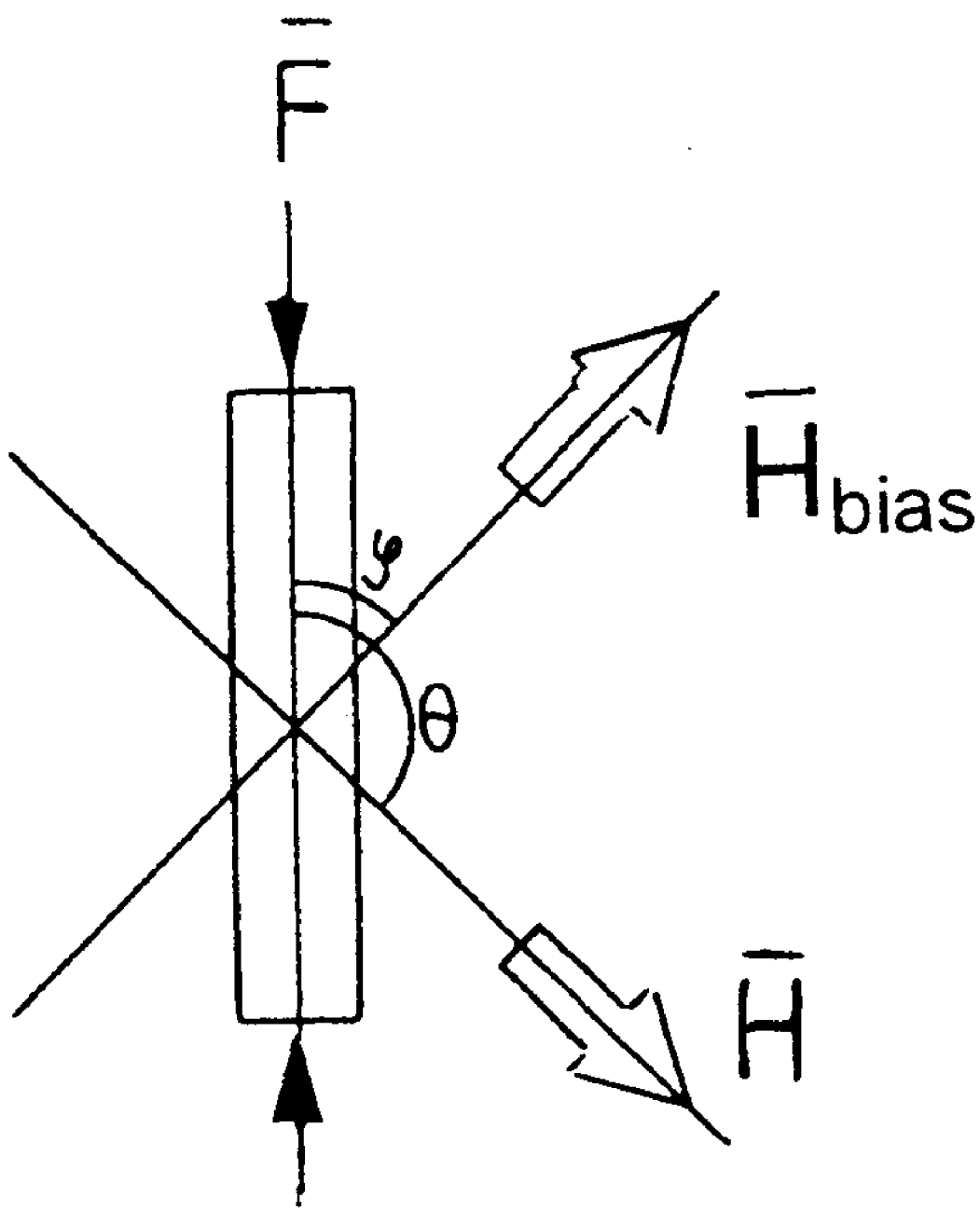
Figure 19A:
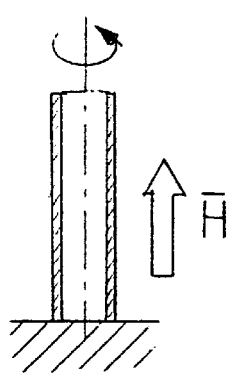
FIGS. 19(a–g) show selected orientations of the magnetic field that induces magnetic-field induced strains and orientations of bias fields in relation to the load direction for twisting (torsional) shape change of the actuating element.
Figure 19B:
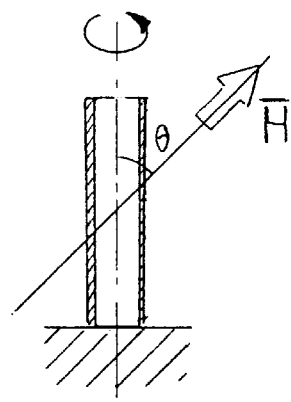
Figure 19C:
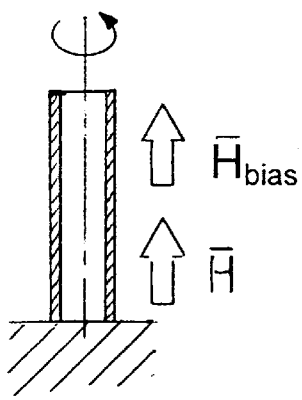
Figure 19D:
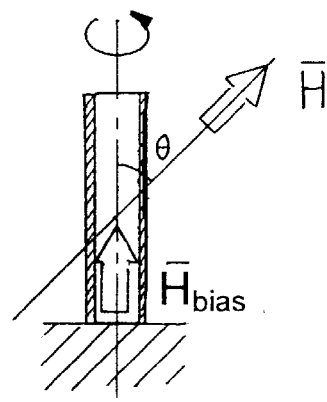
Figure 19E:
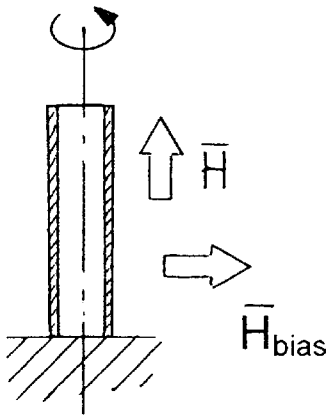
Figure 19F:
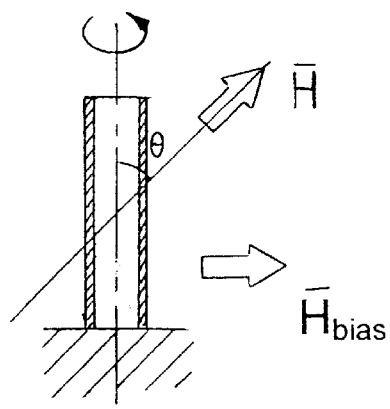
Figure 19G:
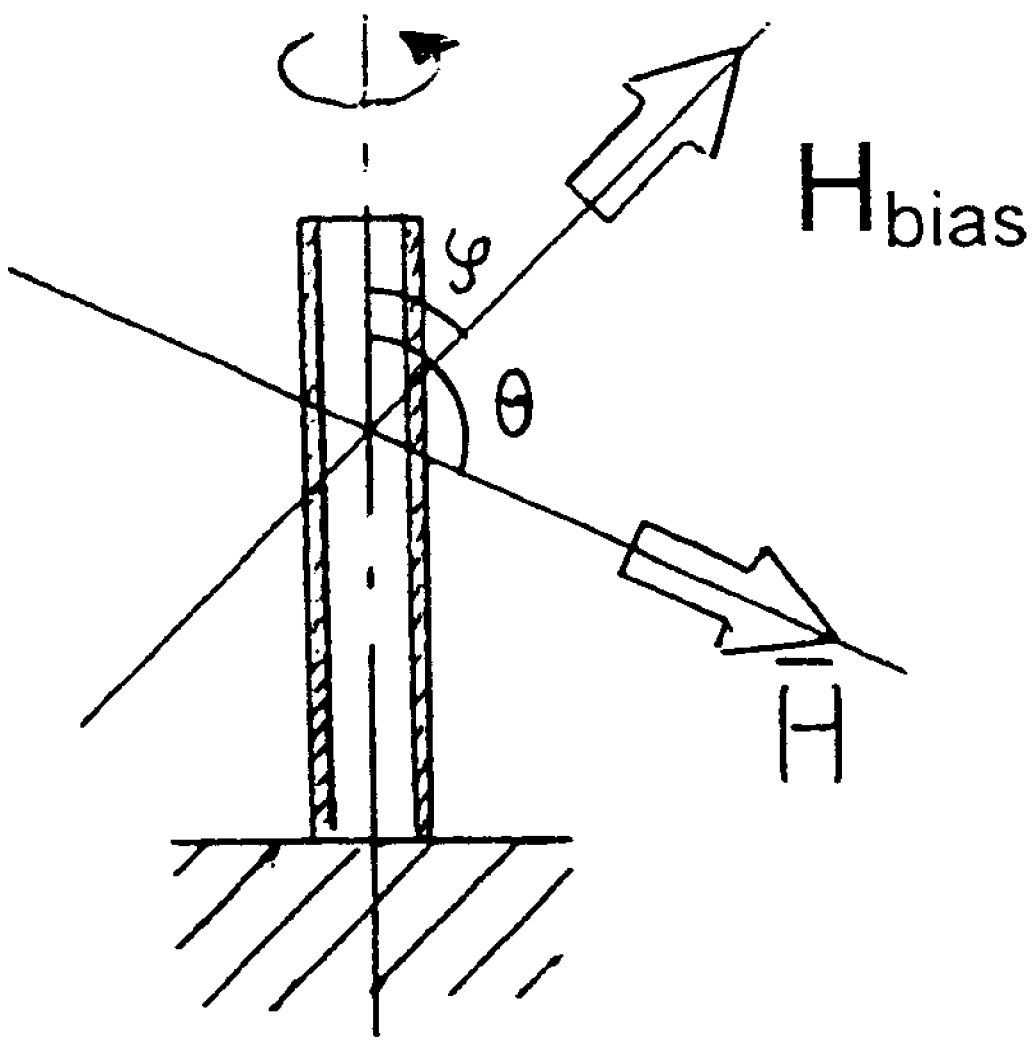

Magnetic-filed-induced strains were measured at different compressive load values with and without biasing the magnetic field by permanent magnets. Results of the measurements made without the bias field on the sample whose austenite columns were aligned along the compression direction were similar to those shown in Example 3 in the transverse magnetic field. Magnetic-field induced strains were also measured under compressive load as a function of the transverse magnetic field $H_2$, longitudinal magnetic field $H_1$ produced by the permanent magnets being constant. FIG. 17 shows the strain vs. $H_2$ when the sample (columnar grains of (400) direction were oriented in the plane perpendicular to the cylinder axis) was compressed 0.46%. The strain curve shows unsymmetrical behaviour. Strains are larger for positive magnetic field values than for negative values. This means that deformation in this textured austenitic sample has produced martensite whose twin structure is preferred in such orientations that the magnetic-field-induced strains show unsymmetrical behaviour.

As examples shown above reveal, magnetic-field-induced MSM strains based on reorientation of the twin variants and martensite variants produce high stresses (even above 100 MPa) and high power output densities. MSM actuators can also operate at high frequencies because twin boundaries can move nearly at a speed of sound of the material. Eddy current losses caused by the alternating magnetic fields limit the frequency response of the MSM materials. Therefore, MSM materials that are driven at high frequencies as well as magnetic flux path materials are recommended to be made by laminating of thin insulated plates together so that circulation of electric currents is hampered. In some cases MSM materials can be made from thin wires or particles.

EXAMPLE 6

Actuator Configurations

FIG. 18 shows some basic configurations how the shape change of the actuating element can be controlled by an external magnetic field. For simplicity, the actuating element is drawn a solid bar. Real actuating element can exhibit complicated shapes. The basic configurations in FIG. 18 can be applied locally in some point (small element) of the actuating element. Direction of the load is assumed to be parallel with the direction of the longest dimension of the bar in this example. The force and strain that the actuating element develops in a magnetic field may be static or its value can vary as a function of time. The strains can be elongation or contraction. Magnetic field sources can be, for instance, electromagnets, coils or permanent magnets; or the magnetic field can be generated in the actuating element or in the magnetic flux path via ferromagnetic transition caused by mechanical loading, temperature change or current density. The bias magnetic field source may be a permanent magnet or an electromagnet or a coil. Also bias field can develop shape changes of the actuating element. Those changes are static or their values may vary as a function of time. In FIG. 18*a* the magnetic field is parallel with the direction of the longest dimension of the actuating element, and in FIG. 18*b* there is an angle θ between the field direction and the direction of the longest dimension of the actuating element. The angle can be constant and the absolute value of the magnetic field can vary as a function of time, or also the angle can change in time.

The variation of the magnetic field directions and absolute values can be performed using magnetic field sources that are placed in such a way that magnetic fields produced by them are directed in appropriate directions, e.g., perpendicular to each other in the x-y plane or in the x-y-z space. Magnetic field sources can be electromagnets, coils, permanent magnets; or the magnetic field can be generated in the actuating element or in the magnetic flux path via ferromagnetic transition caused by mechanical loading, temperature change or current density.

Figure 20G:
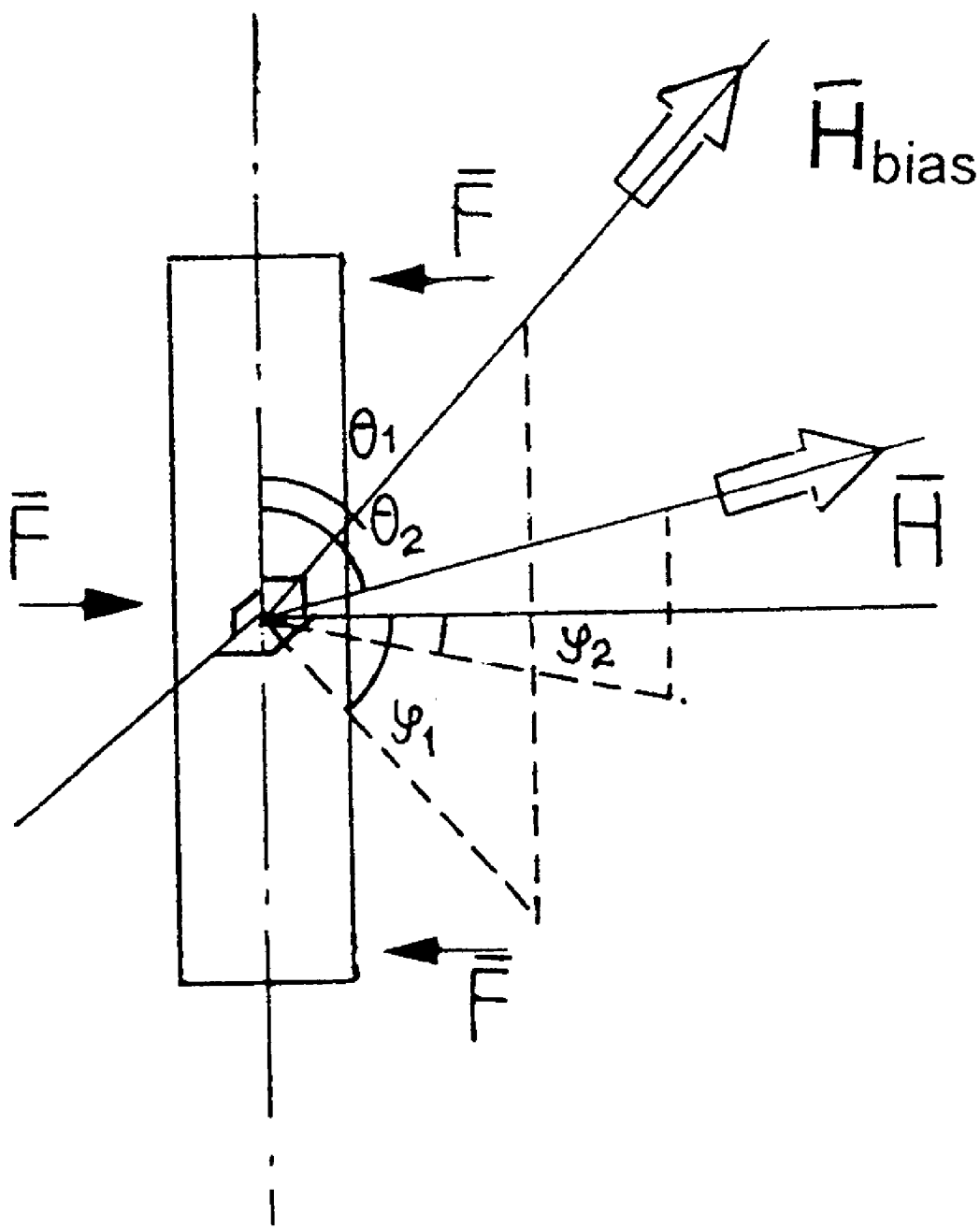
FIGS. 20(a–g) show selected orientations of the magnetic field that induces magnetic-field induced strains and orientations of bias fields in relation to the load direction for bending shape change of the actuating element.

FIG. 19 shows corresponding configurations of the magnetic fields and loading directions for a torsion deformation of an actuating element around the direction of the longest dimension of the material. The actuating element is drawn a circular tube for simplicity. The twin structure of the MSM material is oriented in such a way that the present magnetic field configurations result in torsional deformation of the actuating element. FIG. 20 shows corresponding configurations of the magnetic fields and loading directions for a bending deformation of an actuating element. The twin structure of the MSM material is oriented in such a way that the present magnetic field configurations result in bending deformation of the actuating element. One more angles is needed to determine the directions of the external magnetic fields in the bending case because the symmetry of the system is lower than in the case of compression/elongation and twisting.

In many applications, magnetic-field-induced MSM strains of machine components may include contraction/elongation, bending, shear and torsion at the same time. Also the actuating elements may be complicated in shape. In such cases, some of the basic configurations shown above are applied locally on a small element of the actuating element. The total shape change of the macroscopic body is a superposition of the local configurations.

FIG. 21 shows few examples of actuators. In FIG. 21a a permanent magnet 2 produces the transverse static bias field and the electromagnet 1 producing alternating longitudinal magnetic field drives the actuating element. The magnetic flux paths are not shown in this figure. FIG. 21b shows another arrangement to produce similar shape change of the actuating element. The flux path is marked by 4. In FIG. 21c two magnetic field sources, e.g., electromagnets produce magnetic fields nearly perpendicular to each other.

Figure 22:
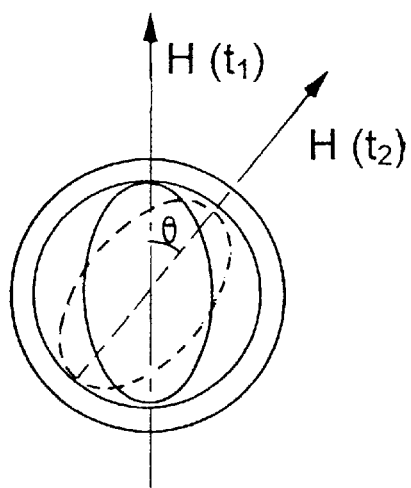
FIG. 22 shows a body whose shape is changed in applied magnetic field. When the magnetic field rotates, the shape (long axis of the ellipse) also rotates.

Rotation of the magnetic field can be produced in different ways. FIG. 14 shows two configurations based on electromagnets or coils to which current is supplied in different phases. If such an MSM actuating element that elongates in the magnetic field is installed in the apparatus in which the magnetic field rotates, the dimensions of the actuating element also rotate in the rotating plane of the magnetic field. For example, a round cylinder becomes elliptical in the magnetic field applied in the radial direction. When the magnetic field rotates, also the long axis of the ellipse rotates. If the cylinder is installed inside a coaxial round tube with a tolerance of about the same value as the magnetic-field-induced strain of the bar, the volume between the oval bar and the tube also rotates (FIG. 22). The rotation rate can be very high, even several kHz. This volume could be filled with fluids or other material. Those materials could be mixed, milled or processed in other ways in this volume. This rotating volume might also be used utilized in pumps or other kinds of actuators.

EXAMPLE 7

Electrical Contactors

Figure 23:
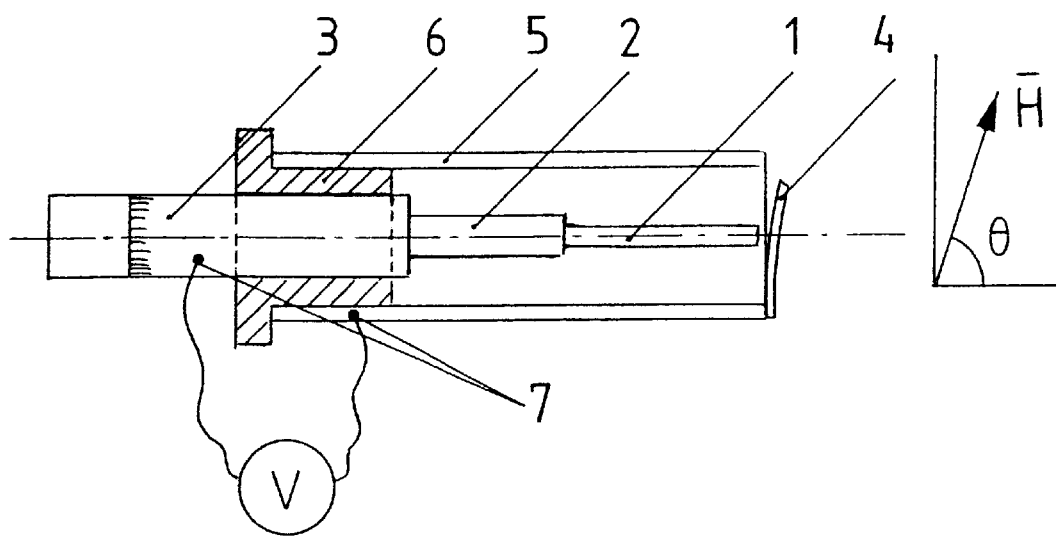
FIG. 23 shows a basic actuator that is also used to demonstrate the operation of an electric relay: (1) is the actuating element (that generates the magnetic-field-induced strain), (2) is the moving part of micrometer, (3) is a micrometer, (4) is the end plate of actuator (spring), (5) is the body of actuator, (6) is insulator, and (7) represent electric contacts. Other parts of the device are electrically conducting.

An example of an actuator that produces contraction in the direction of an applied magnetic field is shown in FIG. 23. The actuating element was placed in the end part of the micrometer. When the micrometer is turned, the actuating element touches the other end of the actuator closing the electric circuit, that is consisted of the micrometer, actuating element and the body of the actuator. When a non-stoichiometric $Ni_2MnGa$ material was used as an actuating element, the electric circuit opened when applying a magnetic field in the direction of the actuating element. Keeping the magnetic field unchanged and turning the micrometer until the electric circuit was closed again, the magnetic-field-induced contraction of the actuating element was measured. This experiment demonstrates the operational principle of an electric contactor based on the shape changes of the actuating elements based on the changes of the proportions of the twin and/or martensite variants of the MSM material by the external magnetic field. The contactor was also tested using an alternating magnetic field. The spring at the end of the actuator was also used as a pre-stressing load of the actuating element when the operation of the actuator was tested in magnetic field perpendicular to the loading direction. In this test the electric contact was not broken.

Power output density of the actuating element used in the contactor is about 1 kW/kg. The present MSM technology makes it possible to make fast and powerful contactors and corresponding devices. The precise motion control of the contactors makes it possible to contact alternating currents at a moment when the voltage is zero. This is important in high voltage relays and contactors. Fast and large magnetic-field-induced strains obtained in MSM materials makes it possible to move electric contact points far from each other when the circuit is broken. This is important to avoid spark at high voltages and to prevent high frequency ac currents from passing through the open contactor. In contactors that contact and break high frequency electric currents, capacitance is important to be decreased by increasing the gap between the contact points. MSM actuators can also be used to control capacitance by changing the distance between the plates of the capacitor. Magnetic-field-induced shape changes of MSM actuating elements can also be used to detect magnetic fields. One example of such an arrangement is a capacitor in which the distance between the electrodes is changed by the MSM actuating elements. When a magnetic field is imposed on the elements, the gap between the capacitor electrodes changes. The magnetic field is determined from the capacitance change.

Linear motors described in Example 11 can also be used to change the distance in the electrical contactors and capacitors. Appropriate configurations of the magnetic field directions in relation to the strains and forces of the actuating elements that produce different kinds of shape changes in the magnetic field, e.g., bending, shear or torsion and different actuator examples shown in this application can be used in electrical contactors. Contactors and capacitors may also be micromechanical. They can be manufactured, e.g., by thin film processes on a substrate (for instance silicon).

EXAMPLE 8

Fluid Regulators

Figure 24:
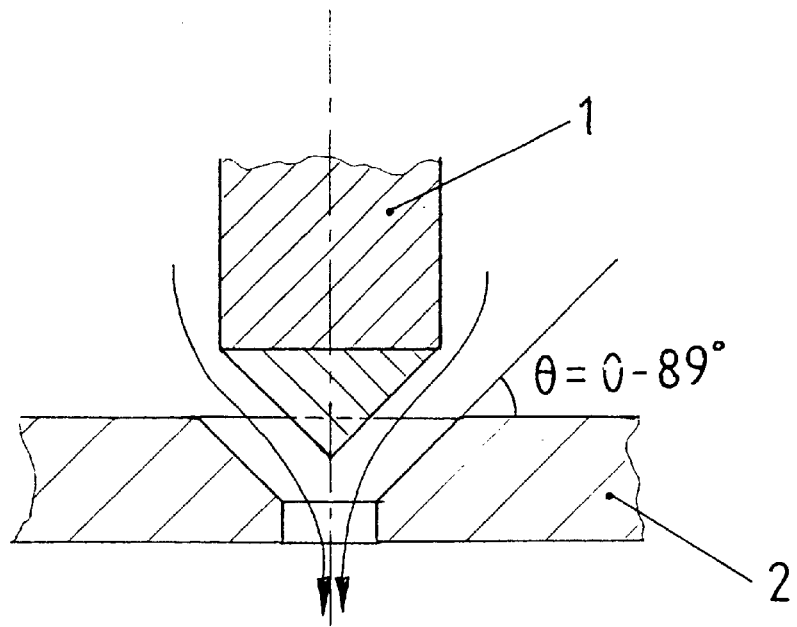
FIG. 24 shows a fluid regulator: Both (1) and (2) may be actuating elements.
Figure 25:
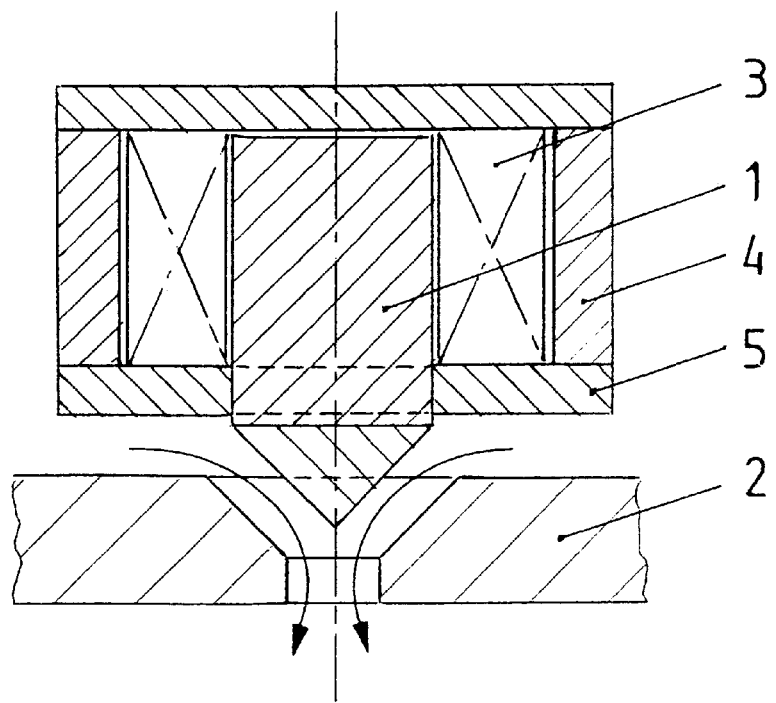
FIG. 25 shows the regulator and an example of an actuator driving the regulator.

Similar basic construction as shown in FIG. 23 for an electric contactor can also be used to regulate a flow of liquid or gas in valves, regulators and injectors. The actuating element can move, e.g., a cone that restricts and closes the flow. Fast response (frequency several kHz) and large displacements of the actuator materials, potentially a few percent of the dimension of the actuator material, make such valves, regulators and injectors suitable for many applications. Because forces developed by the MSM materials are high, also high pressure valves, regulators and injectors, such as fuel injectors for diesel engines, can be made. Valves, regulators and injectors can also be feed back controlled, that is important, for instance, in fuel injectors of engines. It is possible to detect burning temperature and pressure and compositions of exhaust gases and control the fuel injection in real time to obtain an optimal operation of the engine. Also complicated fuel injecting profiles (injected volume of fuel/time) can be generated. FIG. 24 shows an example of the valves or injectors. In FIG. 25 also the magnetic field source (coil) and the flux paths are illustrated. The flow is regulated by moving the mutual distance of parts 1 and 2. This may happen by changing the length of the actuating element in the direction of the symmetry axis of the cone. The actuating element moves the cone. The cone itself may also be made from MSM material. Another possibility is to make part B from an MSM material. In the magnetic field this part expands radially, the cone axis being the symmetry axis. Also linear motors described in Example 11 can be used to move the cone of the flow regulator.

Figure 26:
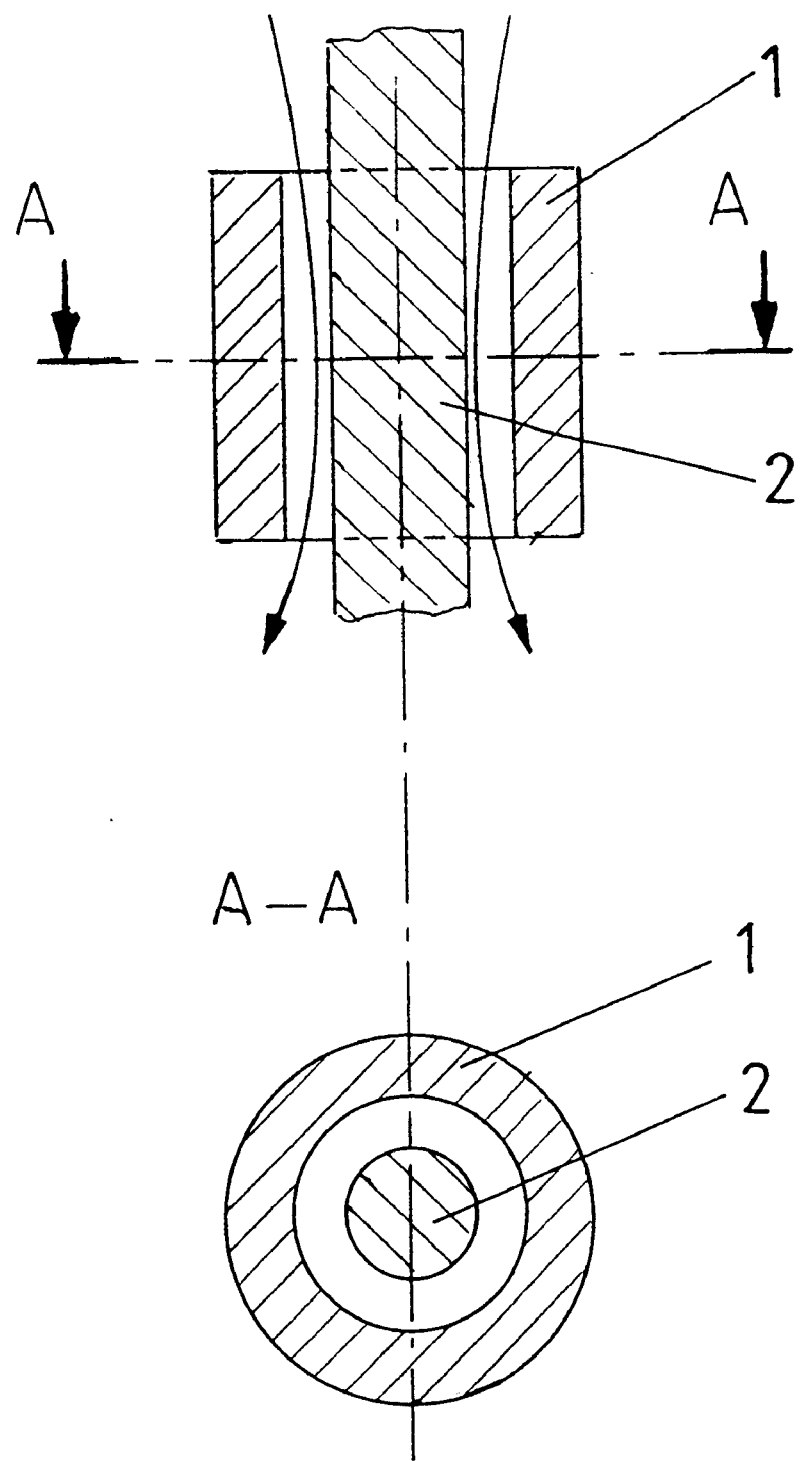
FIG. 26 shows a fluid regulator. Both (1) and (2) can be actuating elements.

FIG. 26 shows schematically a principle of a valve, regulator or an injector that is consisted of a bar and a coaxially placed tube around the bar. The fluid passes between the circular slit between the bar and the tube. The flow is controlled by changing the diameter of the tube, that is made from MSM material, by an external magnetic field. An alternative method is to expand by magnetic field the diameter of the bar made from MSM material. The parts may also be conical instead of cylindrical ones.

Figure 27:
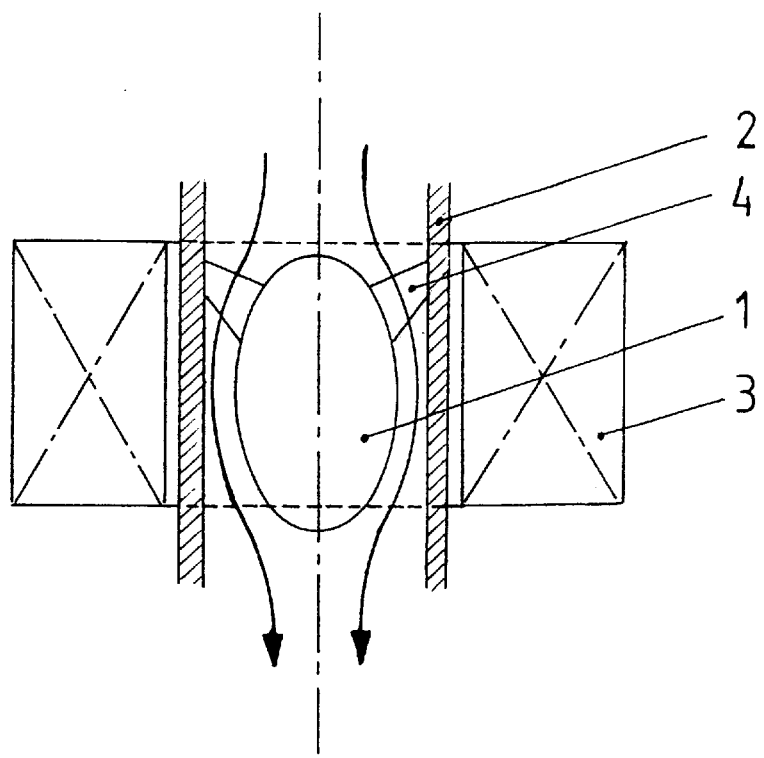
FIG. 27 shows a fluid regulator whose driving magnetic filed is outside the flow channel: (1) is a body whose shape changes in applied magnetic field, (2) is a flow channel, (3) is a magnetic field source (coil) and (4) is the spacer of body (1).

In some biomedical and process applications where it is important that the flow in a tube could be regulated precisely without any joints or leads of the mechanical parts or electrical wires through the flow channel. FIG. 27 shows the principle of a contactless regulator. An appropriately shaped actuating element made from MSM material is installed inside the flow channel that is preferably made of non-magnetic material. The magnetic field source that is placed outside the flow channel, e.g., a coil placed around the flow channel, controls the shape of the actuating element inside the tube, thus regulating and even closing the flow of the fluid. The desired magnetic field-induced shape change of the actuating element in this example is such that its diameter expands. The actuating element may be solid, hollow or it may be consist also other parts that are not made from MSM material. Also motion magnification mechanics can be used. The element may also be a composite material that includes MSM wires, sheets or MSM materials in other shapes. The cross section of the flow channel may be circular as shown in FIG. 27, oval, rectangular, or any shape suitable for the selected application.

Figures 28A, 28B, 28C:
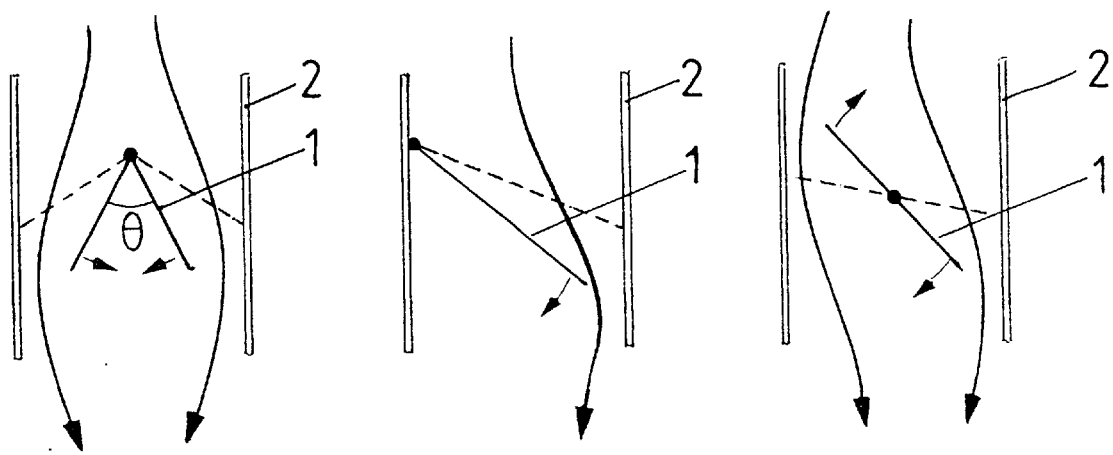
FIGS. 28 (a, b, and c) show examples of flap regulators.

Three examples of flap regulators are shown in FIG. 28. In one of them the flow channel is opened and closed by two flaps that are in V shape positions to each other (FIG. 28a). The V angle is changed by the MSM actuator or actuating element that develops a torsion deformation in the applied magnetic field. The two flaps are fixed at each end of the MSM actuating element. An alternative method is to make a hinge between the flaps from an MSM material that bends in the magnetic field (FIG. 28b). The flap may also be made from one plate that is turned inside the flow channel (FIG. 28c). The turning may be arranged by an MSM torsion actuator or actuating element, one end of the actuating element now being fixed to the flap and the other end being fixed to the flow channel. The bending MSM actuating element can also be used as well as mechanical arrangements for motion magnification.

Appropriate configurations of the magnetic field directions in relation to the strains and forces of the actuating elements and different actuator examples shown in this application can be used in valves, regulators and injectors. Flow regulators, valves and injectors may also be micromechanical. They can be processed as thin films that may be placed on a silicon substrate.

EXAMPLE 9

Pumps

Figure 29:
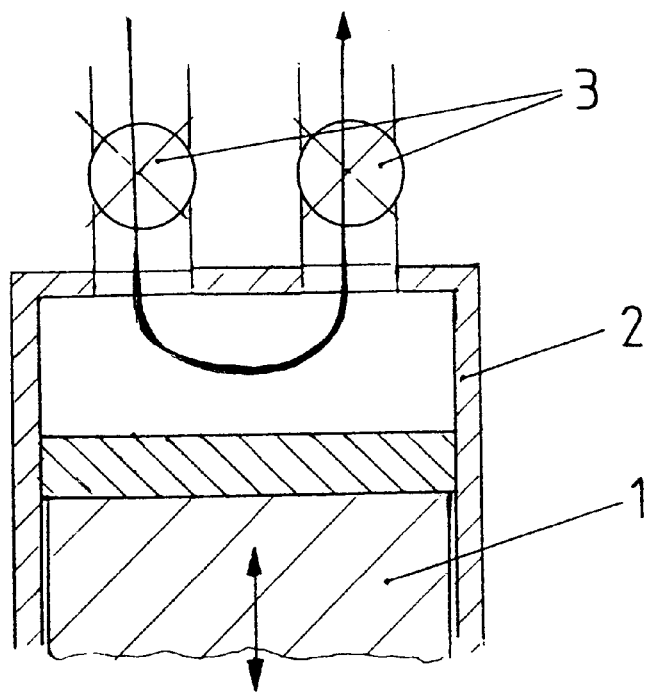
FIG. 29 shows an example of a piston type pump.

The principle of the MSM pumps is that the magnetic-field-induced shape changes of an MSM actuating element changes the volume of a chamber, which is used to pump fluid, usually a liquid. FIG. 29 shows a piston type MSM pump. The motion of the piston 1 is generated by extensive shape change of the MSM actuating element. The magnetic field sources can be installed coaxially outside the chamber 2. As the suck and exhaust valves can be used suitable valves shown in the previous Example 8.

Figure 30:
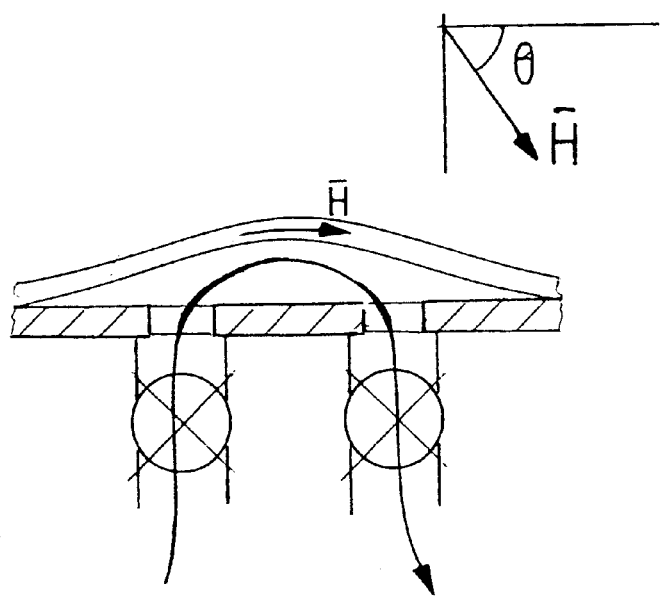
FIG. 30 shows a pump based on the shape change of the MSM foil.
Figure 31:
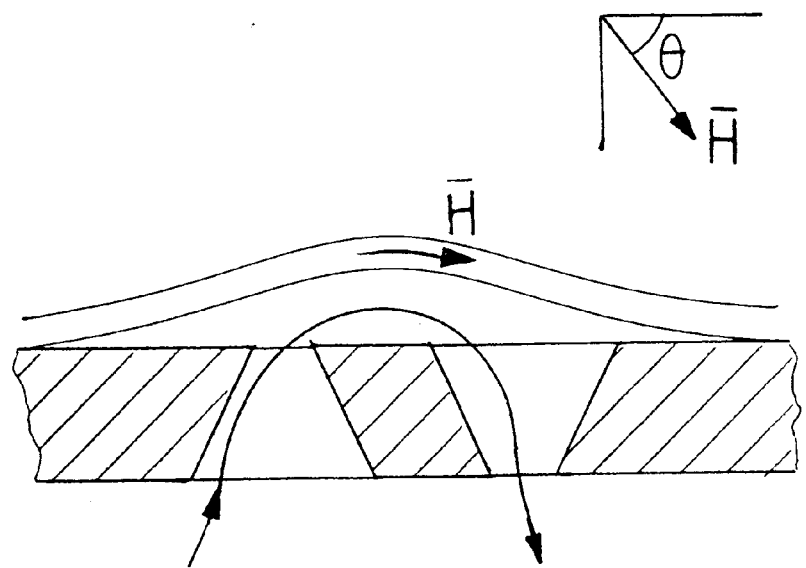
FIG. 31 shows an example of a passive pump.

A pump construction that is suitable for micromechanical applications for pumping, e.g., chemicals and drugs or taking samples for analysis, is shown in FIG. 30. A curved MSM foil is attached on a substrate, e.g., silicon. The two holes made through the substrate lead to the cavity between the curved MSM foil and the substrate. The shapes of the holes are shaped in such a way that the friction of the flow is different for the flows inside and outside directions (FIG. 31). One such shape is a cone. When the volume of the cavity is changed, by changing the shape of the MSM foil by the magnetic field that passes in the foil or by the magnetic field source that is outside the pump, the fluid starts to flow through the holes in the direction of the smaller friction.

Figure 32:
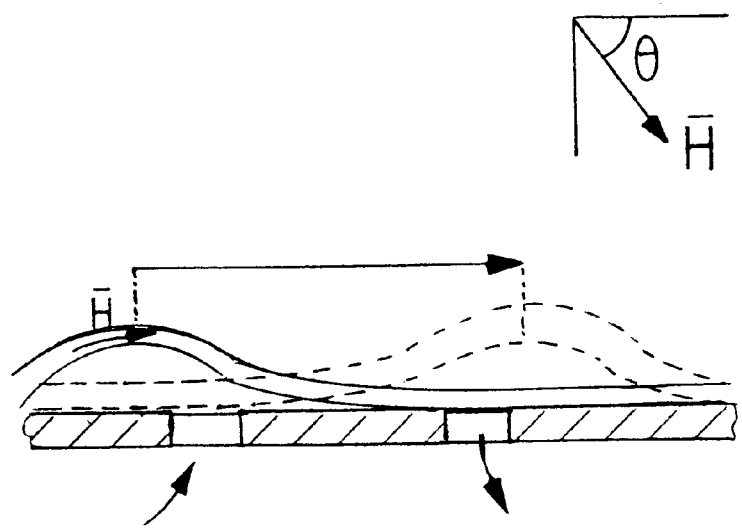
FIG. 32 shows a pump in which the wave of the MSM foil is responsible for transferring fluid.

A wave-shaped MSM actuating element that is restricted by a substrate can also be used for pumping. A volume between the wave and the substrate moves from one end of the pumping device when the magnetic field is applied on the actuating element foil from outside the pump or conducted in the foil. The principle is illustrated in FIG. 32.

In many biomedical and process applications it is beneficial that the pump can be installed in the process or biological surroundings, such as a human body, and the power that drives the pump is supplied remotely.

EXAMPLE 10

Couplers

The following division into groups may be used. MSM actuating elements are used to couple together two or more bodies or machine parts. If body 1 is coupled to another body 2 that moves or rotates, and if body 1 starts moving with the other body 2 as one piece or with a slower speed, in the case that the coupling is determined to slide, it is a question of a coupler. If the purpose of coupling of body 1 to body 2 is to decrease the speed of body 2 or stop it, and if the body 1 is fixed, it is a question of a break. When the purpose of coupling, independent of the motion of the bodies 1 and 2, is to fix bodies together, it is a question of a connector or a fastener. Between bodies 1 and 2 there may be some material to increase friction. MSM actuators are very effective in coupling apparatus, because they provide high forces, large magnetic-field-induced strains and a fast response. Also a stress between the parts to be coupled can be controlled very precisely. This makes, for instance, MSM breaks feasible for automatic breaks systems as well as many other coupling applications.

For all those cases, similar constructions can be applied. Although the following cases described in Example 10 and shown in FIGS. 33 to 40 are called couplers, they mean breaks and connectors and fasteners at the same time.

Figure 33:
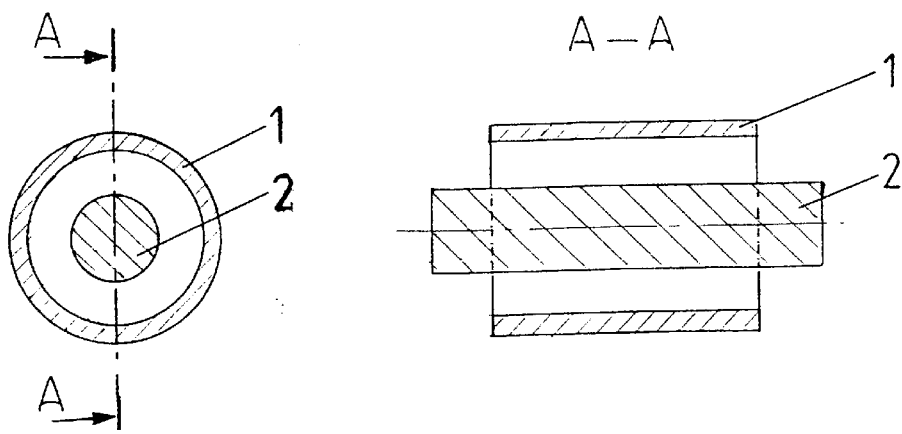
FIG. 33 shows a coupler. (1) is a sleeve/tube that contracts against bar (2) or expands outwards from it in applied magnetic field. Alternatively the axis can expand or contract in the magnetic field.
Figures 34A, 34B:
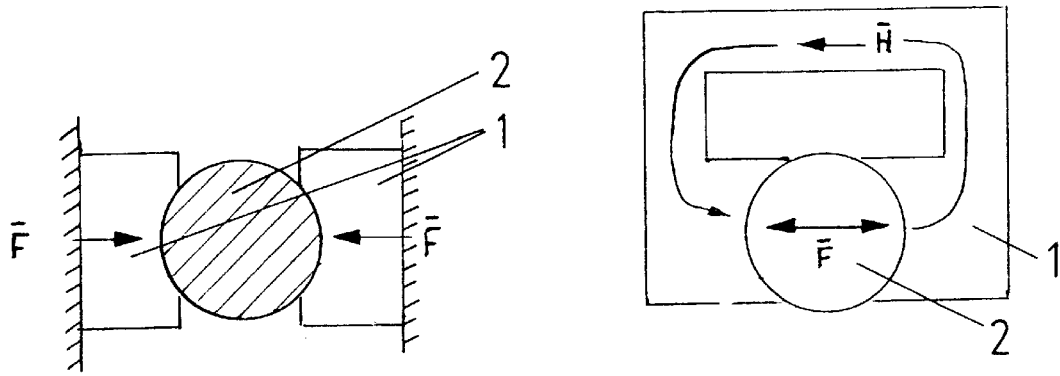
FIG. 34(a) shows a coupler in which the bar (2) is coupled by the actuating elements (1) that pushes against the bar in an applied magnetic field.
FIG. 34(b) shows a coupler in which the bar (2) is made from MSM material whose diameter increases in applied magnetic field of the magnetic field source (1).
Figure 35:
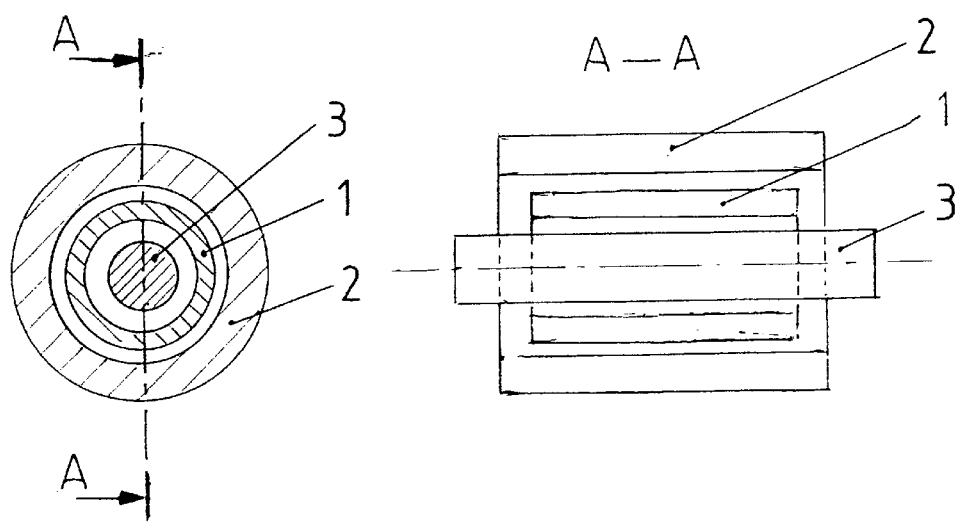
FIG. 35 shows a coupler in which the coupling is based on the magnetic-field-induced shape change of the ring or sleeve (1) installed between two machine elements (2) and (3).

FIG. 33 shows schematically a principle of a coupler that is consisted of a circular axis 2 and a tube 1 coaxially installed around the axis. The axis may move along the tube in the axial direction or it may rotate inside the tube in relation to the tube. The coupling occurs when the diameter of the tube is decreased because of the magnetic-field-induced shape change of the tube that is made from an MSM material. The outside shape of the tube does not need to be round. The axis may also be coupled by two or more parts that press against the axis (FIG. 34). The pressing devices can be MSM actuators based on extensive shape change of the actuating elements (FIG. 34a). Alternative method for coupling axis 2 in a circular hole is making the axis itself from an MSM material (FIG. 34b). In the applied magnetic field led along the axis, or transversally across the axis, diameter of the axis is locally increased thus coupling the axis against the hole. The coupling body can also be a ring between two coaxial circular surfaces, as shown in FIG. 35. The coupling is based on the magnetic field-induced shape change of the ring made from an MSM material.

Figure 36:
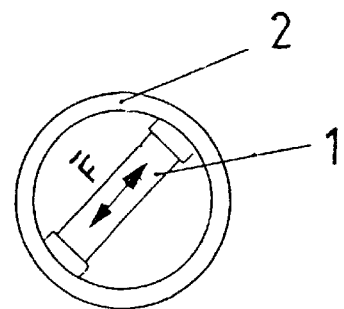
FIG. 36 shows a coupler in which an actuating element (1) being inside the machine element expands in the magnetic field.

FIG. 36 shows a principle of the coupler in which the coupling part 1 is installed inside the rotating circular body 2. Extensive shape change of the actuating element couples body 1 to body 2. This construction is especially useful in brakes.

Figure 37:
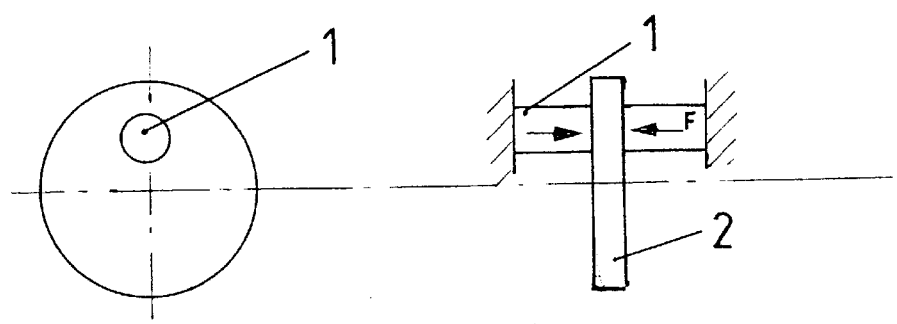
FIG. 37 shows a coupler in which disc (2) is pressed by two or more actuating elements (1) from both sides or only from one side if the other side is supported or if the disc is rigid enough.
Figure 38:
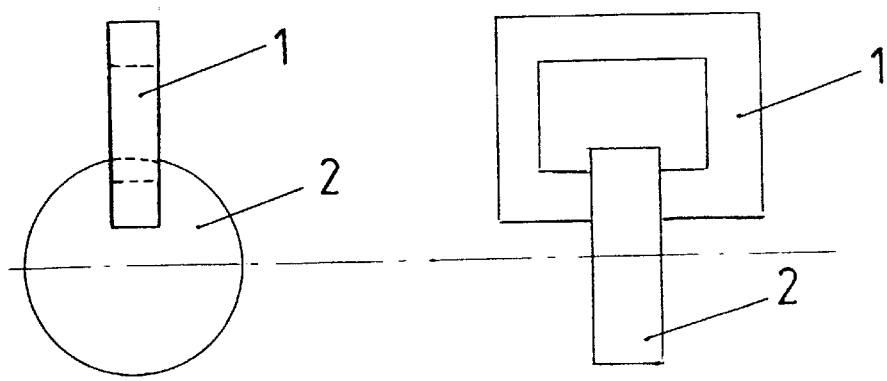
FIG. 38 shows a coupler whose operation is based on the change of the thickness of the disc (2) made from MSM material in applied magnetic field that is induced by the magnetic field source, e.g., an electromagnet (1). The disc presses against the magnetic field source.

MSM actuating elements 1 can be coupled to a rotating disc 2 on both sides, or from one side only, if the other side is supported. This principle is illustrated in FIG. 37. This is also a useful construction, e.g., in brakes. Alternatively, the disc might be made an MSM material whose thickness increases in the applied magnetic field. This case is illustrated in FIG. 38. Body A represents now a magnetic field source, such as an electromagnet.

Figure 39:
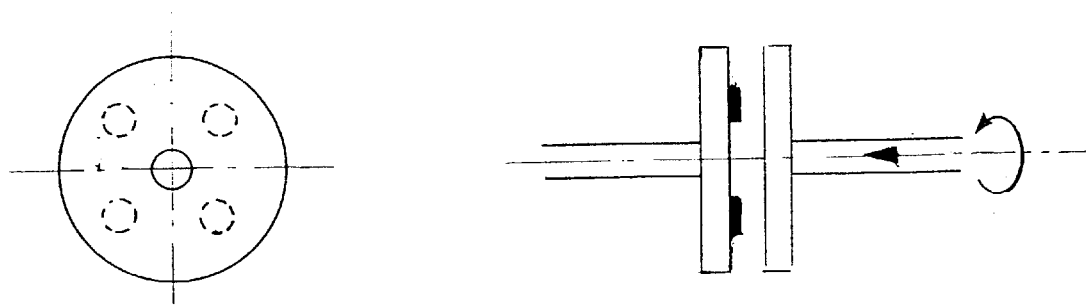
FIG. 39 shows a coupler in which two coaxially placed discs couple against each other in when the actuator is pressed in the direction of the axis of the discs.
Figure 40:
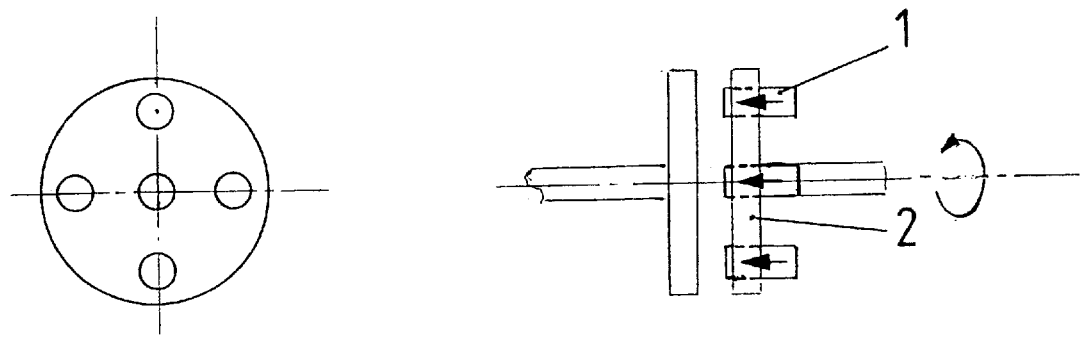
FIG. 40 shows a coupler in which two or more actuators placed in appropriate positions in one of the discs push against the other disc.

FIG. 39 shows a principle of a coupler in which two coaxially installed round discs may rotate independently when they are separate and they are coupled together when the discs are pushed against each other. The motion of one of the disc in the axial direction can be performed using MSM actuators whose actuating elements extend in the applied magnetic field. The actuator may push the whole disc against the other, or alternatively several actuators can be installed parallel with the axial direction in one disc, as shown in FIG. 40.

EXAMPLE 11

Linear motors

Figure 41:
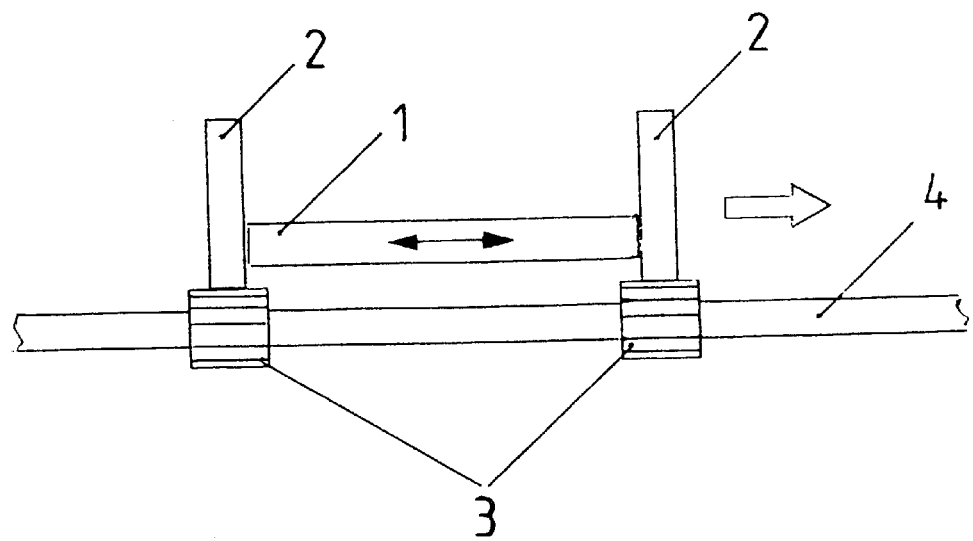
FIG. 41 shows a principle of a linear motor: (1) is the main actuator, (2) is the auxiliary actuator, (3) is a clamp/coupler and (4) is the guide bar.

Motion of the linear motor is composed of successive steps produced by the actuator described above, and called main actuator in the following. Two auxiliary actuators are fixed at both ends of the main actuator. The auxiliary actuators clamp by turns on a guide, along which the main actuator travels, synchronously to the back and forth motion of the main actuator. One step of the linear motion on a guide is generated, when the auxiliary actuator in one end is clamped (and the auxiliary actuator in the other end is not clamped) during, e.g., the extension phase of the main actuator, and the auxiliary actuator in the other end is clamped during the reverse motion of the main actuator. The principle of the linear motor is shown in FIG. 41. The speed of the linear motion can be controlled by the frequency or amplitude of the main actuator, and the direction of the linear motion is reversed by reversing the phase of the clamping of the auxiliary actuators.

Figure 42:
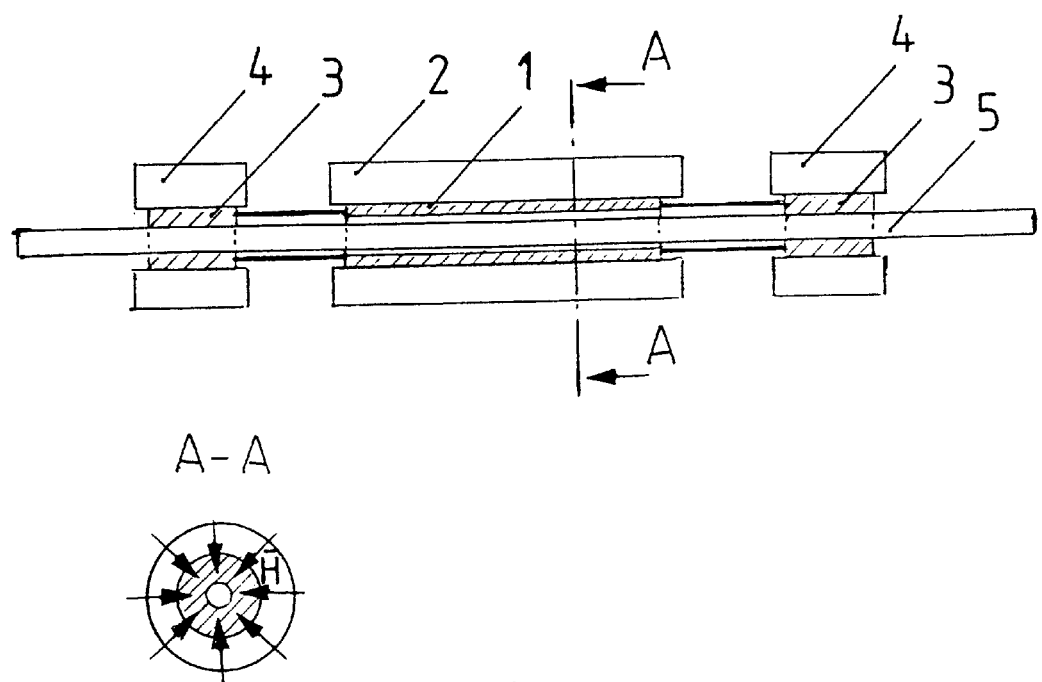
FIG. 42 shows a linear motor that travels along a guide bar: (1) is actuating element of the main actuator, (2) is the magnetic field source, e.g., an electromagnet that drives (1), (3) is the auxiliary actuating element that clamps/couplers on the guide (5), (4) is the electromagnet that drives (3), and (5) is the guide along which the linear motor travels.

There are different variations of the basic geometry of the linear motors, e.g.,: 1. the auxiliary actuators may clamp on one guide bar, the main actuator being beside the guide bar; 2. the auxiliary actuators clamp on two parallel guide bars, the main actuator being placed symmetrically between the bars; 3. the auxiliary actuators clamp on inside a tube, the whole linear motor being inside the tube; 4. the guide bar passes through the hole made in the actuating element of the main actuator. The auxiliary actuators clamp on the same guide bar (FIG. 42).

The direction of the magnetic field in relation to the loading direction of the actuators can be vary from 0 to 90 degrees. The back and forth motion of the main actuator is advantageous to occur at a frequency that is the mechanical resonance of the longitudinal vibration modes of the actuating element (i.e., in the direction of the linear motion of the linear motor) of the main actuator, or the frequency that is the mechanical resonance of those actuators, or that of the whole structure of the linear motor. The electromagnets and the electromagnetic driving system driving the main and auxiliary actuators can be designed in such a way that those electromagnets operate in an electromagnetic resonance at the same frequency as the mechanical resonance of the main and auxiliary actuators are driving the linear motor, and digitally controlled in such a way that the timing of the clamping is optimized to obtain maximal precision, speed and force of the motion of the motor.

EXAMPLE 12

Magnetic-field-induced strains of several percent at high frequencies expected to be obtained in MSM materials may result in speeds as high as even some meters/second. In linear motors the back-and-forth motion of the actuators is directed in one direction using specific electromechanical arrangements. As discussed above, such linear motors are typically consisted of three actuators, one of which is the main actuator responsible for the motion of the linear motor and two auxiliary actuators that clamp by turns in the rear and front ends of the main actuator synchronously to the frequency of the main actuator on a guide along which the linear motor travels. FIG. 41 shows an example of such a linear motor. A demonstration linear motor based on actuators in which the strokes were generated by magnetostrictive Terfenol-D material was tested at different frequencies between 10 to 200 Hz. The step of the main actuator was 0.05 to 0.1 mm. A rather slow linear motion was obtained, but the experiment demonstrated that the principle of the linear motor works also if the actuating element is made from an MSM material instead of the magnetostrictive material. It also appeared that the speed was largest at the frequency that corresponded to the mechanical resonance of the system.

EXAMPLE 13

Rotational Motors

A rotation of the rotational motor is composed of successive steps produced by a torsional (angular) motion of a main actuator described above, called main actuators in the following. Two auxiliary actuators are fixed at both ends of the main actuator. The auxiliary actuators clamp by turns on a guide, around which the main actuator rotates, synchronous to the back and forth torsional motion of the main actuator. One step of the rotational motion of the motor around a guide is generated, when the auxiliary actuator in one end is clamped (and the auxiliary actuator in the other end is not clamped) during the step of the torsional motion of the main actuator in one direction, and the auxiliary actuator in the other end is clamped during the reverse motion of the main actuator. The speed of the angular motion is controlled by changing the frequency or the amplitude of the main actuator, and the direction of the angular motion is reversed by reversing the phase of the clamping of the auxiliary actuators.

A great variety of different motor constructions based on MSM actuators are possible. In some of them the step of the angular motion is generated by one or several main actuators that are placed tangentially on a circle centered around the rotational axis and produce a back and forth extensive motion.

The back and forth torsional motion of the main actuator is advantageous to occurs at a frequency that is the mechanical resonance of torsional vibration mode of the axis of the main actuator, or the mechanical resonance of the main and auxiliary actuator, or the whole structure of the vibrating parts of the motor. The electromagnets and the electromagnetic driving system of the electromagnets driving the main and auxiliary actuators may be designed in such a way that those electromagnets operate in an electromagnetic resonance at the same frequency as the mechanical resonance of the main and auxiliary actuators drive the motor. The guide bar of the motor described above can be the rotating axis of the motor.

Figure 43:
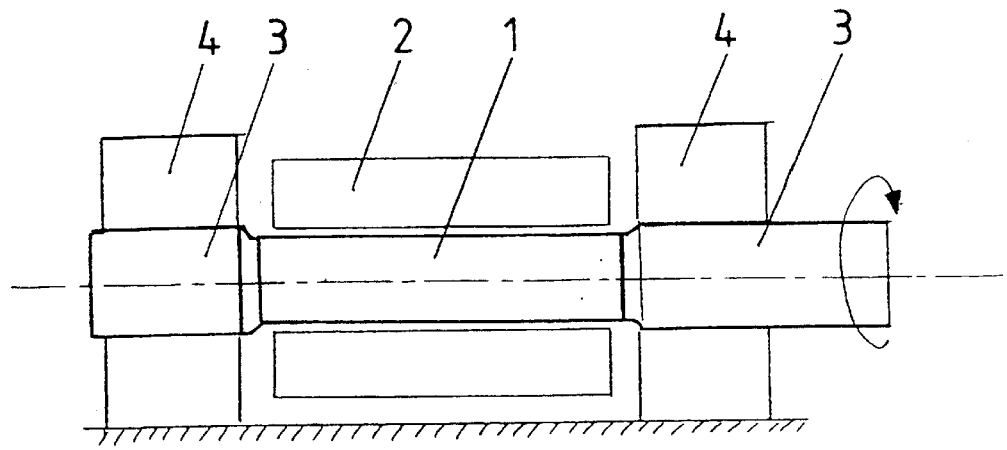
FIG. 43 presents the principle of the rotational motor: (1) is the actuating element of the main actuator that is deformed by twisting in the applied magnetic field, (2) is the magnetic field source, e.g., an electromagnet that drives (1), and (3) is the actuating element that expands radially in the applied field, and (4) is the electromagnet that drives (3).

The construction of the motor can be such that the rotational motion is generated by successive steps produced by torsional (twisting) shape change of one part of the axis of the motor controlled by a magnetic field. The twisting part of the axis is then the main actuator. Two auxiliary actuators are fixed at both ends of the main actuator (see FIG. 43).

Figure 44:
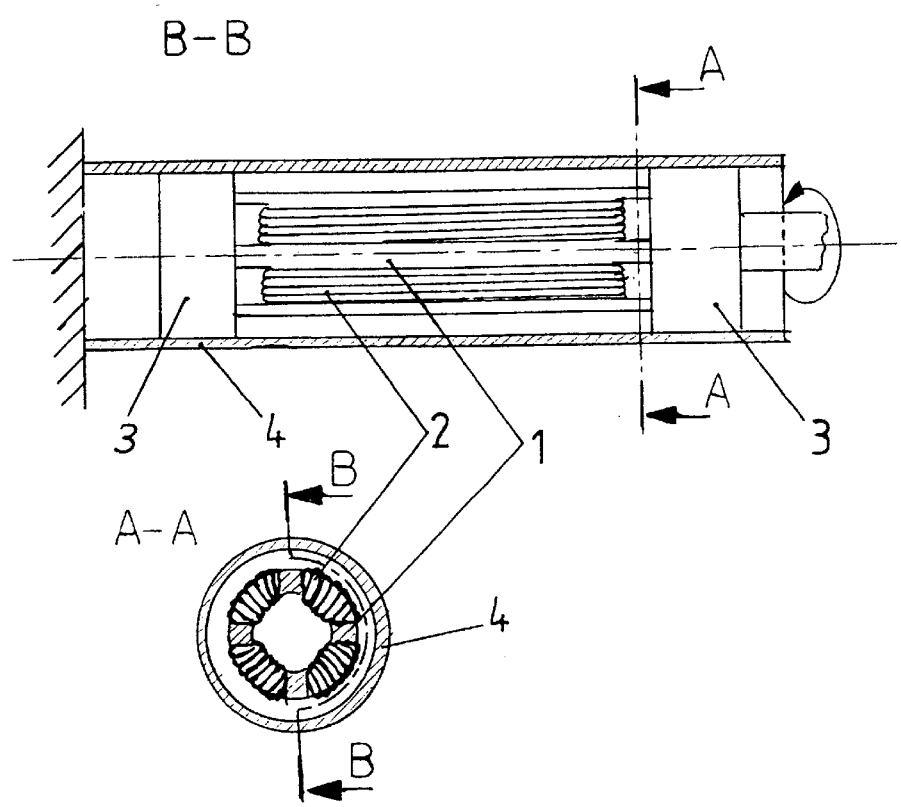
FIG. 44 shows a principle of the motor: (1) is an actuating element that develops torsional deformation (twisting) when the magnetic field induced by the coil(s) (2) is applied, (3) are clamps/couplers and (4) is the tube in which the motor rotates. The motor can also produce linear motion in the tube if the actuating element also elongates/contracts in the magnetic field induced by additional coils wound in another direction.
Figure 45:
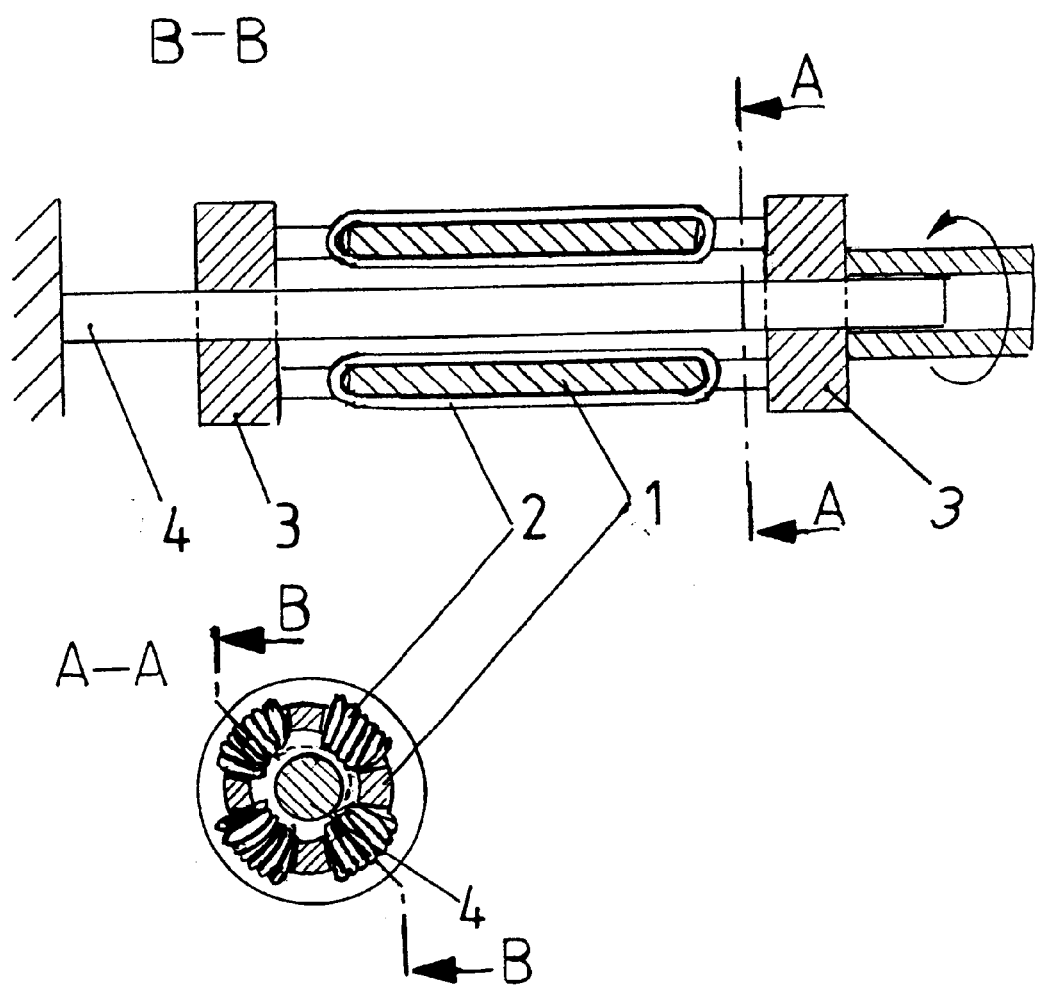
FIG. 45 shows a principle of the motor similar to shown in FIG. 44, except that the motor rotates around a bar (4).

Torsional motion of the main actuator of the motor can be produced, e.g., with the hollow bar or tube in which the magnetic field source is placed in such a way that the magnetic field induced by it circulates around the tube. An example of such a magnetic field source is a coil is wound toroidically in the tube. The corresponding actuating element was described above and shown in FIG. 8. FIGS. 44 and 45 show two illustrations on the motors. In FIG. 44 the actuator that produces a torsional shape change operates inside a tube and in FIG. 45 it operates around a bar.

The magnetic field sources can be placed in such a way that the magnetic field(s) induced by them develop a desired shape changes in the torsion actuator and also in the auxiliary clamping actuators. The auxiliary actuators may clamp, e.g., on the cylindrical or polygonal (number of faces corresponding to the twisting angle of the main actuator) bars fixed at both ends of the twisting component of the main actuator. The cylindrical or polygonal bars are expanded radially in a magnetic field. The motor that combines linear motion and rotational motion can also be made, e.g., by modifying the torsion actuator in such a way that it can also expand in the axial direction of the actuating element, or by installing two separate main actuators one of which is responsible for the torsional motion and the other is responsible for the extensive motion along a bar or a tube. This type of combined motors exhibit a great potential, e.g., in robotic arms, manipulators and in machine automation.

Advantage of the rotational motors according to the invention is their high speed, large torque in all ranges of speed, high acceleration and precise angular positioning. For instance, if the torsional step is assumed to be 3.6 degrees and frequency 1000 Hz, the motor rotates 10 turns/second.

Linear, rotational and combined motors can also be made micromechanical. Silicon is one useful support material for the micromechanical motors, because silicon exhibit high elastic constant and good mechanical properties and it can be to etched and micromachined in small tolerances. A great number of devices can also be made in the same chip.

EXAMPLE 14

Positioning Devices

MSM actuators, linear motors, rotational motors and combined motors are suitable for positioning apparatus, because MSM actuators provide precise, large and a fast motion. The positioning devices may be composed of one or more of the MSM actuators and motors together to obtain a desired function. Positioning devices can provide one, two or three dimensional motion. An example of three dimensional positioning devices is a setup that is consisted of three linear motors installed perpendicular to each other. This kind of apparatus is expected to be suitable, e.g., in electronics engineering to test, assemble and manufacture microcircuits and electronic boards. MSM shape change can also be bending, twisting or other modes. Robot arms and manipulators operating also inside a process or in living organisms distant from the magnetic field source are examples of the positioning devices. Manipulators and other instruments for microsurgery are examples of biomedical applications.

EXAMPLE 15

Vibration devices

Construction

An apparatus which produces vibration is constructed of one or more MSM actuating elements, and one or more variable magnetic field sources, which can be integrated in the apparatus. The magnetic field source/sources can be outside the apparatus, but it must produce a magnetic field to the actuating element to cause the desired MSM shape change. The magnetic field can be applied to the actuating element or elements by magnetic circuit, which can consist of one or more passive components (e.g, permanent magnets, permanent magnet particles, magnetoresistive components, flux path, core material) and/or active components (magnetic coil, current conductor, laminated current conductor and isolation structure, or other magnetic field generating apparatus). The magnetic field can be applied also from outside the vibration device. The motion to be produced depends on the properties of the actuating element and the magnitude and the direction of the magnetic field. Efficiency of the apparatus can be increased or controlled by a bias magnetic field (e.g., generated by permanent magnets or bias current) or by pre-stressing the actuating element (e.g., by springs, hydraulic or pneumatic pressure, mass, mechanical gears, levers). The temperature of the MSM-element can be controlled by a heating or cooling system, if necessary. For example, in aero- or space applications temperatures of the environment can vary in a wide range, and a temperature control system is usually necessary, so that the twin boundary mobility, mechanical- and magnetic properties of the MSM element would be favourable.

Applications

Figure 46:
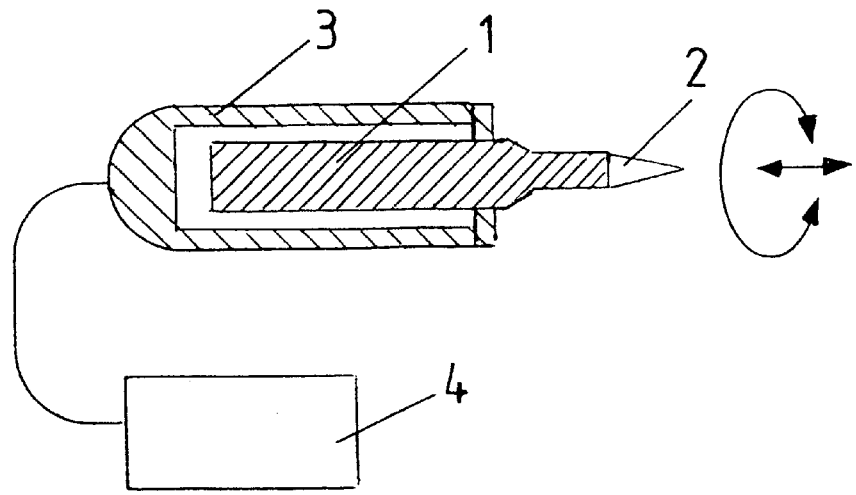
FIG. 46 represents a vibration device for caving: (1) is an MSM element, (2) is a blade, (3) is a coil and (4) is a power supply.

An apparatus which is constructed in the way described above can be used for mechanical working of a material. The active MSM-element of the apparatus can be shaped as a tool, or the MSM actuating element can move a tool or a blade for crushing, cutting, boring, chiselling, punching, perforating, grinding, carving, separating or deforming a material. Efficiency of the apparatus can be increased by setting the MSM actuating element or blade to vibrate at a specific frequency (resonance) of the actuation element, blade or the whole actuator system. An example of a carving tool is shown in FIG. 46. The active element can produce mechanical motion or vibration of an intermedia such as fluid, gas or powder, which applies mechanical energy to a desired target, as in ultrasonic washers. The frequency and the amplitude of the actuating element (and thus the produced motion) can be controlled to produce a desired effect in the target material, as when separating particles from liquid solutions, braking molecules or cleaning parts or filters. The active element can produce mechanical vibration of the intermedia by vibrating a surface which is exposed to the intermedia. This surface can be, e.g., a plate in the intermedia or a wall or a base of a container, and vibration can be utilized in washing parts by ultrasonic washing or cause cavitation on a surface. The vibrator can also be used to remove bubbles from low-viscosity liquids or high-viscosity liquids (such as concrete before drying, melted materials, polymers or adhesives).

An apparatus which produces vibration and the construction of which is described above can be used to produce waves in intermedia, as in loudspeakers (in air or other intermedia), sonar devices or underwater communication. The vibration can be produced by moving a plate, cone or other surface by the apparatus. The surface can be supported by elastic springs, rubber or elastic polymer and moved back and forth by the apparatus. The apparatus can be used also for communication, such as for hearing aid devices, if the vibration is applied to bone of the patient. Communication through structures such as walls or beams can be performed by applying vibration to the structure by the apparatus. The inverse MSM effect can be used in detecting vibrations in a solid, liquid or gaseous intermedia.

Another applications of vibration devices are mechanical motors, conveyors and manipulators. The MSM actuating element can generate vibration in solid state motors. These motors can be used to produce controlled mechanical motion in rotary motors (e.g. in autofocus camera lenses), positioning devices or linear motors. The desired motion is produced by a solid state vibration of one or more of the motor parts. The direction, velocity and motion increment can be controlled by the amplitude and the frequency of the actuating element. Vibration generated by the actuation elements can be used in conveyors based on mechanical surface vibration. The vibration of the surface causes movement of the matter laying on the surface. The direction and speed of the conveying motion can be controlled in a similar way as in solid state motors. Vibration devices can be used also in manipulators, in which surfaces move in relation to each other due to (solid state) mechanical vibration. Surfaces can be, e.g., spherical to form an active controllable joint. Twisting of the joint can be controlled in the similar way as the solid state motors. When the vibration is stopped, the joint can stop moving or "grip" together by the MSM effect. Solid state mechanical vibration devices can be used in manipulators, robotic applications or positioning applications.

Further, other applications are vibration apparatus that are used in generating desired counter vibrations in active vibration damping systems. Such apparatus can produce vibration precisely and rapidly at a wide frequency range: frequencies from DC to above 5 kHz have been measured, as shown above. The source of the magnetic field of the apparatus that controls the motion of the actuation element can be a coil in which the current can be regulated by a programmable control system. Signals from vibration sensors placed in the object to be dampened are used for controlling the electric current. MSM actuating elements can produce desired vibration directly, or by a motion amplifier, such as a mechanical transmission or by a fluid-flow-based motion amplifier in which the movement is amplified by increasing flow velocity by reducing the cross-sectional area of a flow channel. Actuating elements can be produce different kinds of vibration, such as linear, bending, shearing or torsional vibration. Torsional counter vibration of axes and rotating parts (active balancing or shape control) can be produced by these devices, as well as linear counter vibration. Several vibration devices can be controlled by a common control system in a more complex active vibration damping system. Vibration devices can be used in active suspension systems of equipment, structures or vehicles. These systems can include both vibration devices and linear motors described above.

Actuating element of the device can be a string, strip or wire, which is integrated in an elastic structure (such as silicone, e.g.), and causes mechanical motion of the structure. These devices can be used, e.g., in artificial organs such as an artificial heart.

Sensors and power converting devices

Figure 47:
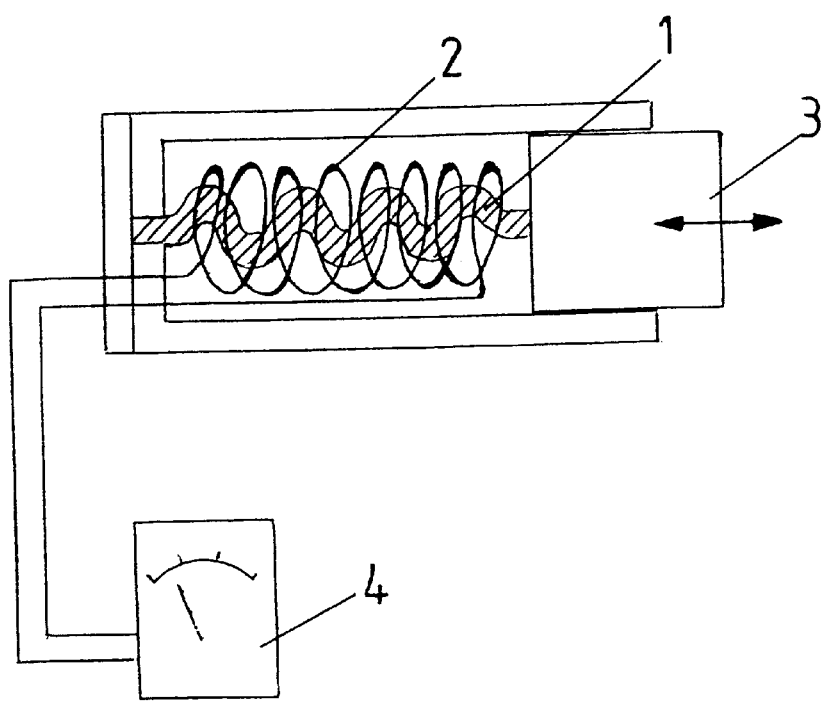
FIG. 47 shows an example of a force sensor: (1) is an elastic MSM element, (2) is a pick-up coil, (3) is a moving sensor head and (4) is the measuring instrument.

When an MSM active element is deformed by an external force, the magnetic field around the element changes, as discussed above. The magnetic field change can be used to generate a voltage by a coil, or the element can cause a change of a magnetic flux in a magnetic circuit. A sensor can thus be constructed to detect force or mechanical motion. When a mass is connected to the active element, an acceleration sensor can be constructed. The acceleration of the mass causes mechanical force to the active element, which causes a magnetic field change that can be detected. The element can also be installed with a spring to detect the deflection of the spring and, thus, the force can be measured by a similar method (FIG. 47). The active element itself can also act as a spring if the mechanical properties of the element are suitable.

Other applications of MSM actuators, linear motors, rotational motors and combined motors can be used in the following applications:

MSM actuators, linear motors, rotational motors and combined motors can be used in robots and manipulators to produce fast and precise motion that can be actively controlled using information obtained by displacement or acceleration sensors. They can also control, e.g., flaps of the wings in aircraft and other objects in which hydraulic control is used presently, or they can even change the shape of the wings or turn the rotor blades in helicopters. Blades of the fans, turbines and propellers may also be turned or their shape may be changed to minimize turbulence and to improve their performance. Weapon systems is a large field of applications for MSM apparatus. Weapons can be directed fast and precisely using a feed back control based on information obtained from sensors. Linear motors are applicable in elevators and lifters. By moving the gravity center of a rotating machine element (e.g., in turbines, motors, engines and rolls) the machine element can be balanced actively in its operation. Valve lifters of engines based on the MSM actuators can also be made. They are faster than the mechanical lifters used presently, and their motion control is significantly more flexible than that of the mechanical lifters. The valve control can use the information obtained from the sensors that monitor temperature and pressure of the burning chamber as well as exhaust gases, which increases the performance of the engine.

PRODUCTION OF MSM ACTUATING ELEMENTS

MSM actuators may consist of an active element, a magnetic field source, a body structure and optionally also a pre-stressing device. These parts may be separate components or they may be integrated together. Also, the whole machine from which an MSM apparatus is one part (e.g., relay, valve, force-sensor, etc.) may be an integrated structure.

The machine to be produced can be modeled, e.g., using a 3-D-CAD model. MSM active elements, actuators and devices can be produced by casting, powder metallurgical methods, cold- and hot working, machining, extrusion or form welding. MSM-properties can be enhanced ("trained"), or altered by working and affecting the twin structure of the material.

Casting is a suitable production method especially when producing large quantities. Following methods can be used: Non-reusable mold methods are sand casting, precision casting, vacuum casting shaw- and unicast method. Reusable mold methods are chill cast, low pressure casting, hot chamber casting, cold chamber casting, rotating mold, continuous casting. The method is selected depending on the alloy, the produced amount and type of production (unique, serial or mass production).

In precision casting method, the molds are usually made using wax models. The model is dipped several times in the ceramic mold material solution, dried, and then the wax is removed. The mold is hardened by annealing. The material is cast in a pre-heated mold in such a way that the solidification is slower and casting of thin structures is possible. Complex actuating elements, actuators and devices with high surface quality and dimensional precision can be produced by this method.

Instead of wax, the model can be made of polystyrol, by expanding the polystyrol with high-pressure gas in a metal mold. The metal mold can be machined. In this method a ceramic mold is produced on the model, as in precision casting. The model can be manufactured of fine ceramic material also by a reusable model.

The mold shell can be supported with sand in which an under pressure is applied when casting. The under pressure causes suction through the porous mold material and thus enhances the penetration of the molten material to narrow parts of the mold. Under pressure enables casting of thin and complex parts.

The molten material can be sucked into a mold made, e.g., in quartz or metallic tube. 3 mm diameter rods, which were 30 to 50 mm in length, were produced of the MSM alloys $Ni_2MnGa$ and Fe-29.5Pd by sucking the melted metal from a $Al_2O_3$ cup of an induction furnace by under pressure.

In rotation casting the mold is rotated, which enhances the penetration of the melt into narrow parts of the mold. The mold is usually shaped so, that the casting channel is near the axis of rotation. Manufacturing of Fe-29.5Pd MSM material was tested by rotation casting. The metal was melted by induction furnace in a $Al_2O_3$ cup prior to casting.

MSM active elements, actuators and devices can be produced also by casting in a reusable mold, which may be manufactured of metal, ceramic or graphite. $Ni_2MnGa$ alloy was cast in a cooled metal mold. MSM actuating elements of various shapes were machined of the cast specimens by a diamond saw and spark machining.

Textured structures exhibit better MSM response than materials whose grains are randomly oriented. Oriented grains and single crystals can be grown by directional solidification methods, such as Bridgeman method or liquid cooling method in which the melt is cooled in a liquid metal bath. Texture can also be made by mechanical deformation of the material, e.g., by rolling or by critical straining. An alloy Fe-30N10Co-4Ti alloy was hot rolled at about 1100° C. ten times, total reduction being about 100% and further ten times at about 600° C., total reduction at this temperature being over 100%. The austenitic structure was clearly textured. Strain measurement performed in the magnetic field in the rolling direction revealed a magnetic-field-induced strain that was about 100% larger than the strain measured on the sample whose grains were randomly oriented. This experiment confirms that the deformation is a suitable method to obtain larger MSM strains.

What is claimed is:

1. An apparatus comprising an active element made from a material having variants separated by a twin boundary, the active element having a shape, the material having both an energy needed to reorient the variants and a magnetocrystalline anisotropy energy, the magnetocrystalline anisotropy energy being sufficient with respect to the energy needed to reorient the variants to change the shape of the active element in response to a predetermined vector force of an external magnetic field, wherein the shape of the active element is coupled to the external magnetic field.

2. An apparatus according to claim 1, further comprising one or more devices adapted for assisting with reorientating the twin variants and reduce the magnitude of the external magnetic field, wherein the devices are selected from the group consisting of devices that produce bias magnetic fields, devices that produce mechanical preload, devices that produce magnetic flux paths, and devices that guide the magnetic field to the active element.

3. An apparatus according to claim 1, wherein mechanical loading of the active elements reorients the variants and produce a measurable change in the vector force of the external magnetic field.

4. An apparatus according to claim 3, further comprising a device adapted for determining the shape of the active element by the change in the vector force of the external magnetic field.

5. An apparatus according to claim 4, wherein the active element is at least a part of a device selected from the group comprising a positioning device, a keyboard, and a joystick.

6. An apparatus according to claim 4, further comprising at least one magnetic field sensor the adapted for determining the change in the vector force of the external magnetic field.

7. An apparatus according to claim 4, wherein the apparatus is a micromechanical device and the material of the active element is a thin film.

8. An apparatus according to claim 7, wherein the thin film is located on a substrate.

9. An apparatus according to claim 3, further comprising a magnetic-to-electric conversion device adapted for converting the measurable chance in the vector force of the external magnetic field to electric current.

10. An apparatus according to claim 9, wherein the magneticto-electric conversion device is a coil connected to an electric circuit.

11. An apparatus according to claim 10, further comprising a device that converts electric power generated by the electric current to other forms of energy.

12. An apparatus according to claim 3, further comprising a sensor adapted for detecting the measurable change in the vector force of the external magnetic field to enable the apparatus to monitor forces, acceleration and vibrations.

13. An apparatus according to claim 12, wherein the apparatus generates electric power from the monitored mechanical vibrations.

14. An apparatus according to claim 3, wherein the actuating element and flux paths are composed of thin sheets attached together with an electrically insulating layer to decrease eddy current losses of the material caused by an alternating magnetic field.

15. An apparatus according to claim 3, wherein the active element are placed in a matrix made from metallic, ceramic or polymeric material to form a composite structure.

16. An apparatus according to claim 1, further comprising an actuating element that includes the active element, wherein the predetermined vector force of the external magnetic field changes the shape of the active element to produce force and motion.

17. An apparatus according to claim 14, wherein the shape changes induced by the applied magnetic field are due to causes selected from the group consisting of: (1) changes of twin variant proportions in different orientations by inducing a shear strain whose shear plane is substantially parallel to the twin boundary when the vector force of the external magnetic field energy is sufficiently high; and (2) changes of the martensite/twin variant proportions in different orientations when the magnetocrystalline anisotropy energy of the material of the actuating element is sufficiently high to orient growing of the relative martensite/twin variant proportion that are in the favourable orientation in relation to the vector force of the external magnetic field.

18. An apparatus according to claims 16, further comprising one or more magnetic field sources that apply magnetic fields of a suitable vector force to the actuating element, the one or more magnetic field sources including at least one bias source selected from the group that consists of: sources that produce bias magnetic fields, devices that produce mechanical pre-load, and devices that produce magnetic flux paths that guide the magnetic field to the actuating element.

19. An apparatus according to claim 18, wherein one or more of the sources that produce bias magnetic fields are static.

20. An apparatus according to claim 18, wherein the magnetic field source is placed in such a way that the magnetic field applied to the actuating element produces a shape change in the actuating element.

21. An apparatus according to claim 20, wherein at least one of the one or more magnetic field sources is placed in a way selected from the group consisting of: (1) a way that the magnetic field is substantially parallel with the longest dimension of the actuating element; (2) a way that the shape change is largest; and (3) a way that the magnetic field makes an angle of 0 to 90 degrees with the direction of the longest dimension of the actuating element.

22. An apparatus according claim 18, wherein a vector force of an applied magnetic field induced by the one or more magnetic field source in one of the following manners selected from the group consisting of: (1) the direction of the vector force changes in relation to the direction of the longest dimension of the actuating element in such a way that the absolute value of the magnetic field remains constant; (2) the direction and absolute value of the vector force change in relation to the direction of the longest direction of the actuating element; (3) the direction of the vector force rotates around an axis perpendicular to the direction of the longest dimension of the actuating element; and (4) the direction of the vector force either flips instantly or turns gradually between the direction of the longest direction of the actuating elements and the direction perpendicular or any part of that angle.

23. An apparatus according to claim 16, wherein the magnetic-field-induced shape change of the actuating element is shear.

24. An apparatus according to claim 23, wherein the external magnetic field is oriented in such a direction that a desired shear strain is obtained.

25. An apparatus according to claim 23, wherein the external magnetic field is aligned substantially parallel with a shear plane of the actuating element.

26. An apparatus according to claim 4, wherein the shear strain induced by deformation of the active element is used to generate a change of the external magnetic field.

27. An apparatus according to claim 16, wherein variants in the active element have been oriented by cooling the active element below martensite start temperature under load.

28. An apparatus according to claim 16, wherein the external magnetic field bends the actuating element.

29. An apparatus according to claim 28, wherein the actuating element has a midpoint with a tangent and the vector force of the external magnetic field is substantially parallel with the tangent.

30. An apparatus according to claim 28, wherein the vector force direction selected so that the desired bending strain is obtained.

31. An apparatus according to claim 28, wherein the actuating element has a midpoint with a tangent and the vector force of the external magnetic field makes an angle 0 to 90 degrees with the tangent in a plane determined by the tangent and the axis perpendicular to the tangent plane.

32. An apparatus according to claim 28, wherein the actuating element has a midpoint with a tangent and the vector force of the external magnetic field makes an angle 0 to 90 degrees with the axis perpendicular to the tangent plane in the midpoint of the actuating element.

33. An apparatus according to any of claim 28, wherein the magnetic field is led through the actuating element.

34. An apparatus according to claim 28, wherein the actuating element has a midpoint with a tangent and the magnetic field produces an effect selected from the group consisting of: (1) the magnetic field rotates around substantially perpendicular to the direction of the tangent in the midpoint of the actuating element or to the tangent plain in the midpoint of the actuating element and (2) the magnetic field flips instantly or turns gradually between the direction of the tangent in the midpoint of the actuating element and the direction perpendicular to it or part of that angle.

35. An apparatus according to claim 28, wherein the bent actuating element has legs and the angle between the legs is smaller than 90 degrees.

36. An apparatus according to claim 28, wherein the magnetic-field induced shape change of the actuating element is torsion.

37. An apparatus according to claim 16, wherein the actuating element is selected from a group consisting of a solid bar, a hollow bar and a circular tube.

38. An apparatus according to claim 16, wherein the actuating element is hollow and the magnetic field is led radially through a wall of the hollow actuating element.

39. An apparatus according to claim 16, wherein the magnetic field is induced by a toroidically wound coil to produce torsion deformation of the actuating element.

40. An apparatus according to claim 16, wherein the actuating element is placed in a predetermined condition selected from the group consisting of the following: (1) a bias condition wherein the actuated element is biased by a static magnetic field to obtain a desired torsional strain in the applied driving magnetic field; (2) a pre-stress condition wherein the actuated element is pre-stressed torsionally to obtain twin structure aligned optimally for producing desired torsional strains in applied magnetic field; (3) a loaded condition wherein the actuating element is loaded in such a way that twin variants are aligned so that desired strain (e.g., maximal strain) is obtained in the applied magnetic field; and (4) a martensite condition wherein the actuating element operates at a temperature above Ms (martensite start temperature) and is superelastic martensite transformed from austenite by a load.

41. An apparatus according to claim 16, wherein the shape of the actuating element due to the application of the magnetic field is at least one shape-changing force selected from the group consisting of extension, contraction, bending, twisting and shear.

42. An apparatus according to claim 41, wherein the shape of the actuating element in one part of the element is one type of shape-changing force and another type of shape-change force in other parts.

43. An apparatus according to claim 16, wherein the actuating element is improved by deformation at appropriate temperatures and magnetic fields and cycling the treatment as necessary to produce desired shape changes.

44. An apparatus according to claim 16, wherein the magnetic field rotates around an axis.

45. An apparatus according to claim 16, wherein the magnetic field is produced by a magnetic field source selected from the group of electromagnets coils, and permanent magnets.

46. An apparatus according to claim 45, wherein the actuating element and magnetic field source are connected together by magnetic flux paths.

47. An apparatus according to claim 46, wherein the actuating element is a closed loop that forms a closed flux path for the magnetic field source, and wherein the magnetic field is led to the loop by an external magnetic field whose intensity and direction are suitable to cause a desired shape change of the loop.

48. An apparatus according to claim 48, wherein the actuating element is an open loop that forms a flux path for the driving magnetic field, and wherein the magnetic field is led to the loop by an external magnetic field whose intensity and direction are suitable to cause a desired shape change of the loop.

49. An apparatus according claim 48, wherein the driving magnetic field is generated by a coil wound around one part of the ring toroidically.

50. An apparatus according to claim 48, wherein the magnetic field is led to the open loop through the ends of the loop.

51. An apparatus according to claim 46, wherein the actuating element is loaded by changing the shape of the loop.

52. An apparatus according to claim 16, wherein the reorientation that changes the shape of the actuating element is induced by an internal magnetic field due to ordering of the magnetic structure caused by a process selected from the group of cooling the material below its Curie temperature, applying mechanical stress and passing electric current through the material.

53. An apparatus according to claim 16, wherein the actuating element is an actuator selected from the group of: (1) an actuator designed to produce mechanical vibration; (2) a shaker adapted for use in tools; (3) an actuator adapted to be used in cleaning; (4) an actuator adapted for operating at ultrasonic frequencies; (5) an actuator adapted for producing vibration in structures and intermedia; (6) a loud speaker; (7) a source of counter vibrations in active vibration control apparatus; and (8) a motor.

54. An apparatus according to claim 53, wherein the motor is a linear motor adapted to provide linear motion comprised of successive steps produced by a motion of either an apparatus or a main actuator and at least one auxiliary actuator.

55. An apparatus according to claim 54, wherein one of the at least one auxiliary actuator is fixed at first end and another auxiliary actuator is fixed at a second end of the main actuator, the auxiliary actuators being designed to clamp by turns on a guide, wherein the main actuator travels along the guide and the auxiliary actuators are synchronous to the back and forth motion of the main actuator, the steps of the linear motion on the guide being generated when one auxiliary actuator is clamped during the extension phase of the main actuator and the other auxiliary actuator is clamped during the reverse motion of the main actuator.

56. An apparatus according to claim 55, wherein the speed of the linear motion is designed to be controlled by the motion of the main actuator, and the direction of the linear motion is reversed by reversing the phase of the clamping of the auxiliary actuators.

57. An apparatus according to claim 55, wherein the auxiliary actuators have a design selected from the group consisting of: (1) a design wherein the auxiliary actuators are clamped on one guide bar and the main actuator is beside the bar; (2) a design wherein the auxiliary actuators are clamped on two parallel guide bars and the main actuator is placed symmetrically between the bars; and (3) a design wherein the auxiliary actuators are clamped inside a tube and the linear motor is inside the tube.

58. An apparatus according to claim 54, wherein the guide bar passes through a hole made in an actuator component of the main actuator and the auxiliary actuators are designed to clamp on the same guide bar.

59. An apparatus according to claim 54, wherein the motion of the main actuator occurs at a frequency selected from the group consisting of: (1) a frequency that is the mechanical resonance of the longitudinal vibration modes of the actuator component; (2) a frequency that is the mechanical resonance of those actuators; and (3) a frequency that is the mechanical resonance of the whole structure of the linear motor.

60. An apparatus according to claim 54, wherein the main and auxiliary actuators are driven by electromagnets operate in an electromagnetic resonance at the same frequency as the mechanical resonance of the main and auxiliary actuators.

61. An apparatus according to claim 54, wherein the main and auxiliary actuators are driven by electromagnets that are digitally controlled to optimise the timing of the clamping and maximise precision, speed and force of the motion of the motor.

62. An apparatus according to claim 53, wherein the motor is a rotational motor whose rotational motion is composed of successive steps produced by a torsional motion of a main actuator and, when necessary by one or more auxiliary actuators.

63. An apparatus according to claim 62, wherein the auxiliary actuators are fixed at both ends of the main actuator and clamp by turns on a guide, around which the main actuator rotates, synchronous to the back and forth torsional motion of the main actuator.

64. An apparatus according to claim 62, wherein the speed of the angular motion is controlled by changing the frequency or amplitude of the main actuator, and the direction of the angular motion is reversed by reversing the phase of the clamping of the auxiliary actuators.

65. An apparatus according to claim 62, wherein the step of the angular motion is generated by one or several main actuators that are placed tangentially on a circle centered around the rotational axis and produce a back and forth extensive motion.

66. An apparatus according to claim 62, wherein the back and forth torsional motion of the main actuator is designed to occur at a frequency that is the mechanical resonance of torsional vibration mode of the axis of the main actuator and/or the back and forth motion of the main actuator is designed to occur at a frequency that is the mechanical resonance of the main actuator and/or the back and forth motion of the auxiliary actuators occurs at a frequency that is the mechanical resonance of those actuators.

67. An apparatus according to claim 62, wherein the main and auxiliary actuators are designed to operate at the same frequency that is the mechanical resonance of the whole structure of the vibrating parts of the motor.

68. An apparatus according to claim 62, wherein the electromagnets operate in an electromagnetic resonance at the same frequency as the mechanical resonance of the main and auxiliary actuators drive the motor.

69. An apparatus according to claim 62, wherein there is a guide and the motor is the rotating axis of the motor.

70. An apparatus according to claim 62, wherein the rotational motion is generated by successive steps produced by torsional twisting of a main actuator of the motor controlled by a magnetic field, two auxiliary actuators being fixed at both ends of the main actuator.

71. An apparatus according to claim 62, wherein the speed of the angular motion is controlled by the frequency or amplitude of the main actuator, and the direction of the angular motion is reversed by reversing the phase of the clamping of the auxiliary actuators.

72. An apparatus according to claim 62, wherein the driving coil of the main actuator is placed around the axis of the motor to produce a magnetic field in the direction of the rotation axis of the motor.

73. An apparatus according to claim 62, wherein the magnetic fields driving the actuators of the motor are in the direction perpendicular to the rotation axis of the motor.

74. An apparatus according to claim 62, wherein the auxiliary actuators are designed to clamp on bars fixed at both ends of the twisting component of the main actuator, wherein the bars are selected from a group consisting of cylindrical bars or polygonal bars.

75. An apparatus according to claim 74, wherein the bars are expanded radially in a magnetic field.

76. An apparatus according to claim 62, wherein the back and forth torsional motion of the main actuator is designed to occur at a frequency that is the mechanical resonance of the torsional vibration modes of the actuator component of the main actuator, the back and forth motion of the auxiliary actuators is designed to occur at a frequency that is the mechanical resonance of those actuators or at the same frequency that is the mechanical resonance of the whole structure of the vibrating parts of the motor.

77. An apparatus according to claim 62, wherein the main and auxiliary actuators are driven by electromagnets that operate in an electromagnetic resonance at the same frequency as the mechanical resonance of the main and auxiliary actuators drive the motor.

78. An apparatus according to claim 53, wherein one or more of the actuators are designed to form a system of a positioning apparatus for moving a certain part accurately and fast to a position in three dimensions.

79. An apparatus according to claim 78, wherein the actuators have a design selected from the group of: (1) actuators adapted to fasten, tighten and clamp parts together; (2) actuators adapted to be used in robots and manipulators to produce fast and precise motion that can be actively controlled using information obtained by sensors; (3) actuators adapted to be used in aircraft to control wing flaps; (4) actuators adapted to be used in weapon systems to direct weapons; (5) actuators adapted to be used in control systems to produce fast and precise motion that can be actively controlled using information obtained from sensors; (6) actuators adapted to be used in elevators; (7) actuators adapted to be used to generate mechanical vibrations in intermedia; (8) actuators adapted to be used to produce countervibrations to actively control vibrations and noise; (9) actuators adapted to be used actively balance a machine by moving the gravity center of a rotating machine element; (10) actuators adapted to be used to actively control the angular vibrations of rotating parts of machines by producing angular countervibrations; (11) actuators adapted to be used to contact electrical current; (12) actuators adapted to be used to regulate a fluid flow; (13) actuators adapted to be used in pumps; (14) actuators adapted to be used to regulate the flow of fluid by producing motion for an injector needle; (15) actuators adapted to be used to produce motion in valve lifters for engines; (16) actuators adapted to be used within active suspension of vehicles and equipment; (17) actuators adapted to be used in surgery instruments; and (18) actuators adapted to be used in artificial organs.

80. An apparatus according to claim 1, wherein the active element forms part of an actuator selected from the group consisting of a micromechanical actuator, an actuator designed to contact electric current, an actuator designed to control the mutual position of capacitor plates, a regulator designed to regulate a flow of a fluid by changing a flow channel cross section, a pump for transferring fluids, and an actuator designed to couple two or more bodies together.

81. An apparatus according to claim 80, wherein the regulator has a design for regulating flow within a flow channel selected from the group consisting of (1) a design for regulating flow by changing the shape of an actuating element that is placed inside the flow channel using a magnetic field source that is installed outside the flow channel and (2) a design for regulating flow by turning plates inside the flow channel.

82. An apparatus according to claim 81, wherein the actuator is designed to couple two or more bodies together and is selected from a group of actuators consisting of: (1) a moving or rotating bar wherein the bar is coupled from outside using a magnetic field source installed around the bar; (2) an actuator placed between a moving or rotating bar and another body to be coupled; (3) an actuator adapted to press against at least one side of a rotating disc; (4) the rotating disc itself coupled with a magnetic field source installed around the disc; (5) an actuator adapted to press against opposing inside walls of a moving or rotating open cylinder; (6) at least one actuator adapted to press against one rotating disc in a plurality of positions to couple the rotating disc with another coaxial rotating disc; (7) a break; (8) a connector; and (9) a coupler.

* * * * *